(12) United States Patent
Yamazaki et al.

(10) Patent No.: US 11,018,206 B2
(45) Date of Patent: *May 25, 2021

(54) DISPLAY PANEL AND INFORMATION PROCESSING DEVICE

(71) Applicant: SEMICONDUCTOR ENERGY LABORATORY CO., LTD., Atsugi (JP)

(72) Inventors: Shunpei Yamazaki, Tokyo (JP); Yoshiharu Hirakata, Kanagawa (JP); Tetsuji Ishitani, Kanagawa (JP); Kenichi Okazaki, Tochigi (JP); Hajime Kimura, Kanagawa (JP)

(73) Assignee: Semiconductor Energy Laboratory Co., Ltd., Atsugi (JP)

( * ) Notice: Subject to any disclaimer, the term of this patent is extended or adjusted under 35 U.S.C. 154(b) by 0 days.

This patent is subject to a terminal disclaimer.

(21) Appl. No.: 16/684,682

(22) Filed: Nov. 15, 2019

(65) Prior Publication Data

US 2020/0111850 A1 Apr. 9, 2020

Related U.S. Application Data

(63) Continuation of application No. 15/076,927, filed on Mar. 22, 2016, now Pat. No. 10,516,008.

(30) Foreign Application Priority Data

Mar. 23, 2015 (JP) .................. 2015-060000
Jun. 8, 2015 (JP) .................. 2015-115556

(51) Int. Cl.
*H01L 27/32* (2006.01)
*G02F 1/133* (2006.01)
(Continued)

(52) U.S. Cl.
CPC ........ *H01L 27/3232* (2013.01); *G02F 1/1368* (2013.01); *G02F 1/13306* (2013.01);
(Continued)

(58) Field of Classification Search
CPC combination set(s) only.
See application file for complete search history.

(56) References Cited

U.S. PATENT DOCUMENTS 6,025,894 A 2/2000 Shirasaki et al.
6,556,260 B1 4/2003 Itou et al.
(Continued)

FOREIGN PATENT DOCUMENTS

CN 104241324 A 12/2014
JP 2001-066593 A 3/2001
(Continued)

OTHER PUBLICATIONS

Minoura.K et al., "P-149: Super Reflective Color LCDs Being Able to Display Moving Images without Polarizers", SID Digest '06 : SID International Symposium Digest of Technical Papers, Jun. 6, 2006, vol. 37, No. 1, pp. 769-772.

(Continued)

*Primary Examiner* — Temesghen Ghebretinsae
*Assistant Examiner* — Sosina Abebe
(74) *Attorney, Agent, or Firm* — Fish & Richardson P.C.

(57) ABSTRACT

A novel display panel that can be used as a reflective display panel in an environment with strong external light and as a self-luminous display panel in a dim environment, for example and that has low power consumption and is highly convenient or reliable is provided. The display panel includes a pixel and a substrate that supports the pixel. The pixel includes a first display element (e.g., a reflective liquid crystal element) that includes a reflective film having an opening as a first conductive film and a second display (Continued)

element (e.g., an organic EL element) that emits light to the opening.

12 Claims, 25 Drawing Sheets

(51) Int. Cl.
| | |
|---|---|
| *G02F 1/1335* | (2006.01) |
| *G02F 1/1362* | (2006.01) |
| *G02F 1/1368* | (2006.01) |
| *G06F 3/041* | (2006.01) |
| *G02F 1/1333* | (2006.01) |
| *H01L 29/786* | (2006.01) |

(52) U.S. Cl.
CPC .. *G02F 1/133345* (2013.01); *G02F 1/133553* (2013.01); *G02F 1/136286* (2013.01); *G06F 3/0412* (2013.01); *H01L 27/3244* (2013.01); *H01L 29/7869* (2013.01); *G02F 1/13338* (2013.01); *G02F 1/133626* (2021.01); *G02F 2201/44* (2013.01); *G06F 3/041* (2013.01)

(56) References Cited

U.S. PATENT DOCUMENTS

| | | | |
|---|---|---|---|
| 6,714,268 B2 | 3/2004 | Wang et al. | |
| 6,912,021 B2 | 6/2005 | Kimura | |
| 7,038,641 B2 | 5/2006 | Hirota et al. | |
| 7,084,936 B2 | 8/2006 | Kato | |
| 7,102,704 B2 | 9/2006 | Mitsui et al. | |
| 7,176,991 B2 | 2/2007 | Mitsui et al. | |
| 7,239,361 B2 | 7/2007 | Kato | |
| 7,248,235 B2 | 7/2007 | Fujii et al. | |
| 7,304,696 B2 | 12/2007 | Yamagishi | |
| 7,385,654 B2 | 6/2008 | Mitsui et al. | |
| 7,688,290 B2 | 3/2010 | Yamazaki et al. | |
| 8,040,456 B2 | 10/2011 | Yamazaki et al. | |
| 8,159,449 B2 | 4/2012 | Kimura et al. | |
| 8,547,503 B2 | 10/2013 | Kubota et al. | |
| 8,743,028 B2 | 6/2014 | Yamazaki et al. | |
| 8,836,906 B2 | 9/2014 | Kurokawa et al. | |
| 9,006,755 B2 | 4/2015 | Seo et al. | |
| 9,129,568 B2 | 9/2015 | Kubota et al. | |
| 9,182,631 B2 | 11/2015 | Iwata et al. | |
| 9,189,997 B2 | 11/2015 | Kimura et al. | |
| 2002/0145687 A1* | 10/2002 | Mitsui | G02F 1/133621 349/113 |
| 2003/0102801 A1 | 6/2003 | Senbonmatsu | |
| 2003/0201960 A1 | 10/2003 | Fujieda | |
| 2006/0072047 A1 | 4/2006 | Sekiguchi | |
| 2006/0116000 A1 | 6/2006 | Yamamoto | |
| 2007/0032161 A1 | 2/2007 | Liao et al. | |
| 2007/0131944 A1 | 6/2007 | Hu et al. | |
| 2007/0153172 A1 | 7/2007 | Hsieh et al. | |
| 2008/0180618 A1 | 7/2008 | Fujieda | |
| 2008/0291349 A1 | 11/2008 | Kim et al. | |
| 2010/0171905 A1 | 7/2010 | Huang et al. | |
| 2011/0122344 A1 | 5/2011 | Matsumuro et al. | |
| 2011/0175874 A1 | 7/2011 | Wakimoto et al. | |
| 2011/0205468 A1 | 8/2011 | Hirakata et al. | |
| 2011/0249211 A1 | 10/2011 | Song et al. | |
| 2011/0255046 A1 | 10/2011 | Kurokawa et al. | |
| 2012/0208637 A1 | 8/2012 | Hirakata | |
| 2014/0014915 A1* | 1/2014 | Koo | H01L 27/3232 257/40 |
| 2014/0065430 A1 | 3/2014 | Yamazaki et al. | |
| 2014/0146033 A1 | 5/2014 | Koyama et al. | |
| 2014/0313181 A1* | 10/2014 | Hong | G09G 3/2003 345/212 |
| 2014/0362429 A1 | 12/2014 | Yokozeki et al. | |
| 2015/0029418 A1 | 1/2015 | Ueda et al. | |
| 2015/0076473 A1 | 3/2015 | Miyake | |
| 2015/0179139 A1 | 6/2015 | Watanabe et al. | |
| 2015/0364073 A1 | 12/2015 | Ogawa | |
| 2015/0379945 A1 | 12/2015 | Kubota et al. | |
| 2016/0042702 A1 | 2/2016 | Hirakata et al. | |
| 2017/0040403 A1 | 2/2017 | Kuwabara | |
| 2017/0040404 A1 | 2/2017 | Kusunoki | |
| 2017/0123268 A1 | 5/2017 | Sasaki et al. | |

FOREIGN PATENT DOCUMENTS

| | | |
|---|---|---|
| JP | 2001-092390 A | 4/2001 |
| JP | 2002-196702 A | 7/2002 |
| JP | 2002-328630 A | 11/2002 |
| JP | 2003-076302 A | 3/2003 |
| JP | 2003-098983 A | 4/2003 |
| JP | 2003-157026 A | 5/2003 |
| JP | 2003-157029 A | 5/2003 |
| JP | 2003-228304 A | 8/2003 |
| JP | 2003-316295 A | 11/2003 |
| JP | 2003-322850 A | 11/2003 |
| JP | 2004-296162 A | 10/2004 |
| JP | 2007-232882 A | 9/2007 |
| JP | 4161574 | 10/2008 |
| JP | 2010-066537 A | 3/2010 |
| JP | 2011-191750 A | 9/2011 |
| JP | 2013-142804 A | 7/2013 |
| JP | 2013-221965 A | 10/2013 |
| JP | 2014-063723 A | 4/2014 |
| JP | 2014-164389 A | 9/2014 |
| JP | 2014-199267 A | 10/2014 |
| JP | 2014-235418 A | 12/2014 |
| JP | 2015-025968 A | 2/2015 |
| JP | 2015-043054 A | 3/2015 |
| KR | 2014-0029181 A | 3/2014 |
| KR | 2014-0143090 A | 12/2014 |
| WO | WO-2004/053819 | 6/2004 |
| WO | WO-2014/077295 | 5/2014 |

OTHER PUBLICATIONS

International Search Report (Application No. PCT/IB2016/051455) dated Jun. 7, 2016.
Written Opinion (Application No. PCT/IB2016/051455) dated Jun. 7, 2016.
Shieh.H, "Transflective display by Hybrid OLED and LCD", LEOS 2005 (IEEE Lasers and Electro-Optics Society Annual Meeting), Oct. 22, 2005, pp. 650-651, IEEE.
Lee.J et al., "High ambient-contrast-ratio display using tandem reflective liquid crystal display and organic light-emitting device", Optics Express, Nov. 14, 2005, vol. 13, No. 23, pp. 9431-9438.
U.S. Pat. No. 9,182,631 is an English-language document corresponding to JP2014-199267.

* cited by examiner

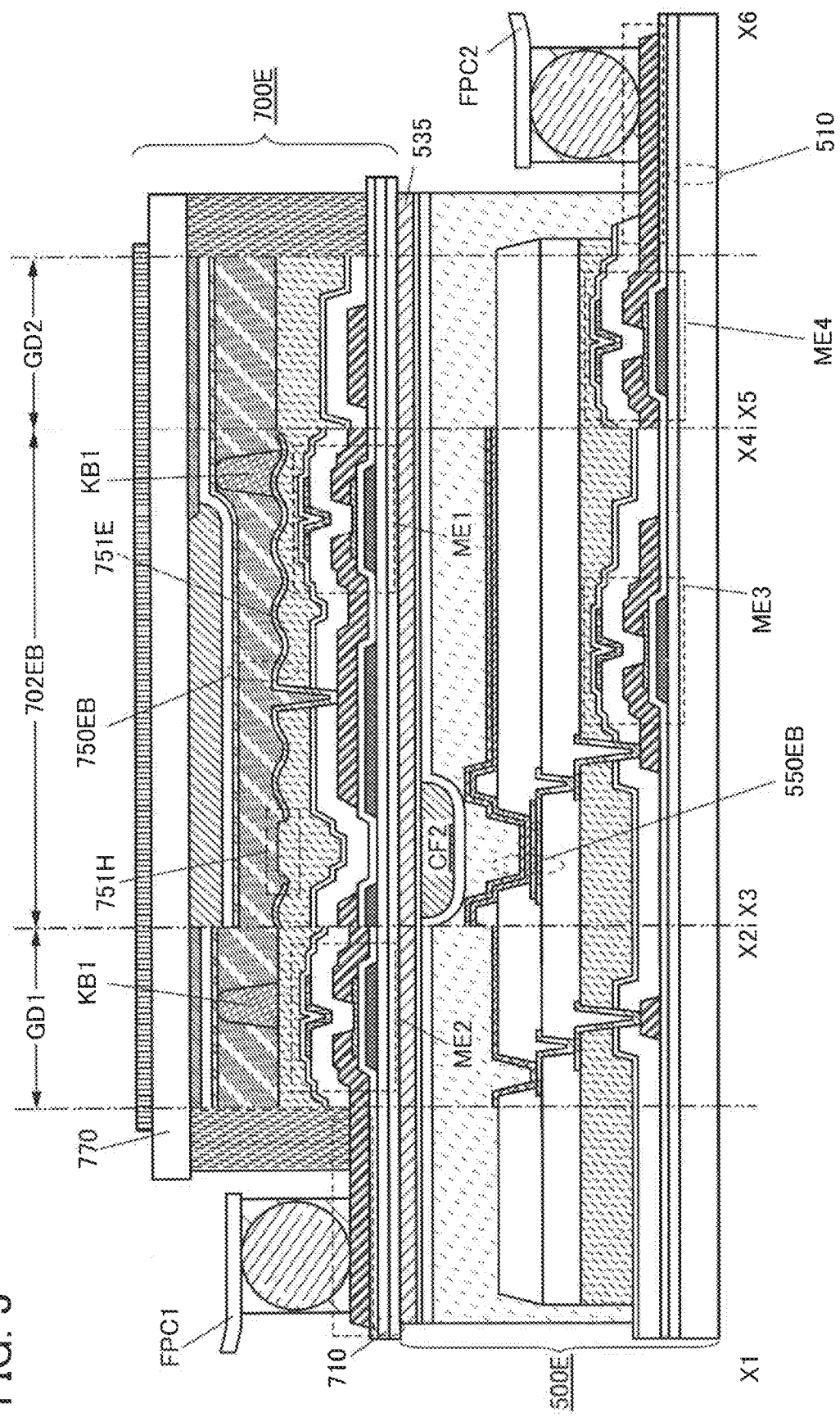

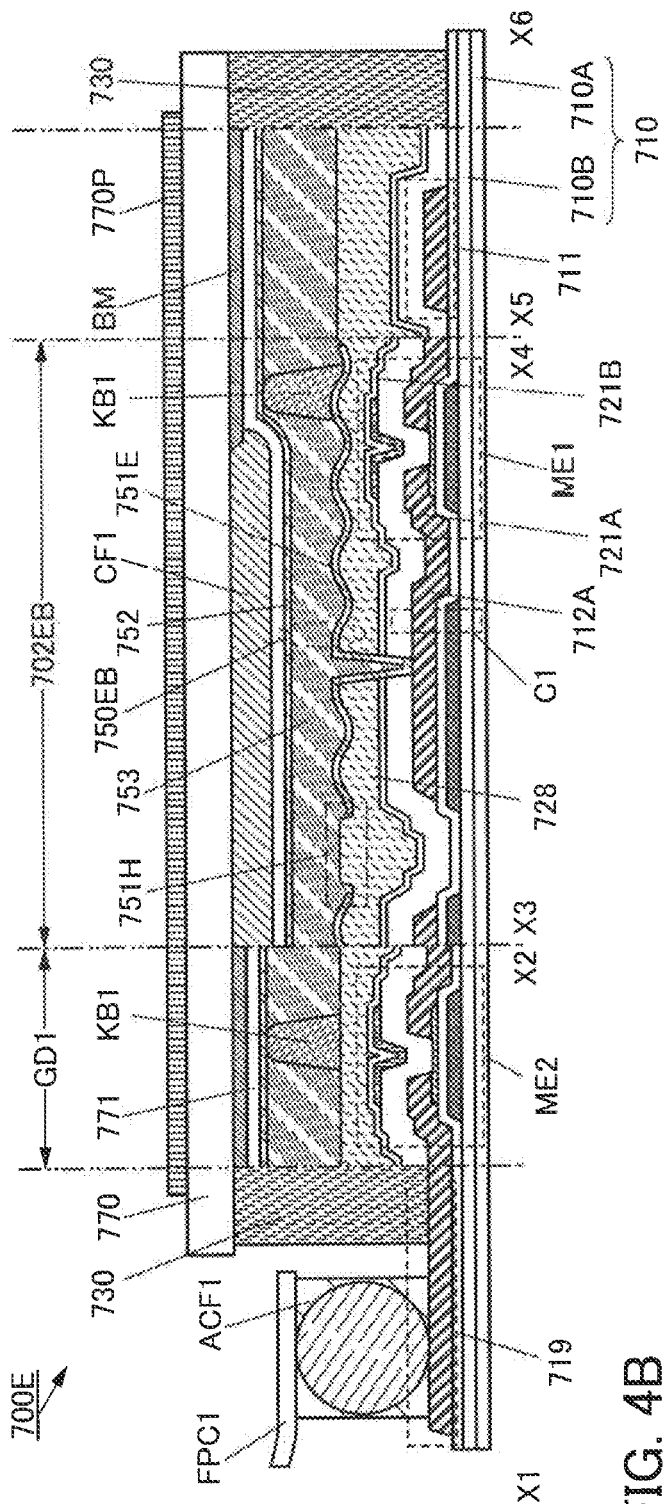
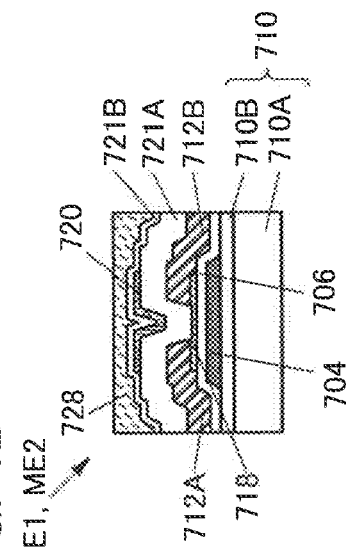
FIG. 4A
FIG. 4B

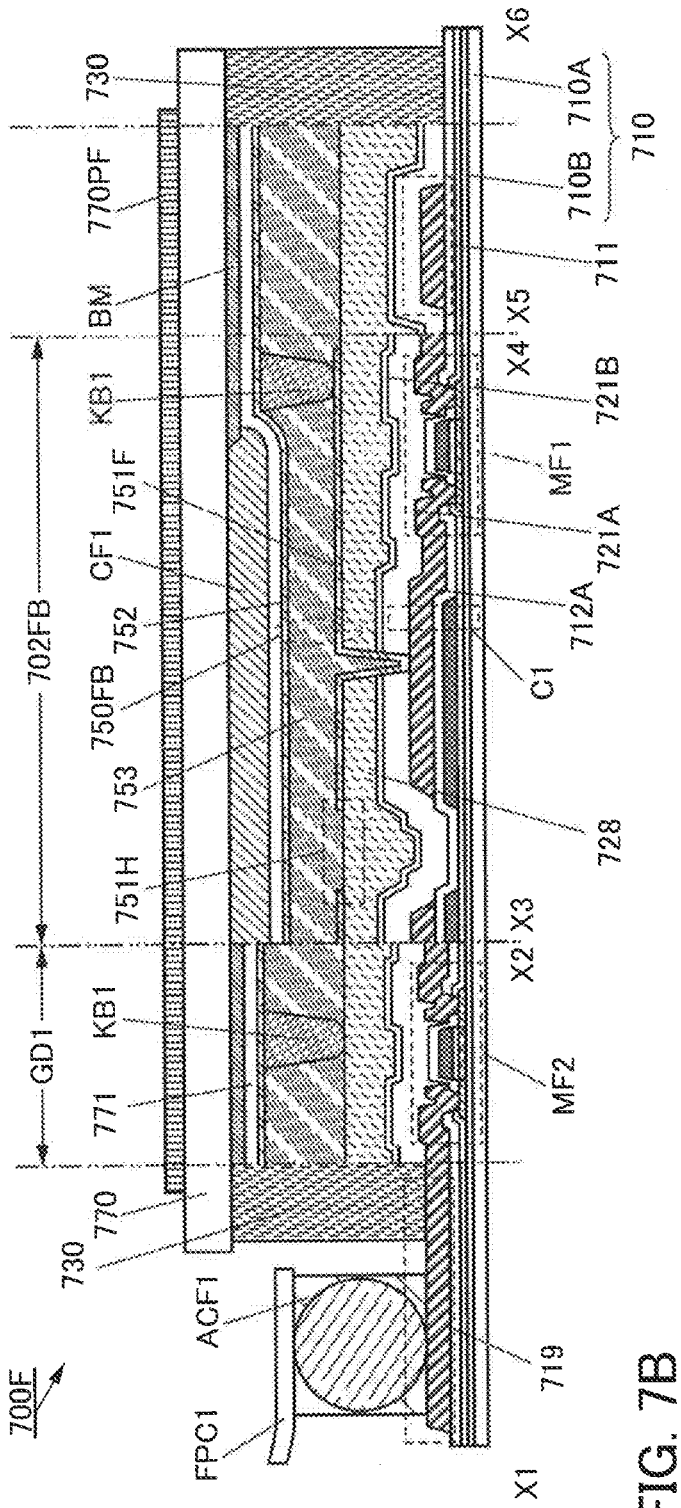
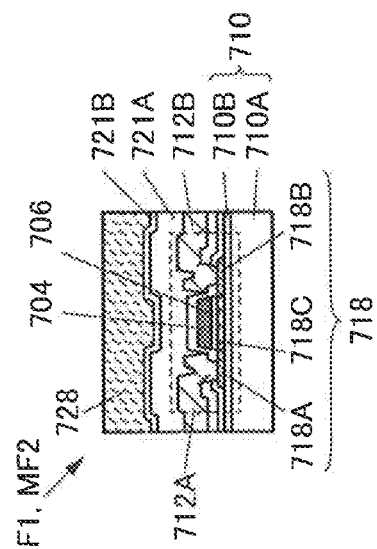
FIG. 7A
FIG. 7B

Reflective LCD mode

OLED mode

Reflective LCD-OLED mode

DISPLAY PANEL AND INFORMATION PROCESSING DEVICE

CROSS-REFERENCE TO RELATED APPLICATIONS

This application is a continuation of U.S. application Ser. No. 15/076,927, filed Mar. 22, 2016, now allowed, which claims the benefit of foreign priority applications filed in Japan as Serial No. 2015-060000 on Mar. 23, 2015 and 2015-115556 on Jun. 8, 2015, all of which are incorporated by reference.

TECHNICAL FIELD

One embodiment of the present invention relates to a display panel, an information processing device, or a semiconductor device.

Note that one embodiment of the present invention is not limited to the above technical field. The technical field of one embodiment of the invention disclosed in this specification and the like relates to an object, a method, or a manufacturing method. In addition, one embodiment of the present invention relates to a process, a machine, manufacture, or a composition of matter. Specifically, examples of the technical field of one embodiment of the present invention disclosed in this specification include a semiconductor device, a display device, a light-emitting device, a power storage device, a memory device, a method for driving any of them, and a method for manufacturing any of them.

BACKGROUND ART

A liquid crystal display device in which a light-condensing means and a pixel electrode are provided on the same surface side of a substrate and a region transmitting visible light in the pixel electrode is provided to overlap with an optical axis of the light-condensing means, and a liquid crystal display device which includes an anisotropic light-condensing means having a condensing direction X and a non-condensing direction Y that is along a longitudinal direction of a region transmitting visible light in the pixel electrode are known (Patent Document 1).

REFERENCE

Patent Document

[Patent Document 1] Japanese Published Patent Application No. 2011-191750

DISCLOSURE OF INVENTION

An object of one embodiment of the present invention is to provide a novel display panel that is highly convenient or reliable. Another object of one embodiment of the present invention is to provide a novel information processing device that is highly convenient or reliable. Another object of one embodiment of the present invention is to provide a novel display panel, a novel information processing device, or a novel semiconductor device.

Note that the description of these objects does not disturb the existence of other objects. In one embodiment of the present invention, there is no need to achieve all the objects. Other objects will be apparent from and can be derived from the description of the specification, the drawings, the claims, and the like.

(1) One embodiment of the present invention is a display panel that includes a pixel and a substrate.

The substrate is configured to support the pixel.

The pixel includes a first display element and a second display element that has a region overlapping with the first display element.

The first display element includes a reflective film that reflects external light and is configured to control transmission of the external light.

The reflective film includes an opening.

The second display element is configured to emit light to the opening and a region overlapping with the opening.

(2) Another embodiment of the present invention is the above display panel in which the first display element includes a liquid crystal layer, a first conductive film, and a second conductive film.

The second display element includes a layer containing a luminescent material, a third conductive film, and a fourth conductive film.

The reflective film serves as the first conductive film.

The area of the opening is greater than or equal to 5% and less than or equal to 20% of the area of the first conductive film.

The second display element is configured to emit light to a region having a shape overlapping with the opening.

The display panel of one embodiment of the present invention includes the pixel and the substrate supporting the pixel. The pixel includes the first display element (e.g., a reflective liquid crystal element) that includes the reflective film having the opening as the first conductive film, and the second display element (e.g., an organic EL element) that emits light to the opening.

With this structure, the display panel can be used, for example, as a reflective display panel in an environment with strong external light. Specifically, an image with high contrast can be favorably displayed in an environment with bright external light. The display panel can be used, for example, as a self-luminous display panel in a dim environment to display an image favorably. Thus, a novel display panel that has low power consumption and is highly convenient or reliable can be provided.

(3) Another embodiment of the present invention is the above display panel that includes a first scan line and a first signal line intersecting with the first scan line.

The pixel includes a first pixel circuit.

The first pixel circuit is electrically connected to the first scan line and the first signal line.

The first pixel circuit is configured to drive the first display element.

(4) Another embodiment of the present invention is the above display panel that includes a second scan line and a second signal line intersecting with the second scan line.

The pixel includes a second pixel circuit.

The second pixel circuit is electrically connected to the second scan line and the second signal line.

The second pixel circuit is configured to drive the second display element.

The display panel of one embodiment of the present invention includes the first pixel circuit configured to drive the first display element or the second pixel circuit configured to drive the second display element. With this structure, the first display element or the second display element can be selectively used to perform display. Thus, a novel display panel that has low power consumption and is highly convenient or reliable can be provided.

(5) Another embodiment of the present invention is the above display panel in which the first pixel circuit includes a transistor.

The transistor is configured to reduce current flowing in an off state more than a transistor including amorphous silicon as a semiconductor.

In the display panel of one embodiment of the present invention, the first pixel circuit configured to drive the first display element includes the transistor that can reduce current flowing in an off state. With this structure, the frequency of supplying a selection signal to the first pixel circuit can be reduced while flickers of display are reduced. Alternatively, power consumption can be reduced. Thus, a novel display panel that is highly convenient or reliable can be provided.

(6) One embodiment of the present invention is an information processing device that includes an arithmetic device and an input/output device.

The arithmetic device is configured to receive positional information and supply image information and control information.

The input/output device is configured to supply the positional information and receive the image information and the control information.

The input/output device includes a display portion that displays the image information and an input portion that supplies the positional information.

The display portion includes the above display panel.

The input portion is configured to detect the position of a pointer and supply positional information determined in accordance with the position of the pointer.

The arithmetic device is configured to determine the moving speed of the pointer in accordance with the positional information.

The arithmetic device is configured to determine the contrast or brightness of image information in accordance with the moving speed of the pointer.

The above information processing device of one embodiment of the present invention includes the input/output device that supplies positional information and receives image information and the arithmetic device that receives the positional information and supplies the image information. The arithmetic device determines the contrast or brightness of image information in accordance with the moving speed of the pointer. With this structure, eyestrain on a user caused when the display position of image information is moved can be reduced, that is, eye-friendly display can be achieved. Thus, a novel information processing device that is highly convenient or reliable can be provided.

(7) Another embodiment of the present invention is the above information processing device in which the input portion includes at least one of a keyboard, a hardware button, a pointing device, a touch sensor, an illuminance sensor, an imaging device, an audio input device, a viewpoint input device, and a pose detection device.

Thus, the information processing device can have low power consumption and excellent visibility even in a bright place. Thus, a novel information processing device that is highly convenient or reliable can be provided.

Although the block diagram attached to this specification shows components classified by their functions in independent blocks, it is difficult to classify actual components according to their functions completely and it is possible for one component to have a plurality of functions.

In this specification, the terms "source" and "drain" of a transistor interchange with each other depending on the polarity of the transistor or the levels of potentials applied to the terminals. In general, in an n-channel transistor, a terminal to which a lower potential is applied is called a source, and a terminal to which a higher potential is applied is called a drain. Furthermore, in a p-channel transistor, a terminal to which a lower potential is applied is called a drain, and a terminal to which a higher potential is applied is called a source. In this specification, although connection relation of the transistor is described assuming that the source and the drain are fixed in some cases for convenience, actually, the names of the source and the drain interchange with each other depending on the relation of the potentials.

Note that in this specification, a "source" of a transistor means a source region that is part of a semiconductor film functioning as an active layer or a source electrode connected to the semiconductor film. Similarly, a "drain" of the transistor means a drain region that is part of the semiconductor film or a drain electrode connected to the semiconductor film. A "gate" means a gate electrode.

Note that in this specification, a state in which transistors are connected to each other in series means, for example, a state in which only one of a source and a drain of a first transistor is connected to only one of a source and a drain of a second transistor. In addition, a state in which transistors are connected to each other in parallel means a state in which one of a source and a drain of a first transistor is connected to one of a source and a drain of a second transistor and the other of the source and the drain of the first transistor is connected to the other of the source and the drain of the second transistor.

In this specification, the term "connection" means electrical connection and corresponds to a state where current, voltage, or a potential can be supplied or transmitted. Accordingly, a connection state means not only a state of direct connection but also a state of indirect connection through a circuit element such as a wiring, a resistor, a diode, or a transistor that allows current, voltage, or a potential to be supplied or transmitted.

In this specification, even when different components are connected to each other in a circuit diagram, there is actually a case where one conductive film has functions of a plurality of components such as a case where part of a wiring serves as an electrode. The term "connection" also means such a case where one conductive film has functions of a plurality of components.

In addition, in this specification, one of a first electrode and a second electrode of a transistor refers to a source electrode and the other refers to a drain electrode.

One embodiment of the present invention can provide a novel display panel that is highly convenient or reliable. Alternatively, a novel information processing device that is highly convenient or reliable can be provided. Alternatively, a novel display panel, a novel information processing device, or a novel semiconductor device can be provided.

Note that the description of these effects does not disturb the existence of other effects. One embodiment of the present invention does not necessarily achieve all the effects listed above. Other effects will be apparent from and can be derived from the description of the specification, the drawings, the claims, and the like.

BRIEF DESCRIPTION OF DRAWINGS

FIG. 3 is a cross-sectional view illustrating a structure of a display panel of one embodiment.

FIGS. 4A and 4B are cross-sectional views illustrating a structure of a first display portion of a display panel of one embodiment.

FIGS. 7A and 7B are cross-sectional views illustrating a structure of a first display portion of a display panel of one embodiment.

BEST MODE FOR CARRYING OUT THE INVENTION

Figure 1:
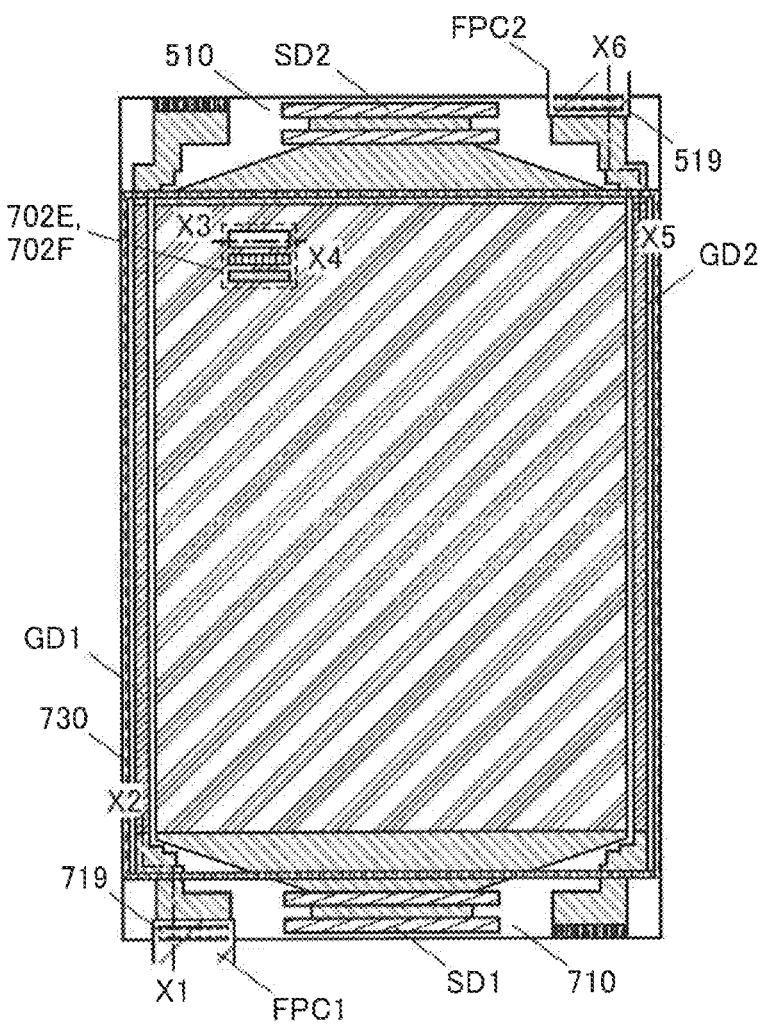
FIG. 1 is a top view illustrating a structure of a display panel of one embodiment.

The display panel of one embodiment of the present invention includes a pixel and a substrate supporting the pixel. The pixel includes a first display element (e.g., a reflective liquid crystal element) that includes a reflective film having an opening as a first conductive film and a second display element (e.g., an organic EL element) that emits light to the opening.

With this structure, the display panel can be used, for example, as a reflective display panel in an environment with strong external light and as a self-luminous display panel in a dim environment. Thus, a novel display panel that has low power consumption and is highly convenient or reliable can be provided.

Embodiments will be described in detail with reference to the drawings. Note that the present invention is not limited to the following description, and it is easily understood by those skilled in the art that various changes and modifications can be made without departing from the spirit and scope of the present invention. Therefore, the present invention should not be construed as being limited to the description in the following embodiments. In the structures of the invention described below, the same portions or portions having similar functions are denoted by the same reference numerals in different drawings, and description of such portions is not repeated.

Embodiment 1

In this embodiment, the structure of a display panel of one embodiment of the present invention will be described with reference to FIG. 1, FIG. 2, FIG. 3, FIGS. 4A and 4B, FIG. 5, FIG. 6, FIGS. 7A and 7B, and FIG. 8.

<Structure Example 1 of Display Panel>

FIG. 1 is a top view illustrating the structure of the display panel of one embodiment of the present invention.

Figure 2:
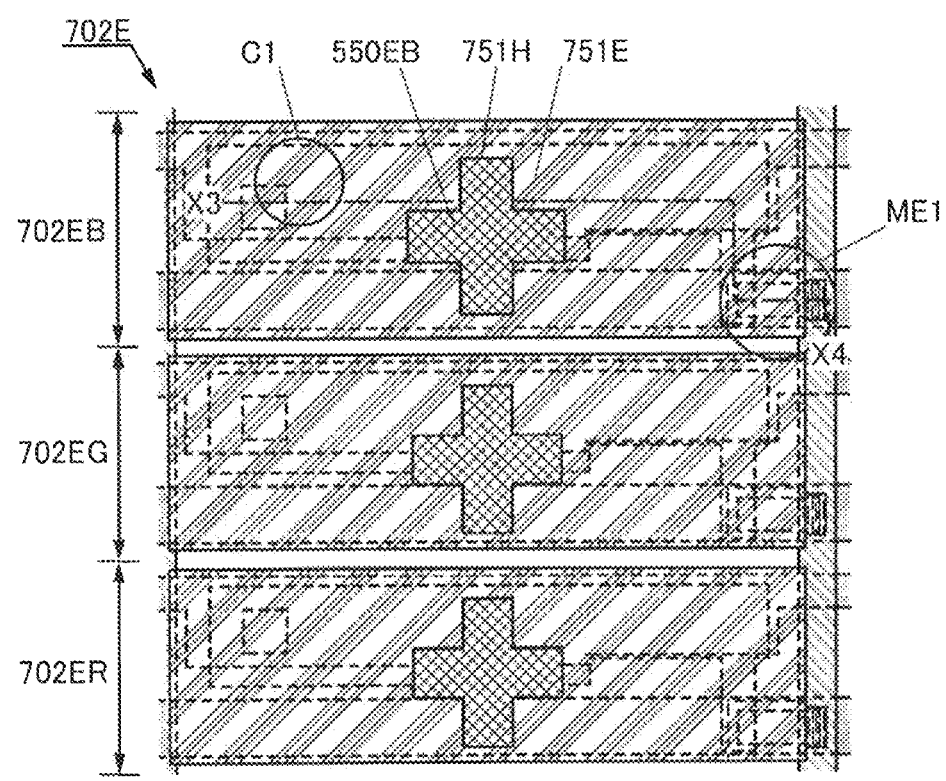
FIG. 2 is a top view illustrating a structure of a pixel arranged in a display panel of one embodiment.

FIG. 2 is a top view illustrating the structure of a pixel in the display panel of one embodiment of the present invention.

FIG. 3 is a cross-sectional view illustrating structures of the display panel of one embodiment of the present invention taken along the cutting plane lines X1-X2, X3-X4, and X5-X6 in FIG. 1.

FIG. 4A is a cross-sectional view illustrating structures of a first display portion 700E of the display panel of one embodiment of the present invention taken along the cutting plane lines X1-X2, X3-X4, and X5-X6 in FIG. 1. FIG. 4B is a cross-sectional view illustrating the structure of a transistor.

Figure 5:
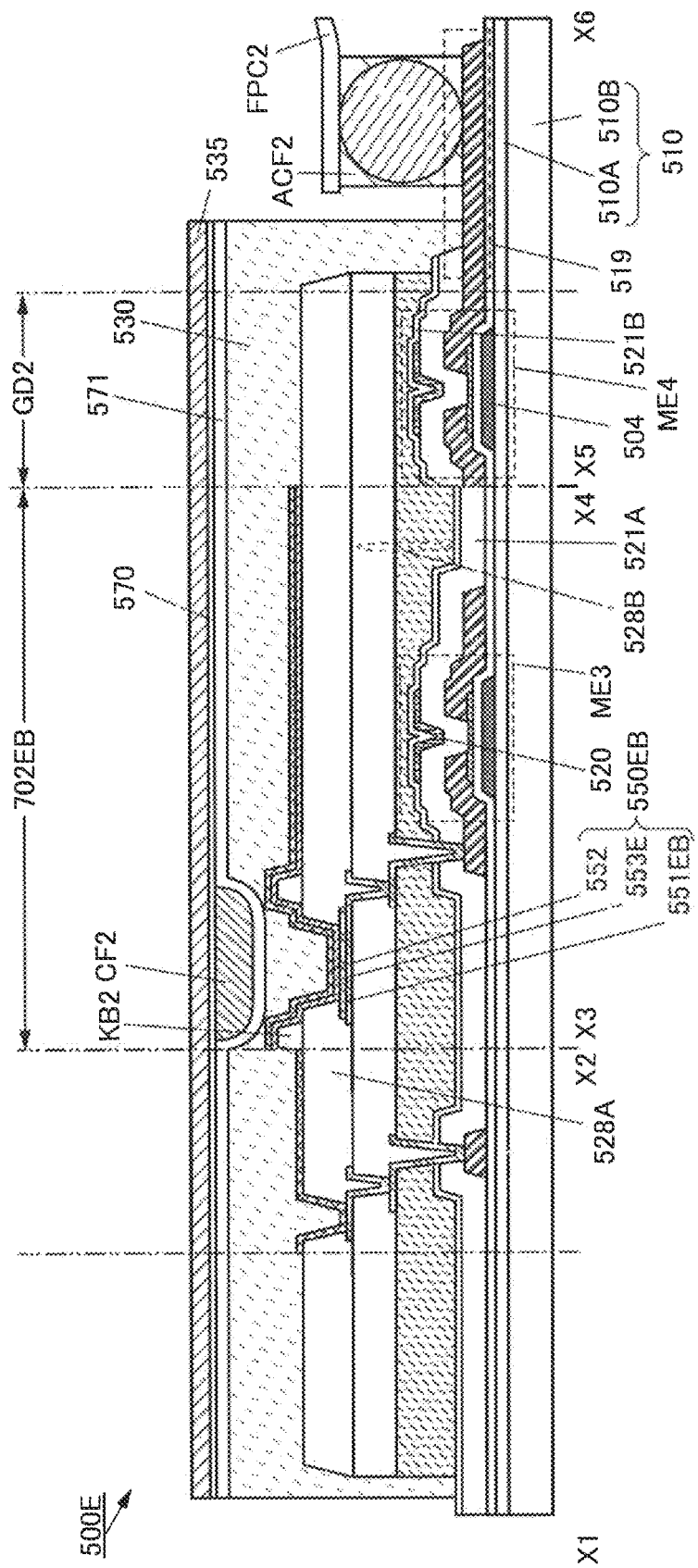
FIG. 5 is a cross-sectional view illustrating a structure of a second display portion of a display panel of one embodiment.

FIG. 5 is a cross-sectional view illustrating structures of a second display portion 500E of the display panel of one embodiment of the present invention taken along the cutting plane lines X1-X2, X3-X4, and X5-X6 in FIG. 1.

The display panel described in this embodiment includes a pixel 702E and a substrate 710 (see FIG. 1, FIG. 2, and FIG. 3). Note that a sub-pixel 702EB, a sub-pixel 702EG, or a sub-pixel 702ER can be used in the pixel 702E.

The substrate 710 has a function of supporting the pixel 702E (see FIG. 3). The substrate 710 has a region overlapping with the pixel 702E.

The pixel 702E includes a first display element 750EB and a second display element 550EB that includes a region overlapping with the first display element 750EB (see FIG. 2 and FIG. 3).

The first display element 750EB includes a reflective film (a first conductive film 751EB) that reflects external light and has a function of controlling transmission of external light. The reflective film (the first conductive film 751EB) has an opening 751H.

The second display element 550EB has a function of emitting light to the opening 751H and a region overlapping with the opening 751H.

The first display element 750EB includes a liquid crystal layer 753, the first conductive film 751E, and a second conductive film 752 (see FIGS. 4A and 4B).

The second display element 550EB includes a layer 553E containing a luminescent material, a third conductive film 551EB, and a fourth conductive film 552 (see FIG. 5).

The reflective film has a function as the first conductive film 751E. The area of the opening 751H is, for example, greater than or equal to 5% and less than or equal to 20%, preferably 10% of that of the first conductive film 751E.

The second display element 550EB has a function of emitting light to a region with a shape substantially overlapping with the opening 751H. Note that the region with a shape substantially overlapping with the opening 751H includes a region overlapping with the opening 751H and a region not overlapping with the opening 751H. The area of the region not overlapping with the opening 751H is less than or equal to 20%, preferably less than or equal to 10% of the area of the region overlapping with the opening 751H.

Specifically, the area of the light-emitting region of the second display element 550EB is greater than or equal to 0.5 times and less than 1.5 times, preferably greater than or equal to 0.8 times and less than 1.2 times, more preferably greater than or equal to 0.9 times and less than 1.1 times as large as that of the opening 751H.

The above display panel includes the sub-pixel 702EB and the substrate 710 that supports the sub-pixel 702EB. The sub-pixel 702EB includes the first display element 750EB (e.g., a reflective liquid crystal element) including a reflective film having the opening 751H as the first conductive film 751E and the second display element 550EB (e.g., an organic EL element) that emits light to the opening 751H.

With this structure, the display panel can be used, for example, as a reflective display panel in an environment with strong external light, and specifically, an image with high contrast can be favorably displayed in an environment with bright external light. The display panel can be used, for example, as a self-luminous display panel in a dim environment to display an image favorably. Thus, the novel display panel that has low power consumption and is highly convenient or reliable can be provided.

<Structure>

The display panel of one embodiment of the present invention includes the first display portion 700E, the second display portion 500E, and a bonding layer 535 (see FIG. 1 and FIG. 3).

<<First Display Portion 700E>>

The first display portion 700E includes a pixel portion, a wiring portion, a source driver circuit portion SD1, a gate driver circuit portion GD1, and a terminal portion (see FIG. 1 and FIGS. 4A and 4B).

The first display portion 700E further includes the substrate 710, a substrate 770, a structure body KB1, the liquid crystal layer 753, a sealant 730, and an optical film 770P.

The substrate 770 includes a region overlapping with the substrate 710.

The sealant 730 has a function of bonding the substrate 710 and the substrate 770 to each other.

The liquid crystal layer 753 is provided in a region surrounded by the substrate 710, the substrate 770, and the sealant 730.

The structure body KB1 is provided between the substrate 710 and the substrate 770. The structure body KB1 has a function of keeping a predetermined distance between the substrate 710 and the substrate 770.

<<Pixel Portion>>

The pixel portion includes the pixel 702E, a light-blocking film BM, the insulating film 771, an insulating film 721A, an insulating film 721B, and an insulating film 728.

For example, a plurality of sub-pixels can be used in the pixel 702E. Specifically, the sub-pixel 702EB, which displays a blue image, the sub-pixel 702EG, which displays a green image, the sub-pixel 702ER, which displays a red image, and the like can be used. In addition, a sub-pixel that displays a white image, a sub-pixel that displays a yellow image, or the like can be used.

For example, when the area of the pixel that displays a blue image is larger than that of the pixel that displays an image of a color other than blue, a white image can favorably be displayed.

<<Pixel>>

The pixel 702E includes the first display element 750EB, a coloring film CF1, and a pixel circuit.

<<First Display Element 750EB>>

For example, a display element having a function of controlling transmission or reflection of light can be used as the first display element 750EB. For example, a combined structure of a polarizing plate and a liquid crystal element or a MEMS shutter display element can be used.

Specifically, a liquid crystal element that can be driven by any of the following driving methods can be used: an in-plane switching (IPS) mode, a twisted nematic (TN) mode, a fringe field switching (FFS) mode, an axially symmetric aligned micro-cell (ASM) mode, an optically compensated birefringence (OCB) mode, a ferroelectric liquid crystal (FLC) mode, an antiferroelectric liquid crystal (AFLC) mode, and the like.

Alternatively, a liquid crystal element that can be driven by a driving method such as a vertical alignment (VA) mode, specifically, a multi-domain vertical alignment (MVA) mode, a patterned vertical alignment (PVA) mode, or an ASV mode can be used.

For example, thermotropic liquid crystal, low-molecular liquid crystal, high-molecular liquid crystal, polymer dispersed liquid crystal, ferroelectric liquid crystal, or antiferroelectric liquid crystal can be used. These liquid crystal materials exhibit a cholesteric phase, a smectic phase, a cubic phase, a chiral nematic phase, an isotropic phase, or the like depending on conditions. Alternatively, a liquid crystal material which exhibits a blue phase can be used.

For example, the first display element 750EB includes the liquid crystal layer 753 containing a liquid crystal material and the first conductive film 751E and the second conductive film 752 disposed such that an electric field which controls the orientation of the liquid crystal material can be applied.

A conductive material can be used for the first conductive film 751E.

For example, a material used for the wiring portion can be used for the first conductive film 751E or the second conductive film 752.

For example, a material that reflects light incident from the liquid crystal layer 753 side can be used for the first conductive film 751E. This allows the first display element 750EB to serve as a reflective liquid crystal element.

For example, a conductive film whose surface has projections and depressions can be used for the first conductive film 751E. In that case, incident light can be reflected in various directions so that a white image can be displayed.

For example, a conductive material that transmits visible light can be used for the second conductive film 752.

For example, a conductive oxide or an indium-containing conductive oxide can be used for the second conductive film 752. Alternatively, a metal film that is thin enough to transmit light can be used as the second conductive film 752.

Specifically, indium oxide, indium tin oxide, indium zinc oxide, zinc oxide, or zinc oxide to which gallium is added can be used for the second conductive film 752.

<<Opening 751H>>

In the first display portion 700F, the opening 751H is formed in the first conductive film 751E. Part of light incident from the substrate 710 passes through the opening 751H and can be emitted from the substrate 770.

The area of the opening 751H is preferably greater than or equal to 5% and less than or equal to 20%, more preferably 10% of that of the first conductive film 751E.

The opening 751H may have a polygonal shape, a quadrangular shape, an elliptical shape, a circular shape, or a cross shape, for example.

<<Coloring Film CF1>>

The coloring film CF1 includes a region overlapping with the first display element 750EB and has a function of transmitting light of a predetermined color. The coloring film CF1 can be used as a color filter, for example.

For example, the coloring film CF1, which transmits blue light, can be used in the sub-pixel 702EB. A coloring film that transmits green light can be used in the sub-pixel 702EG. A coloring film that transmits red light can be used in the sub-pixel 702ER. Furthermore, a coloring film that transmits white light and a coloring film that transmits yellow light can be used in sub-pixels for displaying a variety of colors.

<<Light-Blocking Film BM>>

The light-blocking film BM has an opening in a region overlapping with the sub-pixel 702EB.

A material that prevents light transmission can be used for the light-blocking film BM, in which case the light-blocking film BM serves as a black matrix, for example.

<<Pixel Circuit>>

A transistor ME1 a capacitor C1, or the like can be used in the pixel circuit.

The transistor ME1 includes a semiconductor film 718 and a conductive film 704 including a region overlapping with the semiconductor film 718 (see FIG. 4B). The transistor ME1 further includes a conductive film 712A and a conductive film 712B.

Note that the conductive film 712A has one of a function as a source electrode and a function as a drain electrode, and the conductive film 712B has the other. The conductive film 704 serves as a gate electrode, and an insulating film 706 serves as a gate insulating film.

The transistor ME1 can be, for example, a transistor having a function of reducing current flowing in an off state more than a transistor using amorphous silicon as a semiconductor. With this structure, the frequency of supplying a selection signal to a first pixel circuit can be reduced while flickers of display are reduced. Alternatively, power consumption can be reduced. Specifically, a transistor described in Embodiment 2 or 3 can be used as the transistor ME1.

The capacitor C1 includes the conductive film 712A and a conductive film including a region overlapping with the conductive film 712A (see FIG. 4A).

Note that the conductive film 712A is electrically connected to the first conductive film 751E.

<<Insulating Film>>

The insulating film 771 is disposed between the liquid crystal layer 753 and the light-blocking film BM or between the liquid crystal layer 753 and the coloring film CF1.

A material having a function of inhibiting diffusion of impurities into the liquid crystal layer 753 from the light-blocking film BM, the coloring film CF1, and the like can be used for the insulating film 771.

The insulating film 721B includes a region overlapping with the conductive film 704 and a region overlapping with the semiconductor film 718.

The insulating film 721A is provided between the semiconductor film 718 and the insulating film 721B (see FIGS. 4A and 4B).

<<Insulating Film 728>>

The insulating film 728 is provided between the insulating film 721B and the liquid crystal layer 753.

The insulating film 728 can eliminate level differences caused by various structures underlying the insulating film 728. Thus, the liquid crystal layer 753 can have a uniform thickness.

For example, an insulating inorganic material, an insulating organic material, or an insulating composite material containing an inorganic material or an organic material can be used for the insulating film 728 (see FIG. 4A).

Specifically, an inorganic oxide film, an inorganic nitride film, an inorganic oxynitride film, or a material obtained by stacking any of these films can be used for the insulating film 728.

Specifically, for the insulating film 728, polyester, polyolefin, polyamide, polyimide, polycarbonate, polysiloxane, an acrylic resin, or the like, or a layered material or a composite material of a plurality of kinds of resins selected from these can be used. Alternatively, a photosensitive material may be used.

<<Source Driver Circuit Portion SD1>>

For example, an integrated circuit can be used in the source driver circuit portion SD1. Specifically, an integrated circuit formed over a silicon substrate can be used (see FIG. 1).

For example, a chip on glass (COG) method can be used to mount the source driver circuit portion SD1 on a pad provided over the substrate 710. Specifically, an anisotropic conductive film can be used to mount the integrated circuit on the pad. Note that the pad is electrically connected to the pixel circuit.

<<Gate Driver Circuit Portion GD1>>

For example, a transistor ME2 can be used in the gate driver circuit portion GD1 (see FIGS. 4A and 4B).

For example, the transistor described in Embodiment 2 or Embodiment 3 can be used as the transistor ME2.

For example, a semiconductor film that can be formed through the same process as the semiconductor film 718 included in the transistor ME1 can be used in the transistor ME2.

Note that the transistor ME2 can have the same structure as the transistor ME1. Alternatively, the transistor ME2 may have a structure different from that of the transistor ME1.

<<Conductive Film 720>>

The conductive film 720 includes a region overlapping with the semiconductor film 718. In other words, the semiconductor film 718 is provided between the conductive film 720 and the conductive film 704. This can improve the characteristics or reliability of the transistor ME1 or the transistor ME2.

The conductive film 720 can be used for a second gate electrode of the transistor ME2. The conductive film 720 can be regarded as part of the transistor ME1 or the transistor ME2.

For example, a wiring through which the potential equal to that of the conductive film 704 can be supplied can be electrically connected to the conductive film 720.

For example, a material used for the wiring portion can be used for the conductive film 720. Specifically, conductive oxide, indium-containing conductive oxide, indium oxide, indium tin oxide, indium zinc oxide, indium zinc gallium oxide, zinc oxide, zinc oxide to which gallium is added, or the like can be used for the conductive film 720.

<<Wiring Portion, Terminal Portion>>

The wiring portion includes a signal line 711, and the terminal portion includes a connection electrode 719 (see FIG. 4A).

The signal line 711 is electrically connected to the connection electrode 719. Part of the signal line 711 can be used for the connection electrode 719.

The connection electrode 719 is electrically connected to a flexible printed substrate FPC1 with the use of, for example, a conductive member ACF1.

A conductive material can be used for the signal line 711 and the connection electrode 719.

For example, an inorganic conductive material, an organic conductive material, a metal material, or a conductive ceramic material can be used for the signal line 711 or the connection electrode 719.

Specifically, a metal element selected from aluminum, gold, platinum, silver, copper, chromium, tantalum, titanium, molybdenum, tungsten, nickel, iron, cobalt, palladium, and manganese, or the like can be used for the signal line 711 or the connection electrode 719. Alternatively, an alloy containing any of the above-described metal elements, or the like can be used for the signal line 711 or the connection electrode 719. In particular, an alloy of copper and manganese is suitably used in microfabrication with the use of a wet etching method.

Specifically, a two-layer structure in which a titanium film is stacked over an aluminum film, a two-layer structure in which a titanium film is stacked over a titanium nitride film, a two-layer structure in which a tungsten film is stacked over a titanium nitride film, a two-layer structure in which a tungsten film is stacked over a tantalum nitride film or a tungsten nitride film, a three-layer structure in which a titanium film, an aluminum film, and a titanium film are stacked in this order, or the like can be employed for the signal line 711 or the connection electrode 719.

Specifically, a conductive oxide such as indium oxide, indium tin oxide, indium zinc oxide, zinc oxide, or zinc oxide to which gallium is added can be used for the signal line 711 or the connection electrode 719.

Specifically, a film including graphene or graphite can be used for the signal line 711 or the connection electrode 719.

For example, a film including graphene oxide is formed and is subjected to reduction, so that a film including graphene can be formed. As a reducing method, a method using heat, a method using a reducing agent, or the like can be employed.

Specifically, a conductive polymer can be used for the signal line 711 or the connection electrode 719.

<<Conductive Member ACF1>>

For example, solder, a conductive paste, or an anisotropic conductive film can be used for the conductive member ACF1.

Specifically, conductive particles, a material that disperses particles, and the like can be used for the conductive member ACF1.

For example, a spherical, columnar, or filler particle with a size of greater than or equal to 1 µm and less than or equal to 200 µm, preferably greater than or equal to 3 µm and less than or equal to 150 µm can be used.

For example, a particle covered with a conductive material containing nickel, gold, or the like can be used.

Specifically, a particle containing polystyrene, an acrylic resin, titanium oxide, or the like can be used.

For example, synthetic rubber, a thermosetting resin, or a thermoplastic resin can be used for the material that disperses particles.

Thus, the flexible printed substrate FPC1 can be electrically connected to the connection electrode 719 with the use of particles.

<<Substrate 710>>

A light-transmitting material is used for the substrate 710. Alternatively, a material that is reduced in thickness by a polishing method can be used for the substrate 710.

For example, a layered material of a base 710A and an insulating film 710B can be used for the substrate 710. The insulating film 710B has a function of inhibiting diffusion of impurities contained in the base 710A or impurities from the outside.

A material having heat resistance high enough to withstand heat treatment in the manufacturing process can be used for the substrate 710.

For example, a large-sized glass substrate having any of the following sizes can be used as the substrate 710: the 6th generation (1500 mm×1850 mm), the 7th generation (1870 mm×2200 mm), the 8th generation (2200 mm×2400 mm), the 9th generation (2400 mm×2800 mm), and the 10th generation (2950 mm×3400 mm). Thus, a large-sized display device can be manufactured.

For the substrate 710, an organic material, an inorganic material, a composite material of an organic material and an inorganic material, or the like can be used. For example, an inorganic material such as glass, ceramic, or metal can be used for the substrate 710.

Specifically, non-alkali glass, soda-lime glass, potash glass, crystal glass, quartz, sapphire, or the like can be used for the substrate 710. Specifically, an inorganic oxide film, an inorganic nitride film, an inorganic oxynitride film, or the like can be used for the substrate 710. For example, a silicon oxide film, a silicon nitride film, a silicon oxynitride film, or an alumina film can be used for the substrate 710. For example, SUS or aluminum can be used for the substrate 710.

For example, a single crystal semiconductor substrate or a polycrystalline semiconductor substrate of silicon or silicon carbide, a compound semiconductor substrate of silicon germanium or the like, or an SOI substrate can be used as the substrate 710. Thus, a semiconductor element can be provided over the substrate 710.

For example, an organic material such as a resin, a resin film, or plastic can be used for the substrate 710. Specifically, a resin film or resin plate of polyester, polyolefin, polyamide, polyimide, polycarbonate, an acrylic resin, or the like can be used for the substrate 710.

For example, a composite material formed by attaching a metal plate, a thin glass plate, or a film of an inorganic material to a resin film or the like can be used for the substrate 710. For example, a composite material formed by dispersing a fibrous or particulate metal, glass, inorganic material, or the like into a resin film can be used for the substrate 710. For example, a composite material formed by dispersing a fibrous or particulate resin, organic material, or the like into an inorganic material can be used for the substrate 710.

Furthermore, a single-layer material or a layered material in which a plurality of layers are stacked can be used for the substrate 710. For example, a layered material in which a base, an insulating film that prevents diffusion of impurities contained in the base, and the like are stacked can be used for the substrate 710. Specifically, a layered material in which glass and one or a plurality of films that are selected from a silicon oxide layer, a silicon nitride layer, a silicon oxynitride layer, and the like and that prevent diffusion of impurities contained in the glass are stacked can be used for the substrate 710. Alternatively, a layered material in which a resin and a film for preventing diffusion of impurities that penetrate the resin, such as a silicon oxide film, a silicon nitride film, and a silicon oxynitride film are stacked can be used for the substrate 710.

Specifically, a resin film, a resin plate, a stack, or the like of polyester, polyolefin, polyamide, polyimide, polycarbonate, an acrylic resin, or the like can be used for the substrate 710.

Specifically, a material including polyester, polyolefin, polyamide (e.g., nylon or aramid), polyimide, polycarbonate, polyurethane, an acrylic resin, an epoxy resin, a resin having a siloxane bond such as silicone, or the like can be used for the substrate 710.

Specifically, polyethylene terephthalate (PET), polyethylene naphthalate (PEN), polyethersulfone (PES), acrylic, or the like can be used for the substrate 710.

Alternatively, paper, wood, or the like can be used for the substrate 710.

For example, a flexible substrate can be used as the substrate 710.

Note that a transistor, a capacitor, or the like can be directly formed on the flexible substrate. Alternatively, a transistor, a capacitor, or the like formed on a process substrate having heat resistance can be transferred to a flexible substrate.

<<Substrate 770>>

A light-transmitting material can be used for the substrate 770.

For example, a material that can be used for the substrate 710 can be used for the substrate 770.

<<Sealant 730>>

For the sealant 730, an inorganic material, an organic material, a composite material of an inorganic material and an organic material, or the like can be used.

For example, an organic material such as a thermally fusible resin or a curable resin can be used for the sealant 730.

For example, an organic material such as a reactive curable adhesive, a light curable adhesive, a thermosetting adhesive, and/or an anaerobic adhesive can be used for the sealant 730.

Specifically, an adhesive containing an epoxy resin, an acrylic resin, a silicone resin, a phenol resin, a polyimide resin, an imide resin, a polyvinyl chloride (PVC) resin, a polyvinyl butyral (PVB) resin, and an ethylene vinyl acetate (EVA) resin, or the like can be used for the sealant 730.

<<Optical Film 770P>>

The substrate 770 is located between the optical film 770P and the liquid crystal layer 753. The optical film 770P includes a region overlapping with the first display element 750EB.

For example, a polarizing plate, a retardation plate, a diffusing film, a condensing film, or the like can be used as the optical film 770P.

A hard coat layer that prevents damage can be used as the optical film, for example.

<<Second Display Portion 500E>>

The second display portion 500E includes a pixel portion, a wiring portion, a source driver circuit portion SD2, a gate driver circuit portion GD2, and a terminal portion (see FIG. 1 and FIG. 5).

The second display portion 500E includes a substrate 510, an insulating film 570, a structure body KB2, and a bonding layer 530.

The second display portion 500E further includes a coloring film CF2 and an insulating film 571.

The second display portion 500E further includes an insulating film 521A, an insulating film 521B, a partition wall 528A, and an insulating film 528B.

The insulating film 570 includes a region overlapping with the substrate 510.

The bonding layer 530 has a function of bonding the substrate 510 and the insulating film 570 to each other.

The structure body KB2 is provided between the substrate 510 and the insulating film 570. The structure body KB2 has a function of keeping a predetermined distance between the substrate 510 and the insulating film 570.

<<Pixel Portion>>

The pixel portion includes a pixel.

For example, a plurality of sub-pixels can be used in the pixel. Specifically, a sub-pixel that displays a blue image, a sub-pixel that displays a green image, a sub-pixel that displays a red image, and the like can be used. In addition, a sub-pixel that displays a white image, a sub-pixel that displays a yellow image, or the like can be used.

For example, when the area of the pixel that displays a blue image is larger than that of the pixel that displays an image of a color other than blue, a white image can be favorably displayed.

<<Pixel>>

The pixel includes the second display element 550EB, the coloring film CF2, and a pixel circuit.

<<Second Display Element 550EB>>

The second display element 550EB has a function of emitting light to the opening 751H and a region overlapping with the opening 751H.

A region of the second display element 550EB that has a shape substantially overlapping with the opening 751H emits light (see FIG. 2).

Any of a variety of light-emitting elements can be used as the second display element 550EB. For example, an organic electroluminescence element, an inorganic electroluminescence element, a light-emitting diode, or the like can be used as the second display element 550EB.

For example, the third conductive film 551EB, the fourth conductive film 552 including a region overlapping with the third conductive film 551EB, and the layer 553E containing a luminescent material between the third conductive film 551EB and the fourth conductive film 552 can be used in the second display element 550EB (see FIG. 5).

For example, a luminescent organic compound can be used for the layer 553E containing a luminescent material. Alternatively, quantum dots can be used for the layer 553E containing a luminescent material. A stack formed to emit white light can be used as the layer 553E containing a luminescent material. Specifically, a stack of a layer containing a luminescent material containing a fluorescent material that emits blue light and a layer containing a material that is other than a fluorescent material and that emits green light and/or red light can be used as the layer 553E containing a luminescent material.

For example, a material used for the wiring portion can be used for the third conductive film 551EB or the fourth conductive film 552.

For example, a conductive material that reflects visible light can be used for the third conductive film 551EB.

For example, a conductive material that transmits visible light can be used for the fourth conductive film 552.

Specifically, conductive oxide, indium-containing conductive oxide, indium oxide, indium tin oxide, indium zinc oxide, zinc oxide, zinc oxide to which gallium is added, or the like can be used for the fourth conductive film 552.

Alternatively, a metal film that is thin enough to transmit light can be used as the fourth conductive film 552.

<<Coloring Film CF2>>

The coloring film CF2 is provided between the opening 751H of the first conductive film 751E and the second display element 550EB.

The coloring film CF2 includes a region overlapping with the opening 751H and the second display element 550EB and has a function of transmitting light of a predetermined color. For example, a coloring film that transmits light passing through the coloring film CF1 can be used as the coloring film CF2. In that case, part of light emitted from the second display element 550EB that passes through the coloring film CF2, the opening 751H, and the coloring film CF1 can be extracted to the outside of a display panel. Note that a material having a function of converting the emitted light to a predetermined color light can be used for the coloring film CF2. Specifically, quantum dots can be used for the coloring film CF2. Thus, display with high color purity can be achieved.

For example, the material that can be used for the coloring film CF1 can be used for the coloring film CF2.

<<Pixel Circuit>>

A transistor ME3 or the like can be used in the pixel circuit.

For example, the structure that can be used for the transistor ME1 can be used for the transistor ME3.

For example, the transistor described in Embodiment 2 or Embodiment 3 can be used as the transistor ME3.

<<Insulating Film>>

The insulating film 571 is provided between the coloring film CF2 and the bonding layer 530.

The insulating film 521B includes a region overlapping with the conductive film 504 and a region overlapping with the semiconductor film.

The insulating film 521A is provided between the semiconductor film and the insulating film 521B (see FIG. 5).

<<Insulating Film 528B>>

The insulating film 528B can eliminate level differences caused by various structures underlying the insulating film 528B.

For example, the material that can be used for the insulating film 728 can be used for the insulating film 528B.

<<Partition Wall 528A>>

The partition wall 528A has an opening in a region overlapping with the second display element 550EB. For example, an insulating material can be used for the partition wall 528A. In that case, the second display element 550EB can be insulated from another structure adjacent to the second display element 550EB. Alternatively, the shape of the second display element can be determined using the shape of the opening formed in the partition wall 528A.

For example, the material that can be used for the insulating film 528B can be used for the partition wall 528A.

<<Source Driver Circuit Portion SD2>>

For example, an integrated circuit can be used in the source driver circuit portion SD2. Specifically, an integrated circuit formed over a silicon substrate can be used (see FIG. 1).

For example, a chip on glass (COG) method can be used to mount the source driver circuit portion SD2 on a pad provided over the substrate 510. Specifically, an anisotropic conductive film can be used to mount the integrated circuit on the pad. Note that the pad is electrically connected to the pixel circuit.

<<Gate Driver Circuit Portion GD2>>

For example, a transistor ME4 can be used in the gate driver circuit portion GD2 (see FIG. 5).

For example, the transistor described in Embodiment 2 or Embodiment 3 can be used as the transistor ME4.

For example, a semiconductor film that can be formed through the same process as the semiconductor film included in the transistor ME3 can be used in the transistor ME4.

Note that the transistor ME4 can have the same structure as the transistor ME3. Alternatively, the transistor ME4 may have a structure different from that of the transistor ME3.

<<Conductive Film 520>>

The conductive film 520 includes a region overlapping with the semiconductor film. In other words, the semiconductor film is provided between the conductive film 520 and the conductive film 504. This can improve reliability of the transistor ME3 or the transistor ME4.

The conductive film 520 can be used for a second gate electrode of the transistor ME4. The conductive film 520 can be regarded as part of the transistor ME3 or the transistor ME4.

For example, a wiring through which the potential equal to that of the conductive film 504 can be supplied can be electrically connected to the conductive film 520.

For example, a material used for the wiring portion can be used for the conductive film 520. Specifically, conductive oxide, indium-containing conductive oxide, indium oxide, indium tin oxide, indium zinc oxide, indium zinc gallium oxide, zinc oxide, zinc oxide to which gallium is added, or the like can be used for the conductive film 520.

<<Wiring Portion, Terminal Portion>>

The wiring portion includes a signal line, and the terminal portion includes a connection electrode 519 (see FIG. 5).

The signal line is electrically connected to the connection electrode 519. Part of the signal line can be used for the connection electrode 519.

The connection electrode 519 is electrically connected to a flexible printed substrate FPC2 with the use of, for example, a conductive member ACF2.

The material that can be used for the signal line 711 or the connection electrode 719 can be used for the signal line or the connection electrode 519.

<<Conductive Member ACF2>>

The material that can be used for the conductive member ACF1 can be used for the conductive member ACF2.

<<Substrate 510>>

A material having heat resistance high enough to withstand heat treatment in the manufacturing process can be used for the substrate 510.

For example, a layered material of a base 510A and an insulating film 510B can be used for the substrate 510. The insulating film 510B has a function of inhibiting diffusion of impurities contained in the base 510A or impurities from the outside.

For example, a material that can be used for the substrate 710 can be used for the substrate 510. Alternatively, a light-blocking material can be used for the substrate 510.

<<Insulating Film 570>>

For example, a single-layer material or a layered material in which a plurality of layers are stacked can be used for the insulating film 570. For example, a layered material including an insulating film that prevents diffusion of impurities can be used for the insulating film 570. Specifically, a layered material in which a resin and one or a plurality of films that are selected from a silicon oxide layer, a silicon nitride layer, a silicon oxynitride layer, and the like and that prevent diffusion of impurities that pass through the resin and the like are stacked can be used for the insulating film 570.

<<Bonding Layer 530>>

For the bonding layer 530, an inorganic material, an organic material, a composite material of an inorganic material and an organic material, or the like can be used.

For example, a material that can be used for the sealant 730 can be used for the bonding layer 530.

<<Bonding Layer 535>>

For the bonding layer 535, an inorganic material, an organic material, a composite material of an inorganic material and an organic material, or the like can be used.

For example, the material that can be used for the bonding layer 530 can be used for the bonding layer 535.

<<Structure Example 2 of Display Panel>>

Another structure of the display panel of one embodiment of the present invention will be described with reference to FIGS. 1, 2, and 6 to 8.

Figure 6:
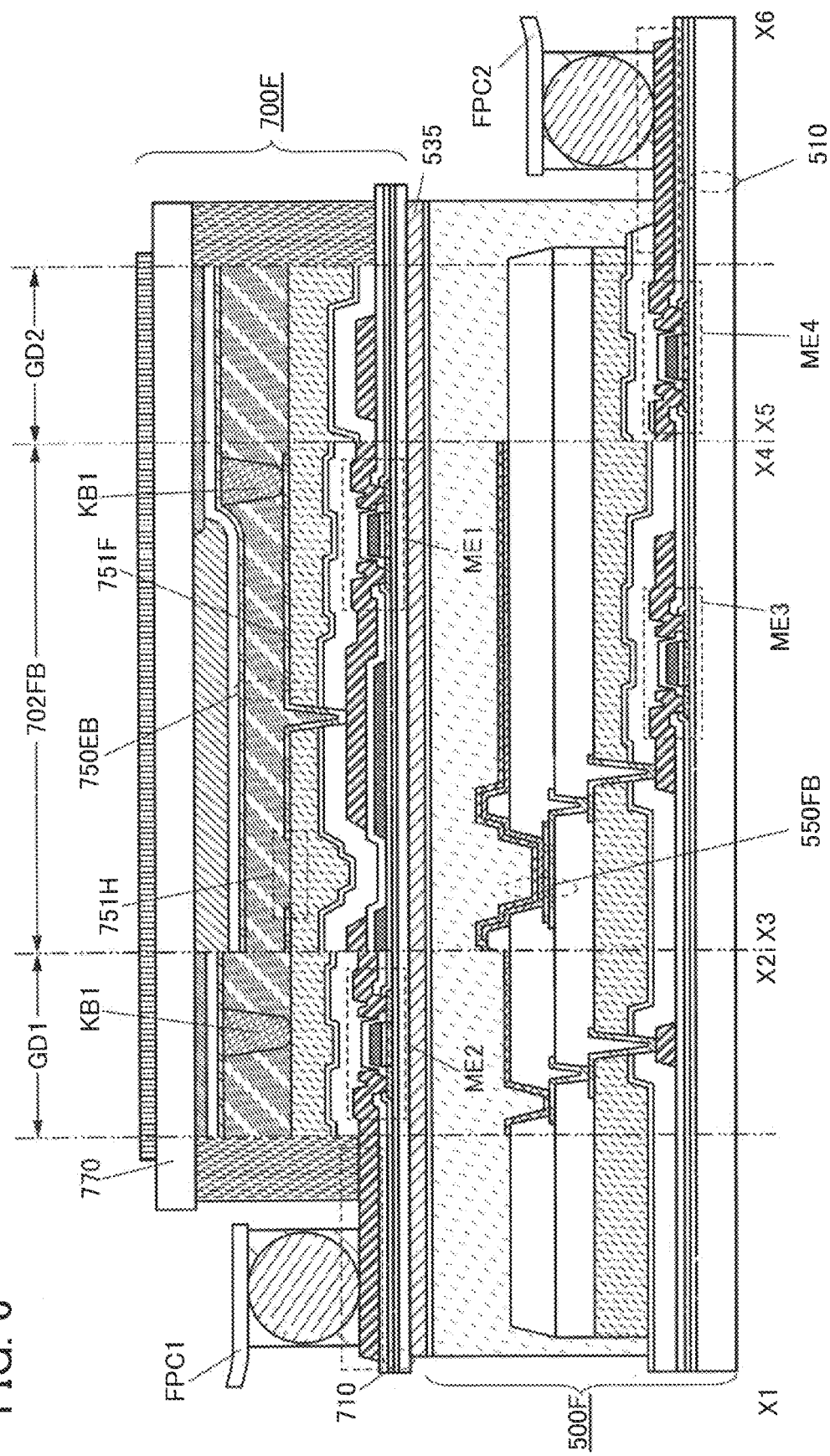
FIG. 6 is a cross-sectional view illustrating a structure of a display panel of one embodiment.

FIG. 6 is a cross-sectional view illustrating structures of the display panel of one embodiment of the present invention taken along the cutting plane lines X1-X2, X3-X4, and X5-X6 in FIG. 1.

FIG. 7A is a cross-sectional view illustrating structures of the first display portion 700F of the display panel of one embodiment of the present invention taken along the cutting plane lines X1-X2, X3-X4, and X5-X6 in FIG. 1. FIG. 7B is a cross-sectional view illustrating the structure of a transistor.

Figure 8:
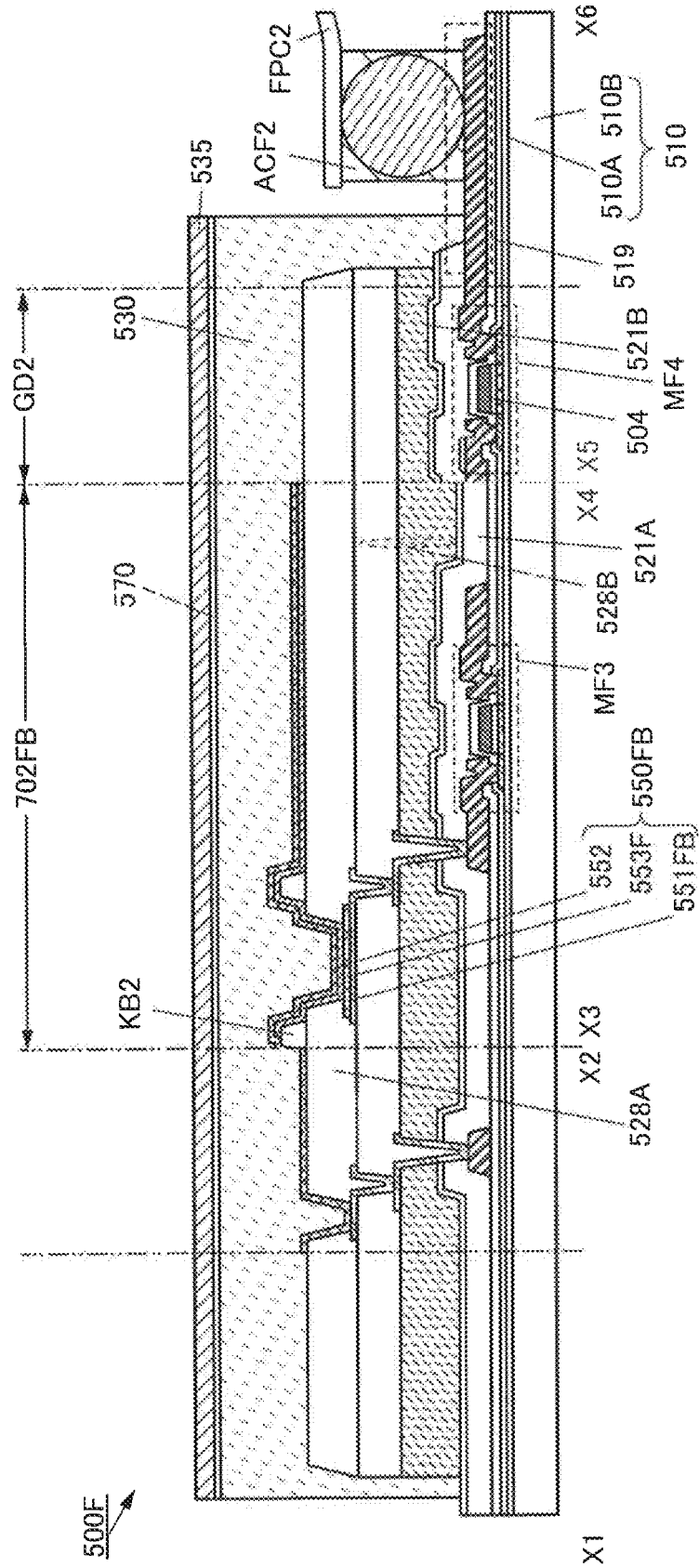
FIG. 8 is a cross-sectional view illustrating a structure of a second display portion of a display panel of one embodiment.

FIG. 8 is a cross-sectional view illustrating structures of the second display portion 500F of the display panel of one embodiment of the present invention taken along the cutting plane lines X1-X2, X3-X4, and X5-X6 in FIG. 1.

Structures different from those in the display panel described above will be described in detail below, and the above description is referred to for the other similar structures.

<<First Display Portion 700F>>

The first display portion 700F is different from the first display portion 700E described with reference to FIGS. 4A and 4B in that a flat first conductive film 751F and an optical film 770PF are provided, the structure body KB1 is provided over the substrate 770, and top-gate transistors MF1 and MF2 are provided.

For example, a polarizing plate containing a dichromatic pigment can be used for the optical film 770PF.

<<Second Display Portion 500F>>

The second display portion 500F is different from the second display portion 500E described with reference to FIG. 3 in that the coloring film CF2 is not provided, a second display element 550FB that emits blue light, green light, red light, or the like is provided, and the top-gate transistors MF1 and MF2 are provided.

In one sub-pixel, the second display element 550FB that emits light of a color different from that emitted from the second display element provided in another sub-pixel is used. For example, the second display element 550FB that emits blue light is used in one sub-pixel, and the second display element that emits green light or red light is used in another sub-pixel.

Specifically, the second display element including a layer 553F containing a luminescent material that emits blue light is used as the second display element 550FB. The second display element including a layer containing a luminescent material that emits green light or red light is used in another sub-pixel.

Note that an evaporation method or an ink-jet method using a shadow mask can be employed to form the layers containing luminescent materials. In that case, in one sub-pixel, the second display element 550FB that emits light of a color different from that emitted from the second display element provided in another sub-pixel can be used.

Figure 20:
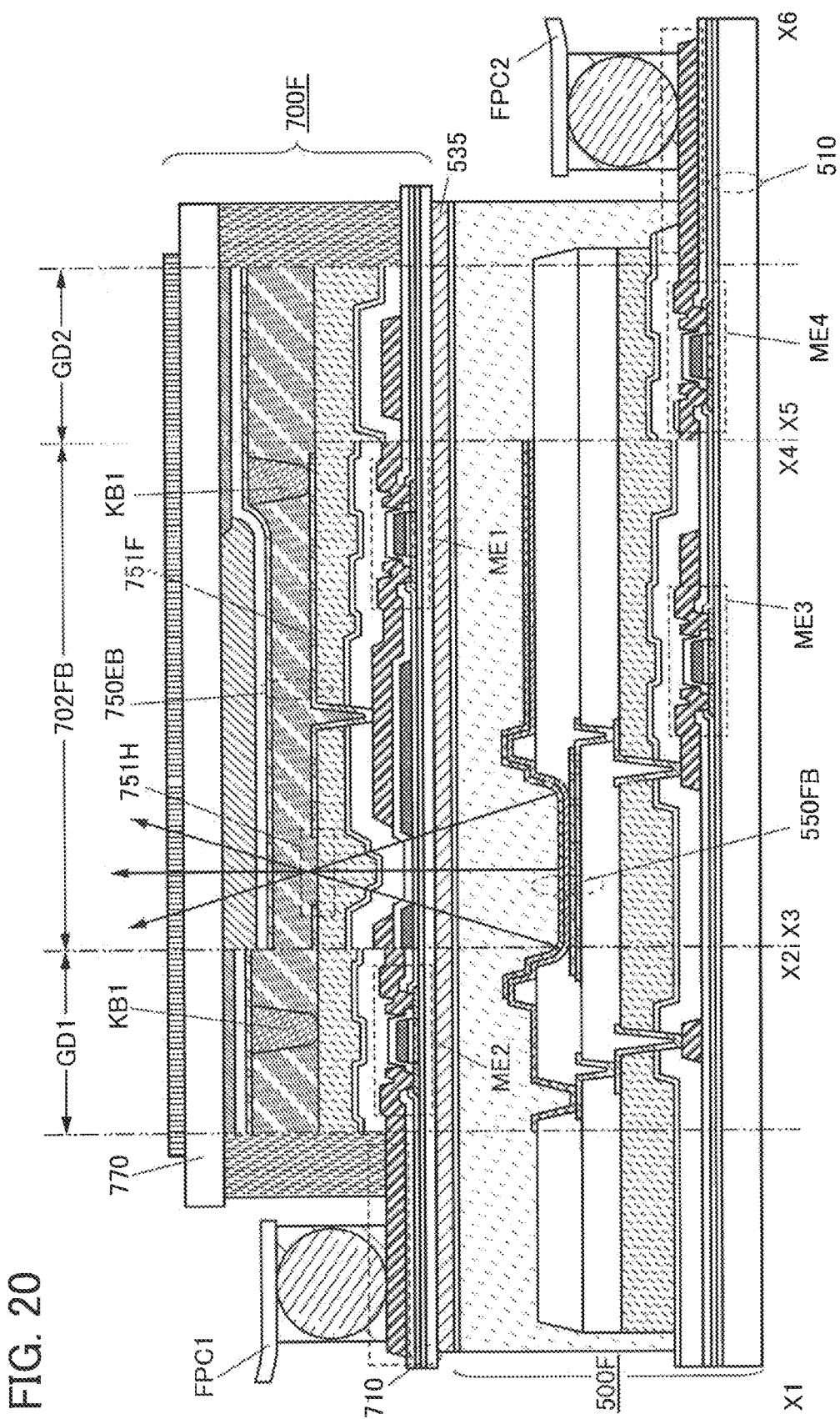
FIG. 20 is a cross-sectional view illustrating a structure of a display panel of one embodiment.

Note that the second display element 550FB may have a concave shape, and emitted light may be gathered into the opening 751H (see FIG. 20). Thus, a region having a light-emitting function of the second display element 550FB can be widened to a region not overlapping with the opening 751H. For example, the area of the region not overlapping with the opening 751H can be more than 20% of the area of a region overlapping with the opening 751H. Accordingly, the density of current flowing through the second display element 550FB can be reduced, so that, for example, heat generation can be reduced, reliability can be improved, or the size of the opening 751H can be reduced.

<<Transistor MF1>>

The transistor MF1 includes the conductive film 704 having a region overlapping with the insulating film 710B and the semiconductor film 718 having a region provided between the insulating film 710B and the conductive film 704. Note that the conductive film 704 functions as a gate electrode (see FIG. 7B).

The semiconductor film 718 is includes a first region 718A, a second region 718B, and a third region 718C. The first region 718A and the second region 718B do not overlap with the conductive film 704. The third region 718C is positioned between the first region 718A and the second region 718B and overlaps with the conductive film 704.

The transistor MF1 includes the insulating film 706 between the third region 718C and the conductive film 704. Note that the insulating film 706 functions as a gate insulating film.

The first region 718A and the second region 718B have a lower resistance than the third region 718C, and function as a source region and a drain region.

Note that, for example, a method for controlling the resistivity of the oxide semiconductor film to be described later can be used as a method for forming the first region 718A and the second region 718B in the semiconductor film 718. Specifically, plasma treatment using a gas containing a rare gas can be used. For example, when the conductive film 704 is used as a mask, the shape of part of the third region 718C can be the same as the shape of an end portion of the conductive film 704 in a self-aligned manner.

The transistor MF1 includes the conductive film 712A in contact with the first region 718A and the conductive film 712B in contact with the second region 718B. The conductive film 712A and the conductive film 712B function as a source electrode and a drain electrode.

A transistor that can be formed in the same process as the transistor MF1 can be used as the transistor MF2.

<Method for Controlling Resistivity of Oxide Semiconductor Film>

The method for controlling the resistivity of an oxide semiconductor film will be described.

An oxide semiconductor film with a certain resistivity can be used for the conductive film 720, the first region 718A, or the second region 718B.

For example, a method for controlling the concentration of impurities such as hydrogen and water contained in the oxide semiconductor film and/or the oxygen vacancies in the film can be used as the method for controlling the resistivity of an oxide semiconductor film.

Specifically, plasma treatment can be used as a method for increasing or decreasing the concentration of impurities such as hydrogen and water and/or the oxygen vacancies in the film.

Specifically, plasma treatment using a gas containing one or more kinds selected from a rare gas (He, Ne, Ar, Kr, Xe), hydrogen, boron, phosphorus, and nitrogen can be employed. For example, plasma treatment in an Ar atmosphere, plasma treatment in a mixed gas atmosphere of Ar and hydrogen, plasma treatment in an ammonia atmosphere, plasma treatment in a mixed gas atmosphere of Ar and ammonia, or plasma treatment in a nitrogen atmosphere can be employed. Thus, the oxide semiconductor film can have a high carrier density and a low resistivity.

Alternatively, hydrogen, boron, phosphorus, or nitrogen is added to the oxide semiconductor film by an ion implantation method, an ion doping method, a plasma immersion ion implantation method, or the like, so that the oxide semiconductor film can have a low resistivity.

Alternatively, an insulating film containing hydrogen is formed in contact with the oxide semiconductor film, and the hydrogen is diffused from the insulating film to the oxide semiconductor film, so that the oxide semiconductor film can have a high carrier density and a low resistivity.

For example, an insulating film with a hydrogen concentration of greater than or equal to $1\times10^{22}$ atoms/cm$^3$ is formed in contact with the oxide semiconductor film, in that case hydrogen can be effectively supplied to the oxide semiconductor film. Specifically, a silicon nitride film can be used as the insulating film formed in contact with the oxide semiconductor film.

Hydrogen contained in the oxide semiconductor film reacts with oxygen bonded to a metal atom to be water, and an oxygen vacancy is formed in a lattice from which oxygen is released (or a portion from which oxygen is released). Due to entry of hydrogen into the oxygen vacancy, an electron serving as a carrier is generated in some cases. Furthermore, bonding of part of hydrogen to oxygen bonded to a metal atom causes generation of an electron serving as a carrier in some cases. Thus, the oxide semiconductor film can have a high carrier density and a low resistivity.

Specifically, an oxide semiconductor with a hydrogen concentration measured by secondary ion mass spectrometry (SIMS) of greater than or equal to $8\times10^{19}$ atoms/cm$^3$, preferably greater than or equal to $1\times10^{20}$ atoms/cm$^3$, more preferably greater than or equal to $5\times10^{20}$ atoms/cm$^3$ can be suitably used for the conductive film 720.

On the other hand, an oxide semiconductor with a high resistivity can be used for a semiconductor film where a channel of a transistor is formed.

For example, an insulating film containing oxygen, in other words, an insulating film capable of releasing oxygen, is formed in contact with an oxide semiconductor film, and the oxygen is supplied from the insulating film to the oxide semiconductor film, so that oxygen vacancies in the film or at the interface can be filled. Thus, the oxide semiconductor film can have a high resistivity.

For example, a silicon oxide film or a silicon oxynitride film can be used as the insulating film capable of releasing oxygen.

The oxide semiconductor film in which oxygen vacancies are filled and the hydrogen concentration is reduced can be referred to as a highly purified intrinsic or substantially highly purified intrinsic oxide semiconductor film. The term "substantially intrinsic" refers to the state in which an oxide semiconductor film has a carrier density lower than $8\times10^{11}$/cm$^3$, preferably lower than $1\times10^{11}$/cm$^3$, further preferably lower than $1\times10^{10}$/cm$^3$. A highly purified intrinsic or substantially highly purified intrinsic oxide semiconductor film has few carrier generation sources and thus can have a low carrier density. The highly purified intrinsic or substantially highly purified intrinsic oxide semiconductor film has a low density of defect states and accordingly can have a low density of trap states.

Furthermore, a transistor including the highly purified intrinsic or substantially highly purified intrinsic oxide semiconductor film has an extremely low off-state current; even when an element has a channel width of $1\times10^6$ μm and a channel length of 10 μm, the off-state current can be lower than or equal to the measurement limit of a semiconductor parameter analyzer, that is, lower than or equal to $1\times10^{-13}$ A, at a voltage (drain voltage) between a source electrode and a drain electrode of from 1 V to 10 V.

The transistor in which a channel region is formed in the oxide semiconductor film that is a highly purified intrinsic or substantially highly purified intrinsic oxide semiconductor film can have a small change in electrical characteristics and high reliability.

Specifically, an oxide semiconductor has a hydrogen concentration which is measured by secondary ion mass spectrometry (SIMS) of lower than or equal to $2\times10^{20}$ atoms/cm$^3$, preferably lower than or equal to $5\times10^{19}$ atoms/cm$^3$, more preferably lower than or equal to $1\times10^{19}$ atoms/cm$^3$, more preferably lower than $5\times10^{18}$ atoms/cm$^3$, more preferably lower than or equal to $1\times10^{18}$ atoms/cm$^3$, more preferably lower than or equal to $5\times10^{17}$ atoms/cm$^3$, more preferably lower than or equal to $1\times10^{16}$ atoms/cm$^3$ can be favorably used for a semiconductor film where a channel of a transistor is formed.

An oxide semiconductor film that has a higher hydrogen concentration and/or a larger number of oxygen vacancies and that has a lower resistivity than the semiconductor film 718 is used as the conductive film 720.

The hydrogen concentration in the conductive film 720 is twice or more, preferably ten times or more that in the semiconductor film 718.

The resistivity of the conductive film 720 is greater than or equal to $1\times10^{-8}$ times and less than $1\times10^{-1}$ times that of the semiconductor film 718.

Specifically, the resistivity of the conductive film 720 is higher than or equal to $1\times10^{-3}$ Ωcm and lower than $1\times10^4$ Ωcm, preferably higher than or equal to $1\times10^{-3}$ Ωcm and lower than $1\times10^{-1}$ Ωcm.

This embodiment can be combined with any of the other embodiments in this specification as appropriate.

Embodiment 2

In this embodiment, a structure of a transistor that can be used in the display panel of one embodiment of the present invention will be described with reference to FIGS. 9A to 9D.

<Structure Example of Semiconductor Device>

Figure 9A:
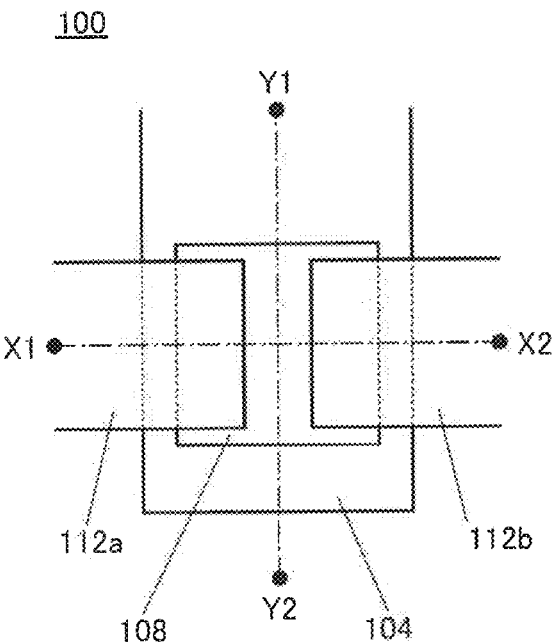
FIGS. 9A to 9D illustrate structures of a transistor of one embodiment.

FIG. 9A is a top view of a transistor 100. FIG. 9C is a cross-sectional view taken along the cutting plane line X1-X2 in FIG. 9A, and FIG. 9D is a cross-sectional view taken along the cutting plane line Y1-Y2 in FIG. 9A. Note that in FIG. 9A, some components of the transistor 100 (e.g., an insulating film serving as a gate insulating film) are not illustrated to avoid complexity. Furthermore, the direction of the cutting plane line X1-X2 may be called a channel length direction, and the direction of the cutting plane line Y1-Y2 may be called a channel width direction. As in FIG. 9A, some components are not illustrated in some cases in top views of transistors described below.

The transistor 100 can be used in the display panel described in Embodiment 1.

For example, when the transistor 100 is used as the transistor ME1, a substrate 102, a conductive film 104, a stacked film of an insulating film 106 and an insulating film 107, an oxide semiconductor film 108, a conductive film 112a, a conductive film 112b, a stacked film of an insulating film 114 and an insulating film 116, and an insulating film 118 can be referred to as the substrate 710, the conductive film 704, the insulating film 706, the semiconductor film 718, the conductive film 712A, the conductive film 712B, the insulating film 721A, and the insulating film 721B, respectively.

The transistor 100 includes the conductive film 104 functioning as a gate electrode over the substrate 102, the insulating film 106 over the substrate 102 and the conductive film 104, the insulating film 107 over the insulating film 106, the oxide semiconductor film 108 over the insulating film 107, and the conductive films 112a and 112b functioning as source and drain electrodes electrically connected to the oxide semiconductor film 108. Over the transistor 100, specifically, over the conductive films 112a and 112b and the oxide semiconductor film 108, the insulating films 114, 116, and 118 are provided. The insulating films 114, 116, and 118 function as protective insulating films for the transistor 100.

The oxide semiconductor film 108 includes an oxide semiconductor film 108a on the conductive film 104 side and an oxide semiconductor film 108b over the oxide semiconductor film 108a. The conductive film 104 serves as a gate electrode. The insulating films 106 and 107 function as gate insulating films of the transistor 100.

In-M oxide (M is Ti, Ga, Sn, Y, Zr, La, Ce, Nd, or Hf) or In-M-Zn oxide can be used for the oxide semiconductor film 108. It is particularly preferable to use In-M-Zn oxide for the oxide semiconductor film 108.

The oxide semiconductor film 108a includes a first region in which the atomic proportion of In is larger than the atomic proportion of M. The oxide semiconductor film 108b includes a second region in which the atomic proportion of In is smaller than that in the oxide semiconductor film 108a. The second region includes a portion thinner than the first region.

The oxide semiconductor film 108a including the first region in which the atomic proportion of In is larger than that of M can increase the field-effect mobility (also simply referred to as mobility or μFE) of the transistor 100. Specifically, the field-effect mobility of the transistor 100 can exceed 10 cm$^2$/Vs.

For example, the use of the transistor with high field-effect mobility for a gate driver that generates a gate signal (specifically, a demultiplexer connected to an output terminal of a shift register included in a gate driver) allows a semiconductor device or a display device to have a narrow frame.

On the other hand, the oxide semiconductor film 108a including the first region in which the atomic proportion of In is larger than that of M makes it easier to change electrical characteristics of the transistor 100 in light irradiation. However, in the semiconductor device of one embodiment of the present invention, the oxide semiconductor film 108b is formed over the oxide semiconductor film 108a. In addition, the thickness of the channel region in the oxide semiconductor film 108b is smaller than the thickness of the oxide semiconductor film 108a.

Furthermore, the oxide semiconductor film 108b includes the second region in which the atomic proportion of In is smaller than the oxide semiconductor film 108a and thus has larger Eg than that of the oxide semiconductor film 108a. For this reason, the oxide semiconductor film 108 which is a layered structure of the oxide semiconductor film 108a and the oxide semiconductor film 108b has high resistance to a negative bias stress test with light irradiation.

The amount of light absorbed by the oxide semiconductor film 108 can be reduced during light irradiation. As a result, the change in electrical characteristics of the transistor 100 due to light irradiation can be reduced. In the semiconductor device of one embodiment of the present invention, the insulating film 114 or the insulating film 116 includes excess oxygen. This structure can further reduce the change in electrical characteristics of the transistor 100 due to light irradiation.

Here, the oxide semiconductor film 108 is described in detail with reference to FIG. 9B.

Figure 9B:
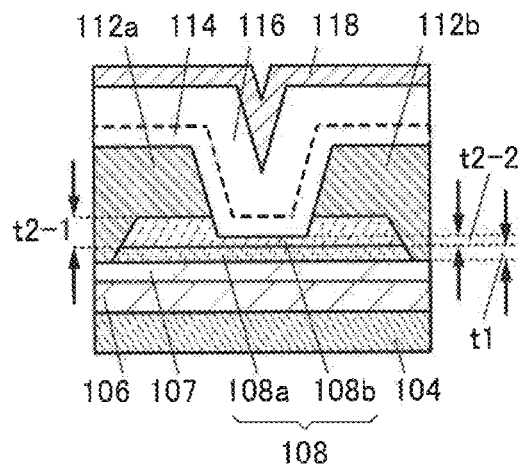
Figure 9C:
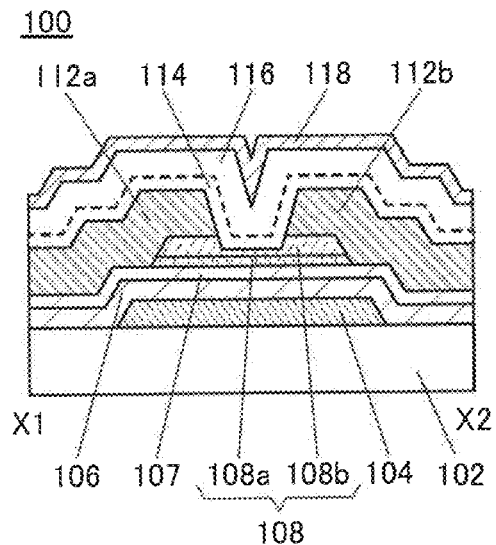
Figure 9D:
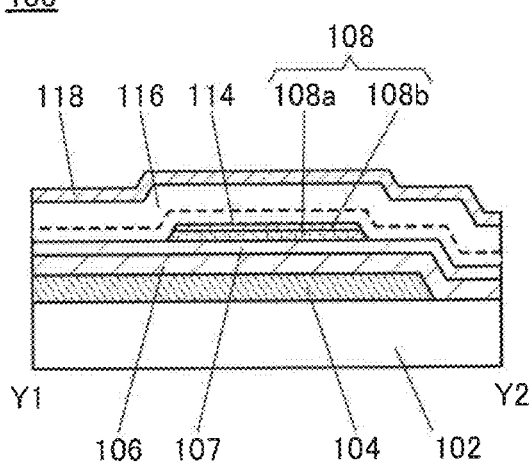

FIG. 9B is a cross-sectional enlarged view of the oxide semiconductor film 108 and the vicinity thereof in the transistor 100 illustrated in FIG. 9C.

In FIG. 9B, t1, t2-1, and t2-2 denote a thickness of the oxide semiconductor film 108a, one thickness of the oxide semiconductor film 108b, and the other thickness the oxide semiconductor film 108b, respectively. The oxide semiconductor film 108b over the oxide semiconductor film 108a prevents the oxide semiconductor film 108a from being exposed to an etching gas, an etchant, or the like when the conductive films 112a and 112b are formed. This is why the oxide semiconductor film 108a is not or is hardly reduced in thickness. In contrast, in the oxide semiconductor film 108b, a portion not overlapping with the conductive films 112a and 112b is etched by formation of the conductive films 112a and 112b, so that a depression is formed in the etched region. In other words, a thickness of the oxide semiconductor film 108b in a region overlapping with the conductive films 112a and 112b is t2-1, and a thickness of the oxide semiconductor film 108b in a region not overlapping with the conductive films 112a and 112b is t2-2.

As for the relationships between the thicknesses of the oxide semiconductor film 108a and the oxide semiconductor film 108b, t2-1>t1>t2-2 is preferable. A transistor with the thickness relationships can have high field-effect mobility and less variation in threshold voltage in light irradiation.

When oxygen vacancy is formed in the oxide semiconductor film 108 included in the transistor 100, electrons serving as carriers are generated; as a result, the transistor 100 tends to be normally-on. Therefore, for stable transistor characteristics, it is important to reduce oxygen vacancy in the oxide semiconductor film 108 particularly oxygen vacancy in the oxide semiconductor film 108a. In the structure of the transistor of one embodiment of the present invention, excess oxygen is introduced into an insulating film over the oxide semiconductor film 108, here, the insulating film 114 and/or the insulating film 116 over the oxide semiconductor film 108, whereby oxygen is moved from the insulating film 114 and/or the insulating film 116 to the oxide semiconductor film 108 to fill oxygen vacancy in the oxide semiconductor film 108 particularly in the oxide semiconductor film 108a.

It is preferable that the insulating films 114 and 116 each include a region (oxygen excess region) including oxygen in excess of that in the stoichiometric composition. In other words, the insulating films 114 and 116 are insulating films capable of releasing oxygen. Note that the oxygen excess region is formed in the insulating films 114 and 116 in such a manner that oxygen is introduced into the insulating films 114 and 116 after the deposition, for example. As a method for introducing oxygen, an ion implantation method, an ion doping method, a plasma immersion ion implantation method, plasma treatment, or the like may be employed.

In order to fill oxygen vacancy in the oxide semiconductor film 108a, the thickness of the portion including the channel region and the vicinity of the channel region in the oxide semiconductor film 108b is preferably small, and t2-2<t1 is preferably satisfied. For example, the thickness of the portion including the channel region and the vicinity of the channel region in the oxide semiconductor film 108b is preferably more than or equal to 1 nm and less than or equal to 20 nm, more preferably more than or equal to 3 nm and less than or equal to 10 nm.

Other constituent elements of the semiconductor device of this embodiment are described below in detail.

<<Substrate>>

There is no particular limitation on the property of a material and the like of the substrate 102 as long as the material has heat resistance enough to withstand at least heat treatment to be performed later. For example, a glass substrate, a ceramic substrate, a quartz substrate, or a sapphire substrate may be used as the substrate 102. Alternatively, a single crystal semiconductor substrate or a polycrystalline semiconductor substrate of silicon or silicon carbide, a compound semiconductor substrate of silicon germanium, an SOI substrate, or the like can be used as the substrate 102.

Alternatively, any of these substrates provided with a semiconductor element may be used as the substrate 102.

In the case where a glass substrate is used as the substrate 102, a large substrate having any of the following sizes can be used: the 6th generation (1500 mm×1850 mm), the 7th generation (1870 mm×2200 mm), the 8th generation (2200 mm×2400 mm), the 9th generation (2400 mm×2800 mm), and the 10th generation (2950 mm×3400 mm). Thus, a large display device can be manufactured.

Alternatively, a flexible substrate may be used as the substrate 102, and the transistor 100 may be provided directly on the flexible substrate. Alternatively, a separation layer may be provided between the substrate 102 and the transistor 100. The separation layer can be used when part or the whole of a semiconductor device formed over the separation layer is separated from the substrate 102 and transferred onto another substrate. In such a case, the transistor 100 can be transferred to a substrate having low heat resistance or a flexible substrate as well.

<<Conductive Film Functioning as Gate Electrode and Source and Drain Electrodes>>

The conductive film 104 functioning as a gate electrode and the conductive films 112a and 112b functioning as a source electrode and a drain electrode, respectively, can each be formed using a metal element selected from chromium (Cr), copper (Cu), aluminum (Al), gold (Au), silver (Ag), zinc (Zn), molybdenum (Mo), tantalum (Ta), titanium (Ti), tungsten (W), manganese (Mn), nickel (Ni), iron (Fe), and cobalt (Co); an alloy including any of these metal element as its component; an alloy including a combination of any of these metal elements; or the like.

Furthermore, the conductive films 104, 112a, and 112b may have a single-layer structure or a stacked-layer structure of two or more layers. For example, a single-layer structure of an aluminum film including silicon, a two-layer structure in which a titanium film is stacked over an aluminum film, a two-layer structure in which a titanium film is stacked over a titanium nitride film, a two-layer structure in which a tungsten film is stacked over a titanium nitride film, a two-layer structure in which a tungsten film is stacked over a tantalum nitride film or a tungsten nitride film, and a three-layer structure in which a titanium film, an aluminum film, and a titanium film are stacked in this order can be given. Alternatively, an alloy film or a nitride film in which aluminum and one or more elements selected from titanium, tantalum, tungsten, molybdenum, chromium, neodymium, and scandium are combined may be used.

The conductive films 104, 112a, and 112b can be formed using a light-transmitting conductive material such as indium tin oxide, indium oxide including tungsten oxide, indium zinc oxide including tungsten oxide, indium oxide including titanium oxide, indium tin oxide including titanium oxide, indium zinc oxide, or indium tin oxide to which silicon oxide is added.

A Cu—X alloy film (X is Mn, Ni, Cr, Fe, Co, Mo, Ta, or Ti) may be used for the conductive films 104, 112a, and 112b. Use of a Cu—X alloy film enables the manufacturing cost to be reduced because wet etching process can be used in the processing.

<<Insulating Film Functioning as Gate Insulating Film>>

As each of the insulating films 106 and 107 functioning as gate insulating films of the transistor 100, an insulating film including at least one of the following films formed by a plasma enhanced chemical vapor deposition (PECVD) method, a sputtering method, or the like can be used: a silicon oxide film, a silicon oxynitride film, a silicon nitride oxide film, a silicon nitride film, an aluminum oxide film, a hafnium oxide film, an yttrium oxide film, a zirconium oxide film, a gallium oxide film, a tantalum oxide film, a magnesium oxide film, a lanthanum oxide film, a cerium oxide film, and a neodymium oxide film. Note that instead of a stacked-layer structure of the insulating films 106 and 107, an insulating film of a single layer formed using a material selected from the above or an insulating film of three or more layers may be used.

The insulating film 106 has a function as a blocking film which inhibits penetration of oxygen. For example, in the case where excess oxygen is supplied to the insulating film 107, the insulating film 114, the insulating film 116, and/or the oxide semiconductor film 108, the insulating film 106 can inhibit penetration of oxygen.

Note that the insulating film 107 that is in contact with the oxide semiconductor film 108 functioning as a channel region of the transistor 100 is preferably an oxide insulating film and preferably includes a region including oxygen in excess of the stoichiometric composition (oxygen-excess region). In other words, the insulating film 107 is an insulating film capable of releasing oxygen. In order to provide the oxygen excess region in the insulating film 107, the insulating film 107 is formed in an oxygen atmosphere, for example. Alternatively, the oxygen excess region may be formed by introduction of oxygen into the insulating film 107 after the deposition. As a method for introducing oxygen, an ion implantation method, an ion doping method, a plasma immersion ion implantation method, plasma treatment, or the like may be employed.

In the case where hafnium oxide is used for the insulating film 107, the following effect is attained. Hafnium oxide has a higher dielectric constant than silicon oxide and silicon oxynitride. Therefore, by using hafnium oxide, the thickness of the insulating film 107 can be made large as compared with the case where silicon oxide is used; thus, leakage current due to tunnel current can be low. That is, it is possible to provide a transistor with a low off-state current. Moreover, hafnium oxide with a crystalline structure has higher dielectric constant than hafnium oxide with an amorphous structure. Therefore, it is preferable to use hafnium oxide with a crystalline structure in order to provide a transistor with a low off-state current. Examples of the crystalline structure include a monoclinic crystal structure and a cubic crystal structure. Note that one embodiment of the present invention is not limited thereto.

In this embodiment, a silicon nitride film is formed as the insulating film 106, and a silicon oxide film is formed as the insulating film 107. The silicon nitride film has a higher dielectric constant than a silicon oxide film and needs a larger thickness for capacitance equivalent to that of the silicon oxide film. Thus, when the silicon nitride film is included in the gate insulating film of the transistor 100, the physical thickness of the insulating film can be increased. This makes it possible to reduce a decrease in withstand voltage of the transistor 100 and furthermore to increase the withstand voltage, thereby reducing electrostatic discharge damage to the transistor 100.

<<Oxide Semiconductor Film>>

The oxide semiconductor film 108 can be formed using the materials described above.

In the case where the oxide semiconductor film 108 includes In-M-Zn oxide, it is preferable that the atomic ratio of metal elements of a sputtering target used for forming the In-M-Zn oxide satisfy In≥M and Zn≥M. As the atomic ratio of metal elements of such a sputtering target, In:M:Zn=1:1:1, In:M:Zn=1:1:1.2, In:M:Zn=2:1:3, In:M:Zn=3:1:2, and In:M:Zn=4:2:4.1 are preferable.

In the case where the oxide semiconductor film 108 is formed of In-M-Zn oxide, it is preferable to use a target including polycrystalline In-M-Zn oxide as the sputtering target. The use of the target including polycrystalline In-M-Zn oxide facilitates formation of the oxide semiconductor film 108 having crystallinity. Note that the atomic ratios of metal elements in the formed oxide semiconductor film 108 vary from the above atomic ratio of metal elements of the sputtering target within a range of ±40% as an error. For example, when a sputtering target with an atomic ratio of In to Ga and Zn of 4:2:4.1 is used, the atomic ratio of In to Ga and Zn in the oxide semiconductor film 108 may be 4:2:3 or in the vicinity of 4:2:3.

The oxide semiconductor film 108a can be formed using the sputtering target having an atomic ratio of In:M:Zn=2:1:3, In:M:Zn=3:1:2, or In:M:Zn=4:2:4.1. The oxide semiconductor film 108b can be formed using the sputtering target having an atomic ratio of In:M:Zn=1:1:1 or In:M:Zn=1:1:1.2. Note that the atomic ratio of metal elements in a sputtering target used for forming the oxide semiconductor film 108b does not necessarily satisfy In≥M and Zn≥M, and may satisfy In≥M and Zn≥M, such as In:M:Zn=3:2:1.

The energy gap of the oxide semiconductor film 108 is 2 eV or more, preferably 2.5 eV or more, further preferably 3 eV or more. The use of an oxide semiconductor having a wide energy gap can reduce off-state current of the transistor 100. In particular, an oxide semiconductor film having an energy gap more than or equal to 2 eV, preferably more than or equal to 2 eV and less than or equal to 3.0 eV is preferably used as the oxide semiconductor film 108a, and an oxide semiconductor film having an energy gap more than or equal to 2.5 eV and less than or equal to 3.5 eV is preferably used as the oxide semiconductor film 108b. Furthermore, the oxide semiconductor film 108b preferably has a higher energy gap than that of the oxide semiconductor film 108a.

Each thickness of the oxide semiconductor film 108a and the oxide semiconductor film 108b is more than or equal to 3 nm and less than or equal to 200 nm, preferably more than or equal to 3 nm and less than or equal to 100 nm, more preferably more than or equal to 3 nm and less than or equal to 50 nm. Note that the above-described thickness relationships between them are preferably satisfied.

An oxide semiconductor film with low carrier density is used as the oxide semiconductor film 108b. For example, the carrier density of the oxide semiconductor film 108b is lower than or equal to $1\times10^{17}/cm^3$, preferably lower than or equal to $1\times10^{15}/cm^3$, further preferably lower than or equal to $1\times10^{13}/cm^3$, still further preferably lower than or equal to $1\times10^{11}/cm^3$.

Note that, without limitation to the compositions and materials described above, a material with an appropriate composition may be used depending on required semiconductor characteristics and electrical characteristics (e.g., field-effect mobility and threshold voltage) of a transistor. Furthermore, in order to obtain required semiconductor characteristics of a transistor, it is preferable that the carrier density, the impurity concentration, the defect density, the atomic ratio of a metal element to oxygen, the interatomic distance, the density, and the like of the oxide semiconductor film 108a and the oxide semiconductor film 108b be set to be appropriate.

Note that it is preferable to use, as the oxide semiconductor film 108a and the oxide semiconductor film 108b, an oxide semiconductor film in which the impurity concentration is low and the density of defect states is low, in which case the transistor can have more excellent electrical characteristics. Here, the state in which the impurity concentration is low and the density of defect states is low (the amount of oxygen vacancy is small) is referred to as "highly purified intrinsic" or "substantially highly purified intrinsic". A highly purified intrinsic or substantially highly purified intrinsic oxide semiconductor film has few carrier generation sources, and thus can have a low carrier density. Thus, a transistor in which a channel region is formed in the oxide semiconductor film rarely has a negative threshold voltage (is rarely normally on). A highly purified intrinsic or substantially highly purified intrinsic oxide semiconductor film has a low density of defect states and accordingly has few carrier traps in some cases. Furthermore, the highly purified intrinsic or substantially highly purified intrinsic oxide semiconductor film has an extremely low off-state current; even when an element has a channel width of $1\times10^6$ μm and a channel length of 10 μm, the off-state current can be less than or equal to the measurement limit of a semiconductor parameter analyzer, that is, less than or equal to $1\times10^{-13}$ A, at a voltage (drain voltage) between a source electrode and a drain electrode of from 1 V to 10 V.

Accordingly, the transistor in which the channel region is formed in the highly purified intrinsic or substantially highly purified intrinsic oxide semiconductor film can have a small change in electrical characteristics and high reliability. Charges trapped by the trap states in the oxide semiconductor film take a long time to be released and may behave like fixed charges. Thus, the transistor whose channel region is formed in the oxide semiconductor film having a high density of trap states has unstable electrical characteristics in some cases. As examples of the impurities, hydrogen, nitrogen, alkali metal, alkaline earth metal, and the like are given.

Hydrogen included in the oxide semiconductor film reacts with oxygen bonded to a metal atom to be water, and also causes oxygen vacancy in a lattice from which oxygen is released (or a portion from which oxygen is released). Due to entry of hydrogen into the oxygen vacancy, an electron serving as a carrier is generated in some cases. Furthermore, in some cases, bonding of part of hydrogen to oxygen bonded to a metal atom causes generation of an electron serving as a carrier. Thus, a transistor including an oxide semiconductor film which contains hydrogen is likely to be normally on. Accordingly, it is preferable that hydrogen be reduced as much as possible in the oxide semiconductor film 108. Specifically, in the oxide semiconductor film 108, the concentration of hydrogen which is measured by SIMS is lower than or equal to $2\times10^{20}$ atoms/cm$^3$, preferably lower than or equal to $5\times10^{19}$ atoms/cm$^3$, further preferably lower than or equal to $1\times10^{19}$ atoms/cm$^3$, further preferably lower than or equal to $5\times10^{18}$ atoms/cm$^3$, further preferably lower than or equal to $1\times10^{18}$ atoms/cm$^3$, further preferably lower than or equal to $5\times10^{17}$ atoms/cm$^3$, and further preferably lower than or equal to $1\times10^{16}$ atoms/cm$^3$.

When silicon or carbon that is one of elements belonging to Group 14 is included in the oxide semiconductor film 108a, oxygen vacancy is increased in the oxide semiconductor film 108a, and the oxide semiconductor film 108a becomes an n-type film. Thus, the concentration of silicon or carbon (the concentration is measured by SIMS) in the oxide semiconductor film 108a or the concentration of silicon or carbon (the concentration is measured by SIMS) in the vicinity of an interface with the oxide semiconductor film 108a is set to be lower than or equal to $2\times10^{18}$ atoms/cm$^3$, preferably lower than or equal to $2\times10^{17}$ atoms/cm$^3$.

In addition, the concentration of alkali metal or alkaline earth metal of the oxide semiconductor film 108a, which is measured by SIMS, is lower than or equal to $1\times10^{18}$ atoms/cm$^3$, preferably lower than or equal to $2\times10^{16}$ atoms/cm$^3$. Alkali metal and alkaline earth metal might generate carriers when bonded to an oxide semiconductor, in which case the off-state current of the transistor might be increased. Therefore, it is preferable to reduce the concentration of alkali metal or alkaline earth metal of the oxide semiconductor film 108a.

Furthermore, when including nitrogen, the oxide semiconductor film 108a easily becomes n-type by generation of electrons serving as carriers and an increase of carrier density. Thus, a transistor including an oxide semiconductor film which contains nitrogen is likely to have normally-on characteristics. For this reason, nitrogen in the oxide semiconductor film is preferably reduced as much as possible; the concentration of nitrogen which is measured by SIMS is preferably set to be, for example, lower than or equal to $5\times10^{18}$ atoms/cm$^3$.

Each of the oxide semiconductor films 108a and 108b may have a non-single-crystal structure, for example. The non-single crystal structure includes a c-axis aligned crystalline oxide semiconductor (CAAC-OS), a polycrystalline structure, a microcrystalline structure, or an amorphous structure, for example. Among the non-single crystal structure, the amorphous structure has the highest density of defect states, whereas CAAC-OS has the lowest density of defect states.

<<Insulating Film Functioning as Protective Insulating Film of Transistor>>

The insulating films 114 and 116 each have a function of supplying oxygen to the oxide semiconductor film 108. The insulating film 118 has a function of a protective insulating film of the transistor 100. The insulating films 114 and 116 include oxygen. Furthermore, the insulating film 114 is an insulating film which can transmit oxygen. The insulating film 114 also functions as a film which relieves damage to the oxide semiconductor film 108 at the time of forming the insulating film 116 in a later step.

A silicon oxide film, a silicon oxynitride film, or the like with a thickness greater than or equal to 5 nm and less than or equal to 150 nm, preferably greater than or equal to 5 nm and less than or equal to 50 nm can be used as the insulating film 114.

In addition, it is preferable that the number of defects in the insulating film 114 be small and typically, the spin density corresponding to a signal that appears at g=2.001 due to a dangling bond of silicon be lower than or equal to $3\times10^{17}$ spins/cm$^3$ by electron spin resonance (ESR) measurement. This is because if the density of defects in the insulating film 114 is high, oxygen is bonded to the defects and the amount of oxygen that transmits the insulating film 114 is decreased.

Note that all oxygen entering the insulating film 114 from the outside does not move to the outside of the insulating film 114 and some oxygen remains in the insulating film 114. Furthermore, movement of oxygen occurs in the insulating film 114 in some cases in such a manner that oxygen enters the insulating film 114 and oxygen included in the insulating film 114 moves to the outside of the insulating film 114. When an oxide insulating film which can transmit oxygen is formed as the insulating film 114, oxygen released from the insulating film 116 provided over the insulating film 114 can be moved to the oxide semiconductor film 108 through the insulating film 114.

Note that the insulating film 114 can be formed using an oxide insulating film having a low density of states due to nitrogen oxide. Note that the density of states due to nitrogen oxide can be formed between the energy of the valence band maximum ($E_{v\_os}$) and the energy of the conduction band minimum ($E_{c\_os}$) of the oxide semiconductor film. A silicon oxynitride film that releases less nitrogen oxide, an aluminum oxynitride film that releases less nitrogen oxide, and the like can be used as the above oxide insulating film.

Note that a silicon oxynitride film that releases less nitrogen oxide is a film of which the amount of released ammonia is larger than the amount of released nitrogen oxide in TDS analysis; the amount of released ammonia is typically greater than or equal to $1\times10^{18}$/cm$^3$ and less than or equal to $5\times10^{19}$/cm$^3$. Note that the amount of released ammonia is the amount of ammonia released by heat treatment with which the surface temperature of a film becomes higher than or equal to 50° C. and lower than or equal to 650° C., preferably higher than or equal to 50° C. and lower than or equal to 550° C.

Nitrogen oxide ($NO_x$; x is greater than 0 and less than or equal to 2, preferably greater than or equal to 1 and less than or equal to 2), typically $NO_2$ or NO, forms levels in the insulating film 114, for example. The level is positioned in the energy gap of the oxide semiconductor film 108. Therefore, when nitrogen oxide is diffused to the interface between the insulating film 114 and the oxide semiconductor film 108, an electron is in some cases trapped by the level on the insulating film 114 side. As a result, the trapped electron remains in the vicinity of the interface between the insulating film 114 and the oxide semiconductor film 108; thus, the threshold voltage of the transistor is shifted in the positive direction.

Nitrogen oxide reacts with ammonia and oxygen in heat treatment. Since nitrogen oxide included in the insulating film 114 reacts with ammonia included in the insulating film 116 in heat treatment, nitrogen oxide included in the insulating film 114 is reduced. Therefore, an electron is hardly trapped at the vicinity of the interface between the insulating film 114 and the oxide semiconductor film 108.

By using such an oxide insulating film, the insulating film 114 can reduce the shift in the threshold voltage of the transistor, which leads to a smaller change in the electrical characteristics of the transistor.

Note that in an ESR spectrum at 100 K or lower of the insulating film 114, by heat treatment of a manufacturing process of the transistor, typically heat treatment at a temperature higher than or equal to 300° C. and lower than 350° C., a first signal that appears at a g-factor of greater than or equal to 2.037 and less than or equal to 2.039, a second signal that appears at a g-factor of greater than or equal to 2.001 and less than or equal to 2.003, and a third signal that appears at a g-factor of greater than or equal to 1.964 and less than or equal to 1.966 are observed. The split width of the first and second signals and the split width of the second and third signals that are obtained by ESR measurement using an X-band are each approximately 5 mT. The sum of the spin densities of the first signal that appears at a g-factor of greater than or equal to 2.037 and less than or equal to 2.039, the second signal that appears at a g-factor of greater than or equal to 2.001 and less than or equal to 2.003, and the third signal that appears at a g-factor of greater than or equal to 1.964 and less than or equal to 1.966 is lower than $1 \times 10^{18}$ spins/cm$^3$, typically higher than or equal to $1 \times 10^{17}$ spins/cm$^3$ and lower than $1 \times 10^{18}$ spins/cm$^3$.

In the ESR spectrum at 100 K or lower, the first signal that appears at a g-factor of greater than or equal to 2.037 and less than or equal to 2.039, the second signal that appears at a g-factor of greater than or equal to 2.001 and less than or equal to 2.003, and the third signal that appears at a g-factor of greater than or equal to 1.964 and less than or equal to 1.966 correspond to signals attributed to nitrogen oxide ($NO_x$; x is greater than 0 and less than or equal to 2, preferably greater than or equal to 1 and less than or equal to 2). Typical examples of nitrogen oxide include nitrogen monoxide and nitrogen dioxide. In other words, the lower the total spin density of the first signal that appears at a g-factor of greater than or equal to 2.037 and less than or equal to 2.039, the second signal that appears at a g-factor of greater than or equal to 2.001 and less than or equal to 2.003, and the third signal that appears at a g-factor of greater than or equal to 1.964 and less than or equal to 1.966 is, the lower the content of nitrogen oxide in the oxide insulating film is.

The concentration of nitrogen of the above oxide insulating film measured by SIMS is lower than or equal to $6 \times 10^{20}$ atoms/cm$^3$.

The above oxide insulating film is formed by a PECVD method at a film surface temperature higher than or equal to 220° C. and lower than or equal to 350° C. using silane and dinitrogen monoxide, whereby a dense and hard film can be formed.

The insulating film 116 is formed using an oxide insulating film that contains oxygen in excess of that in the stoichiometric composition. Part of oxygen is released by heating from the oxide insulating film including oxygen in excess of that in the stoichiometric composition. The oxide insulating film including oxygen in excess of that in the stoichiometric composition is an oxide insulating film of which the amount of released oxygen converted into oxygen atoms is greater than or equal to $1.0 \times 10^{19}$ atoms/cm$^3$, preferably greater than or equal to $3.0 \times 10^{20}$ atoms/cm$^3$ in TDS analysis. Note that the temperature of the film surface in the TDS analysis is preferably higher than or equal to 100° C. and lower than or equal to 700° C., or higher than or equal to 100° C. and lower than or equal to 500° C.

A silicon oxide film, a silicon oxynitride film, or the like with a thickness greater than or equal to 30 nm and less than or equal to 500 nm, preferably greater than or equal to 50 nm and less than or equal to 400 nm can be used as the insulating film 116.

It is preferable that the number of defects in the insulating film 116 be small, and typically the spin density corresponding to a signal which appears at g=2.001 due to a dangling bond of silicon be lower than $1.5 \times 10^{18}$ spins/cm$^3$, preferably lower than or equal to $1 \times 10^{18}$ spins/cm$^3$ by ESR measurement. Note that the insulating film 116 is provided more apart from the oxide semiconductor film 108 than the insulating film 114 is; thus, the insulating film 116 may have higher density of defects than the insulating film 114.

Furthermore, the insulating films 114 and 116 can be formed using insulating films formed of the same kinds of materials; thus, a boundary between the insulating films 114 and 116 cannot be clearly observed in some cases. Thus, in this embodiment, the boundary between the insulating films 114 and 116 is shown by a dashed line. Although a two-layer structure of the insulating films 114 and 116 is described in this embodiment, the present invention is not limited to this. For example, a single-layer structure of the insulating film 114 may be employed.

The insulating film 118 includes nitrogen. Alternatively, the insulating film 118 includes nitrogen and silicon. The insulating film 118 has a function of blocking oxygen, hydrogen, water, alkali metal, alkaline earth metal, or the like. It is possible to prevent outward diffusion of oxygen from the oxide semiconductor film 108, outward diffusion of oxygen included in the insulating films 114 and 116, and entry of hydrogen, water, or the like into the oxide semiconductor film 108 from the outside by providing the insulating film 118. A nitride insulating film, for example, can be used as the insulating film 118. The nitride insulating film is formed using silicon nitride, silicon nitride oxide, aluminum nitride, aluminum nitride oxide, or the like. Note that instead of the nitride insulating film having a blocking effect against oxygen, hydrogen, water, alkali metal, alkaline earth metal, and the like, an oxide insulating film having a blocking effect against oxygen, hydrogen, water, and the like may be provided. As the oxide insulating film having a blocking effect against oxygen, hydrogen, water, and the like, an aluminum oxide film, an aluminum oxynitride film, a gallium oxide film, a gallium oxynitride film, an yttrium oxide film, an yttrium oxynitride film, a hafnium oxide film, a hafnium oxynitride film, and the like can be given.

Although the variety of films such as the conductive films, the insulating films, and the oxide semiconductor films which are described above can be formed by a sputtering method or a PECVD method, such films may be formed by another method, e.g., a thermal CVD method. Examples of the thermal CVD method include a metal organic chemical vapor deposition (MOCVD) method and an atomic layer deposition (ALD) method.

A thermal CVD method has an advantage that no defect due to plasma damage is generated since it does not utilize plasma for forming a film.

Deposition by a thermal CVD method may be performed in such a manner that a source gas and an oxidizer are supplied to the chamber at a time so that the pressure in a chamber is set to an atmospheric pressure or a reduced pressure, and react with each other in the vicinity of the substrate or over the substrate.

Deposition by an ALD method may be performed in such a manner that the pressure in a chamber is set to an atmospheric pressure or a reduced pressure, source gases for reaction are sequentially introduced into the chamber, and then the sequence of the gas introduction is repeated. For example, two or more kinds of source gases are sequentially supplied to the chamber by switching respective switching valves (also referred to as high-speed valves). For example, a first source gas is introduced, an inert gas (e.g., argon or nitrogen) or the like is introduced at the same time as or after the introduction of the first source gas so that the source gases are not mixed, and then a second source gas is introduced. Note that in the case where the first source gas and the inert gas are introduced at a time, the inert gas serves as a carrier gas, and the inert gas may also be introduced at the same time as the introduction of the second source gas. Alternatively, the first source gas may be exhausted by vacuum evacuation instead of the introduction of the inert gas, and then the second source gas may be introduced. The first source gas is adsorbed on the surface of the substrate to form a first layer; then the second source gas is introduced to react with the first layer; as a result, a second layer is stacked over the first layer, so that a thin film is formed. The sequence of the gas introduction is repeated plural times until a desired thickness is obtained, whereby a thin film with excellent step coverage can be formed. The thickness of the thin film can be adjusted by the number of repetition times of the sequence of the gas introduction; therefore, an ALD method makes it possible to accurately adjust a thickness and thus is suitable for manufacturing a minute FET.

The variety of films such as the conductive films, the insulating films, the oxide semiconductor films, and the metal oxide films in this embodiment can be formed by a thermal CVD method such as an MOCVD method or an ALD method. For example, in the case where an In—Ga—Zn—O film is formed, trimethylindium, trimethylgallium, and dimethylzinc are used. Note that the chemical formula of trimethylindium is $In(CH_3)_3$. The chemical formula of trimethylgallium is $Ga(CH_3)_3$. The chemical formula of dimethylzinc is $Zn(CH_3)_2$. Without limitation to the above combination, triethylgallium (chemical formula: $Ga(C_2H_5)_3$) can be used instead of trimethylgallium and diethylzinc (chemical formula: $Zn(C_2H_5)_2$) can be used instead of dimethylzinc.

For example, in the case where a hafnium oxide film is formed by a deposition apparatus using an ALD method, two kinds of gases, that is, ozone ($O_3$) as an oxidizer and a source gas which is obtained by vaporizing liquid containing a solvent and a hafnium precursor compound (e.g., a hafnium alkoxide or a hafnium amide such as tetrakis(dimethylamide)hafnium (TDMAH)) are used. Note that the chemical formula of tetrakis(dimethylamide)hafnium is $Hf[N(CH_3)_2]_4$. Examples of another material liquid include tetrakis(ethylmethylamide)hafnium.

For example, in the case where an aluminum oxide film is formed by a deposition apparatus using an ALD method, two kinds of gases, e.g., $H_2O$ as an oxidizer and a source gas which is obtained by vaporizing liquid containing a solvent and an aluminum precursor compound (e.g., trimethylaluminum (TMA)) are used. Note that the chemical formula of trimethylaluminum is $Al(CH_3)_3$. Examples of another material liquid include tris(dimethylamide)aluminum, triisobutylaluminum, and aluminum tris(2,2,6,6-tetramethyl-3,5-heptanedionate).

For example, in the case where a silicon oxide film is formed by a deposition apparatus using an ALD method, hexachlorodisilane is adsorbed on a surface where a film is to be formed, chlorine included in the adsorbate is removed, and radicals of an oxidizing gas (e.g., $O_2$ or dinitrogen monoxide) are supplied to react with the adsorbate.

For example, in the case where a tungsten film is formed with a deposition apparatus using an ALD method, a $WF_6$ gas and a $B_2H_6$ gas are sequentially introduced plural times to form an initial tungsten film, and then a $WF_6$ gas and an $H_2$ gas are used, so that a tungsten film is formed. Note that an $SiH_4$ gas may be used instead of a $B_2H_6$ gas.

For example, in the case where an oxide semiconductor film, e.g., an In—Ga—Zn—O film is formed using a deposition apparatus using an ALD method, an $In(CH_3)_3$ gas and an $O_3$ gas) are sequentially introduced plural times to form an InO layer, a GaO layer is formed using a $Ga(CH_3)_3$ gas and an $O_3$ gas), and then a ZnO layer is formed using a $Zn(CH_3)_2$ gas and an $O_3$ gas). Note that the order of these layers is not limited to this example. A mixed compound layer such as an In—Ga—O layer, an In—Zn—O layer, or a Ga—Zn—O layer may be formed by mixing these gases. Note that although an $H_2O$ gas which is obtained by bubbling water with an inert gas such as Ar may be used instead of an $O_3$ gas), it is preferable to use an $O_3$ gas), which does not contain H. Furthermore, instead of an $In(CH_3)_3$ gas, an $In(C_2H_5)_3$ gas may be used. Instead of a $Ga(CH_3)_3$ gas, a $Ga(C_2H_5)_3$ gas may be used. Furthermore, a $Zn(CH_3)_2$ gas may be used.

This embodiment can be combined with any of the other embodiments in this specification as appropriate.

Embodiment 3

In this embodiment, structures of a transistor that can be used in the display panel of one embodiment of the present invention will be described with reference to FIGS. 10A to 10C.

<Structure Example of Semiconductor Device>

Figure 10A:
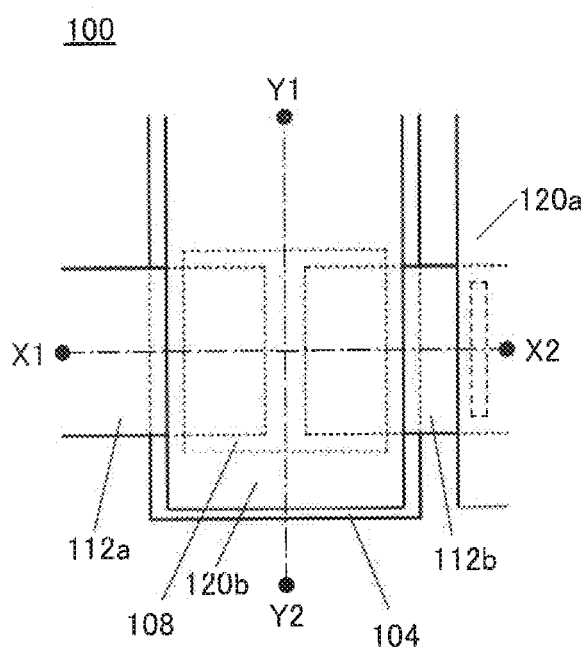
FIGS. 10A to 10C illustrate structures of a transistor of one embodiment.
Figure 10B:
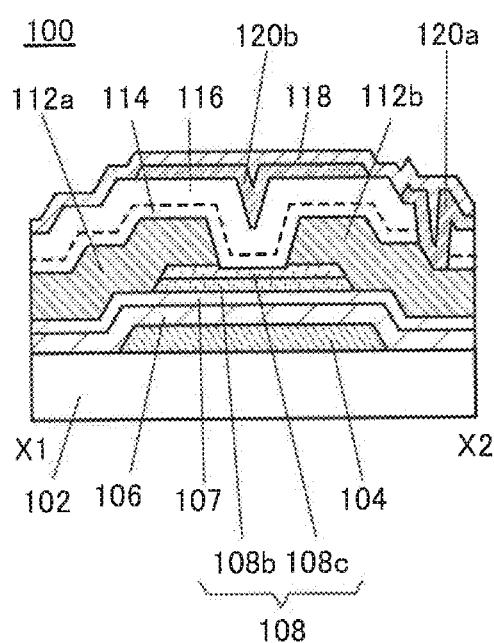
Figure 10C:
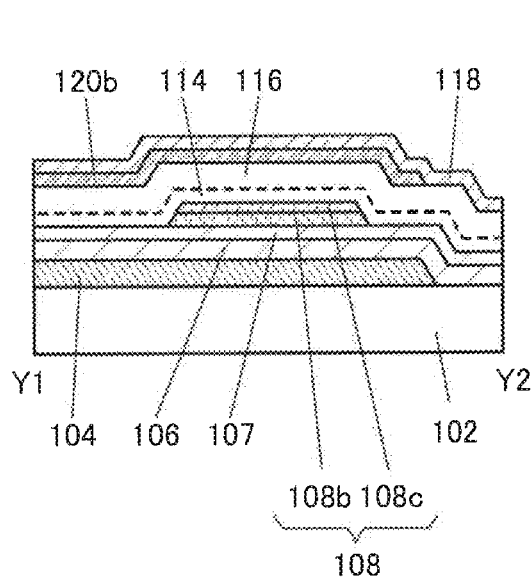

FIG. 10A is a top view of the transistor 100. FIG. 10B is a cross-sectional view taken along the cutting plane line X1-X2 in FIG. 10A, and FIG. 10C is a cross-sectional view taken along the cutting plane line Y1-Y2 in FIG. 10A. Note that in FIG. 10A, some components of the transistor 100 (e.g., an insulating film serving as a gate insulating film) are not illustrated to avoid complexity. Furthermore, the direction of the cutting plane line X1-X2 may be called a channel length direction, and the direction of the cutting plane line Y1-Y2 may be called a channel width direction. As in FIG. 10A, some components are not illustrated in some cases in top views of transistors described below.

The transistor 100 can be used for the display panel described in Embodiment 1, or other devices.

For example, when the transistor 100 is used as the transistor ME1, the substrate 102, the conductive film 104, a stacked film of the insulating film 106 and the insulating film 107, the oxide semiconductor film 108, the conductive film 112a, the conductive film 112b, a stacked film of the insulating film 114 and the insulating film 116, the insulating film 118, and a conductive film 120b can be referred to as the substrate 710, the conductive film 704, the insulating film 706, the semiconductor film 718, the conductive film 712A, the conductive film 712B, an insulating film 721A, the insulating film 721B, and the conductive film 720, respectively.

The transistor 100 includes the conductive film 104 functioning as a first gate electrode over the substrate 102, the insulating film 106 over the substrate 102 and the conductive film 104, the insulating film 107 over the insulating film 106, the oxide semiconductor film 108 over the insulating film 107, and the conductive films 112a and 112b functioning as source and drain electrodes electrically connected to the oxide semiconductor film 108, the insulating films 114 and 116 over the oxide semiconductor film 108 and the conductive films 112a and 112b, a conductive film 120a that is over the insulating film 116 and electrically connected to the conductive film 112b, the conductive film 120b over the insulating film 116, and the insulating film 118 over the insulating film 116 and the conductive films 120a and 120b.

The insulating films 106 and 107 function as a first gate insulating film of the transistor 100. The insulating films 114 and 116 function as a second gate insulating film of the transistor 100. The insulating film 118 functions as a protective insulating film of the transistor 100. In this specification and the like, the insulating films 106 and 107 are collectively referred to as a first insulating film, the insulating films 114 and 116 are collectively referred to as a second insulating film, and the insulating film 118 is referred to as a third insulating film in some cases.

The conductive film 120b can be used as a second gate electrode of the transistor 100.

In the case where the transistor 100 is used in a display panel, the conductive film 120a can be used as an electrode of a display element, or the like.

The oxide semiconductor film 108 includes the oxide semiconductor film 108b (on the conductive film 104 side) that functions as a first gate electrode, and an oxide semiconductor film 108c over the oxide semiconductor film 108b. The oxide semiconductor films 108b and 108c contain In, M (M is Al, Ga, Y, or Sn), and Zn.

The oxide semiconductor film 108b preferably includes a region in which the atomic proportion of In is larger than the atomic proportion of M, for example. The oxide semiconductor film 108c preferably includes a region in which the atomic proportion of In is smaller than that in the oxide semiconductor film 108b.

The oxide semiconductor film 108b including the region in which the atomic proportion of In is larger than that of M can increase the field-effect mobility (also simply referred to as mobility or µFE) of the transistor 100. Specifically, the field-effect mobility of the transistor 100 can exceed 10 $cm^2/Vs$, preferably exceed 30 $cm^2/Vs$.

For example, the use of the transistor with high field-effect mobility for a gate driver that generates a gate signal (specifically, a demultiplexer connected to an output terminal of a shift register included in a gate driver) allows a semiconductor device or a display device to have a narrow frame.

On the other hand, the oxide semiconductor film 108b including the region in which the atomic proportion of In is larger than that of M makes it easier to change electrical characteristics of the transistor 100 in light irradiation. However, in the semiconductor device of one embodiment of the present invention, the oxide semiconductor film 108c is formed over the oxide semiconductor film 108b. Furthermore, the oxide semiconductor film 108c including the region in which the atomic proportion of In is smaller than that in the oxide semiconductor film 108b has larger Eg than the oxide semiconductor film 108b. For this reason, the oxide semiconductor film 108 which is a layered structure of the oxide semiconductor film 108b and the oxide semiconductor film 108c has high resistance to a negative bias stress test with light irradiation.

Impurities such as hydrogen or moisture entering the channel region of the oxide semiconductor film 108, particularly the oxide semiconductor film 108b adversely affect the transistor characteristics and therefore cause a problem. Moreover, it is preferable that the amount of impurities such as hydrogen or moisture in the channel region of the oxide semiconductor film 108b be as small as possible. Furthermore, oxygen vacancies formed in the channel region in the oxide semiconductor film 108b adversely affect the transistor characteristics and therefore cause a problem. For example, oxygen vacancies formed in the channel region in the oxide semiconductor film 108b are bonded to hydrogen to serve as a carrier supply source. The carrier supply source generated in the channel region in the oxide semiconductor film 108b causes a change in the electrical characteristics, typically, shift in the threshold voltage, of the transistor 100 including the oxide semiconductor film 108b. Therefore, it is preferable that the amount of oxygen vacancies in the channel region of the oxide semiconductor film 108b be as small as possible.

In view of this, one embodiment of the present invention is a structure in which insulating films in contact with the oxide semiconductor film 108, specifically the insulating film 107 formed under the oxide semiconductor film 108 and the insulating films 114 and 116 formed over the oxide semiconductor film 108 include excess oxygen. Oxygen or excess oxygen is transferred from the insulating film 107 and the insulating films 114 and 116 to the oxide semiconductor film 108, whereby the oxygen vacancies in the oxide semiconductor film can be reduced. As a result, a change in electrical characteristics of the transistor 100, particularly a change in the transistor 100 due to light irradiation, can be reduced.

In one embodiment of the present invention, a manufacturing method is used in which the number of manufacturing steps is not increased or an increase in the number of manufacturing steps is extremely small, because the insulating film 107 and the insulating films 114 and 116 are made to contain excess oxygen. Thus, the transistors 100 can be manufactured with high yield.

Specifically, in a step of forming the oxide semiconductor film 108b, the oxide semiconductor film 108b is formed by a sputtering method in an atmosphere containing an oxygen gas, whereby oxygen or excess oxygen is added to the insulating film 107 over which the oxide semiconductor film 108b is formed.

Furthermore, in a step of forming the conductive films 120a and 120b, the conductive films 120a and 120b are formed by a sputtering method in an atmosphere containing an oxygen gas, whereby oxygen or excess oxygen is added to the insulating film 116 over which the conductive films 120a and 120b are formed. Note that in some cases, oxygen or excess oxygen is added also to the insulating film 114 and the oxide semiconductor film 108 under the insulating film 116 when oxygen or excess oxygen is added to the insulating film 116.

<Oxide Conductor>

Next, an oxide conductor is described. In a step of forming the conductive films 120a and 120b, the conductive films 120a and 120b serve as a protective film for suppressing release of oxygen from the insulating films 114 and 116. The conductive films 120a and 120b serve as semiconductors before a step of forming the insulating film 118 and serve as conductors after the step of forming the insulating film 118.

To allow the conductive films 120a and 120b to serve as conductors, an oxygen vacancy is formed in the conductive films 120a and 120b and hydrogen is added from the insulating film 118 to the oxygen vacancy, whereby a donor level is formed in the vicinity of the conduction band. As a result, the conductivity of each of the conductive films 120a and 120b is increased, so that the oxide semiconductor film becomes a conductor. The conductive films 120a and 120b having become conductors can each be referred to as oxide conductor. Oxide semiconductors generally have a visible light transmitting property because of their large energy gap.

An oxide conductor is an oxide semiconductor having a donor level in the vicinity of the conduction band. Therefore, the influence of absorption due to the donor level is small in an oxide conductor, and an oxide conductor has a visible light transmitting property comparable to that of an oxide semiconductor.

<Components of the Semiconductor Device>

Components of the semiconductor device of this embodiment will be described below in detail.

As materials described below, materials described in Embodiment 2 can be used.

The material that can be used for the substrate 102 described in Embodiment 2 can be used for the substrate 102 in this embodiment. Furthermore, the materials that can be used for the insulating films 106 and 107 described in Embodiment 2 can be used for the insulating films 106 and 107 in this embodiment.

In addition, the materials that can be used for the conductive films functioning as the gate electrode, the source electrode, and the drain electrode described in Embodiment 2 can be used for the conductive films functioning as the first gate electrode, the source electrode, and the drain electrode in this embodiment.

<<Oxide Semiconductor Film>>

The oxide semiconductor film 108 can be formed using the materials described above.

In the case where the oxide semiconductor film 108b includes In-M-Zn oxide, it is preferable that the atomic ratio of metal elements of a sputtering target used for forming the In-M-Zn oxide satisfy In>M The atomic ratio between metal elements in such a sputtering target is, for example, In:M: Zn=2:1:3, In:M:Zn=3:1:2, or In:M:Zn=4:2:4.1.

In the case where the oxide semiconductor film 108c is In-M-Zn oxide, it is preferable that the atomic ratio of metal elements of a sputtering target used for forming a film of the In-M-Zn oxide satisfy In≤M. The atomic ratio of metal elements in such a sputtering target is, for example, In:M: Zn=1:1:1, In:M:Zn=1:1:1.2, In:M:Zn=1:3:2, In:M:Zn=1:3: 4, In:M:Zn=1:3:6, or In:M:Zn=1:4:5.

In the case where the oxide semiconductor films 108b and 108c are formed of In-M-Zn oxide, it is preferable to use a target including polycrystalline In-M-Zn oxide as the sputtering target. The use of the target including polycrystalline In-M-Zn oxide facilitates formation of the oxide semiconductor films 108b and 108c having crystallinity. Note that the atomic ratios of metal elements in each of the formed oxide semiconductor films 108b and 108c vary from the above atomic ratio of metal elements of the sputtering target within a range of ±40% as an error. For example, when a sputtering target of the oxide semiconductor film 108b with an atomic ratio of In to Ga and Zn of 4:2:4.1 is used, the atomic ratio of In to Ga and Zn in the oxide semiconductor film 108b may be 4:2:3 or in the vicinity of 4:2:3.

The energy gap of the oxide semiconductor film 108 is 2 eV or more, preferably 2.5 eV or more, further preferably 3 eV or more. The use of an oxide semiconductor having a wide energy gap can reduce off-state current of the transistor 100. In particular, an oxide semiconductor film having an energy gap more than or equal to 2 eV, preferably more than or equal to 2 eV and less than or equal to 3.0 eV is preferably used as the oxide semiconductor film 108b, and an oxide semiconductor film having an energy gap more than or equal to 2.5 eV and less than or equal to 3.5 eV is preferably used as the oxide semiconductor film 108c. Furthermore, the oxide semiconductor film 108c preferably has a higher energy gap than the oxide semiconductor film 108b.

Each thickness of the oxide semiconductor film 108b and the oxide semiconductor film 108c is more than or equal to 3 nm and less than or equal to 200 nm, preferably more than or equal to 3 nm and less than or equal to 100 nm, more preferably more than or equal to 3 nm and less than or equal to 50 nm.

An oxide semiconductor film with low carrier density is used as the oxide semiconductor film 108c. For example, the carrier density of the oxide semiconductor film 108c is lower than or equal to $1 \times 10^{17}/cm^3$, preferably lower than or equal to $1 \times 10^{15}/cm^3$, further preferably lower than or equal to $1 \times 10^{13}/cm^3$, still further preferably lower than or equal to $1 \times 10^{11}/cm^3$.

Note that, without limitation to the compositions and materials described above, a material with an appropriate composition may be used depending on required semiconductor characteristics and electrical characteristics (e.g., field-effect mobility and threshold voltage) of a transistor. Furthermore, in order to obtain required semiconductor characteristics of a transistor, it is preferable that the carrier density, the impurity concentration, the defect density, the atomic ratio of a metal element to oxygen, the interatomic distance, the density, and the like of the oxide semiconductor film 108b and the oxide semiconductor film 108c be set to be appropriate.

Note that it is preferable to use, as the oxide semiconductor film 108b and the oxide semiconductor film 108c, an oxide semiconductor film in which the impurity concentration is low and the density of defect states is low, in which case the transistor can have more excellent electrical characteristics. Here, the state in which the impurity concentration is low and the density of defect states is low (the amount of oxygen vacancy is small) is referred to as "highly purified intrinsic" or "substantially highly purified intrinsic". A highly purified intrinsic or substantially highly purified intrinsic oxide semiconductor film has few carrier generation sources, and thus can have a low carrier density. Thus, a transistor in which a channel region is formed in the oxide semiconductor film rarely has a negative threshold voltage (is rarely normally on). A highly purified intrinsic or substantially highly purified intrinsic oxide semiconductor film has a low density of defect states and accordingly has few carrier traps in some cases. Furthermore, the highly purified intrinsic or substantially highly purified intrinsic oxide semiconductor film has an extremely low off-state current; even when an element has a channel width of $1 \times 10^6$ μm and a channel length of 10 μm, the off-state current can be less than or equal to the measurement limit of a semiconductor parameter analyzer, that is, less than or equal to $1 \times 10^{-13}$ A, at a voltage (drain voltage) between a source electrode and a drain electrode of from 1 V to 10 V.

Accordingly, the transistor in which the channel region is formed in the highly purified intrinsic or substantially highly purified intrinsic oxide semiconductor film can have a small change in electrical characteristics and high reliability. Charges trapped by the trap states in the oxide semiconductor film take a long time to be released and may behave like fixed charges. Thus, the transistor whose channel region is formed in the oxide semiconductor film having a high density of trap states has unstable electrical characteristics in some cases. As examples of the impurities, hydrogen, nitrogen, alkali metal, and alkaline earth metal are given.

Hydrogen included in the oxide semiconductor film reacts with oxygen bonded to a metal atom to be water, and also causes oxygen vacancy in a lattice from which oxygen is released (or a portion from which oxygen is released). Due to entry of hydrogen into the oxygen vacancy, an electron serving as a carrier is generated in some cases. Furthermore, in some cases, bonding of part of hydrogen to oxygen bonded to a metal atom causes generation of an electron serving as a carrier. Thus, a transistor including an oxide semiconductor film which contains hydrogen is likely to be normally on. Accordingly, it is preferable that hydrogen be reduced as much as possible in the oxide semiconductor film 108. Specifically, in the oxide semiconductor film 108, the concentration of hydrogen which is measured by SIMS is lower than or equal to $2\times10^{20}$ atoms/cm$^3$, preferably lower than or equal to $5\times10^{19}$ atoms/cm$^3$, further preferably lower than or equal to $1\times10^{19}$ atoms/cm$^3$, further preferably lower than or equal to $5\times10^{18}$ atoms/cm$^3$, further preferably lower than or equal to $1\times10^{18}$ atoms/cm$^3$, further preferably lower than or equal to $5\times10^{17}$ atoms/cm$^3$, and further preferably lower than or equal to $1\times10^{16}$ atoms/cm$^3$.

The oxide semiconductor film 108b preferably includes a region in which hydrogen concentration is smaller than that in the oxide semiconductor film 108c. A semiconductor device including the oxide semiconductor film 108b having the region in which hydrogen concentration is smaller than that in the oxide semiconductor film 108c can be increased in reliability.

When silicon or carbon that is one of elements belonging to Group 14 is included in the oxide semiconductor film 108b, oxygen vacancy increases in the oxide semiconductor film 108b, and the oxide semiconductor film 108b becomes an n-type film. Thus, the concentration of silicon or carbon (the concentration is measured by SIMS) in the oxide semiconductor film 108b or the concentration of silicon or carbon (the concentration is measured by SIMS) in the vicinity of an interface with the oxide semiconductor film 108b is set to be lower than or equal to $2\times10^{18}$ atoms/cm$^3$, preferably lower than or equal to $2\times10^{17}$ atoms/cm$^3$.

In addition, the concentration of alkali metal or alkaline earth metal of the oxide semiconductor film 108b, which is measured by SIMS, is lower than or equal to $1\times10^{18}$ atoms/cm$^3$, preferably lower than or equal to $2\times10^{16}$ atoms/cm$^3$. Alkali metal and alkaline earth metal might generate carriers when bonded to an oxide semiconductor, in which case the off-state current of the transistor might be increased. Therefore, it is preferable to reduce the concentration of alkali metal or alkaline earth metal of the oxide semiconductor film 108b.

Furthermore, when including nitrogen, the oxide semiconductor film 108b easily becomes n-type by generation of electrons serving as carriers and an increase of carrier density. Thus, a transistor including an oxide semiconductor film which contains nitrogen is likely to have normally-on characteristics. For this reason, nitrogen in the oxide semiconductor film is preferably reduced as much as possible; the concentration of nitrogen which is measured by SIMS is preferably set to be, for example, lower than or equal to $5\times10^{18}$ atoms/cm$^3$.

The oxide semiconductor film 108b and the oxide semiconductor film 108c may have a non-single-crystal structure, for example. The non-single crystal structure includes a c-axis aligned crystalline oxide semiconductor (CAAC-OS), a polycrystalline structure, a microcrystalline structure, or an amorphous structure, for example. Among the non-single crystal structure, the amorphous structure has the highest density of defect states, whereas CAAC-OS has the lowest density of defect states.

<<Insulating Films Functioning as Second Gate Insulating Film>>

The insulating films 114 and 116 function as a second gate insulating film of the transistor 100. In addition, the insulating films 114 and 116 each have a function of supplying oxygen to the oxide semiconductor film 108. That is, the insulating films 114 and 116 contain oxygen. Furthermore, the insulating film 114 is an insulating film which can transmit oxygen. Note that the insulating film 114 also functions as a film which relieves damage to the oxide semiconductor film 108 at the time of forming the insulating film 116 in a later step.

For example, the insulating films 114 and 116 described in Embodiment 2 can be used as the insulating films 114 and 116 in this embodiment.

<<Oxide Semiconductor Film Functioning as Conductive Film, Oxide Semiconductor Film Functioning as Second Gate Electrode>>

The material of the oxide semiconductor film 108 described above can be used for the conductive film 120a and the conductive film 120b functioning as the second gate electrode.

That is, the conductive film 120a and the conductive film 120b functioning as a second gate electrode contain a metal element which is the same as that contained in the oxide semiconductor film 108 (the oxide semiconductor film 108b and the oxide semiconductor film 108c). For example, the conductive film 120b functioning as a second gate electrode and the oxide semiconductor film 108 (the oxide semiconductor film 108b and the oxide semiconductor film 108c) contain the same metal element; thus, the manufacturing cost can be reduced.

For example, in the case where the conductive film 120a and the conductive film 120b functioning as a second gate electrode are each In-M-Zn oxide, the atomic ratio of metal elements in a sputtering target used for forming the In-M-Zn oxide preferably satisfies In≥M The atomic ratio of metal elements in such a sputtering target is In:M:Zn=2:1:3, In:M:Zn=3:1:2, In:M:Zn=4:2:4.1, or the like.

The conductive film 120a and the conductive film 120b functioning as a second gate electrode can each have a single-layer structure or a stacked-layer structure of two or more layers. Note that in the case where the conductive film 120a and the conductive film 120b each have a stacked-layer structure, the composition of the sputtering target is not limited to that described above.

<<Insulating Film Functioning as Protective Insulating Film of Transistor>>

The insulating film 118 serves as a protective insulating film of the transistor 100.

The insulating film 118 includes one or both of hydrogen and nitrogen. Alternatively, the insulating film 118 includes nitrogen and silicon. The insulating film 118 has a function of blocking oxygen, hydrogen, water, alkali metal, alkaline earth metal, or the like. It is possible to prevent outward diffusion of oxygen from the oxide semiconductor film 108, outward diffusion of oxygen included in the insulating films 114 and 116, and entry of hydrogen, water, or the like into the oxide semiconductor film 108 from the outside by providing the insulating film 118.

The insulating film 118 has a function of supplying one or both of hydrogen and nitrogen to the conductive film 120a and the conductive film 120b functioning as a second gate electrode. The insulating film 118 preferably includes hydrogen and has a function of supplying the hydrogen to the conductive films 120a and 120b. The conductive films 120a and 120b supplied with hydrogen from the insulating film 118 function as conductors.

A nitride insulating film, for example, can be used as the insulating film 118. The nitride insulating film is formed using silicon nitride, silicon nitride oxide, aluminum nitride, aluminum nitride oxide, or the like.

Although the variety of films such as the conductive films, the insulating films, and the oxide semiconductor films which are described above can be formed by a sputtering method or a PECVD method, such films may be formed by another method, e.g., a thermal CVD method. Examples of the thermal CVD method include an MOCVD method and an ALD method. Specifically, the methods described in Embodiment 2 can be used.

This embodiment can be combined with any of the other embodiments in this specification as appropriate.

Embodiment 4

In this embodiment, a structure of an input/output device of one embodiment of the present invention will be described with reference to FIG. 11.

Figure 11:
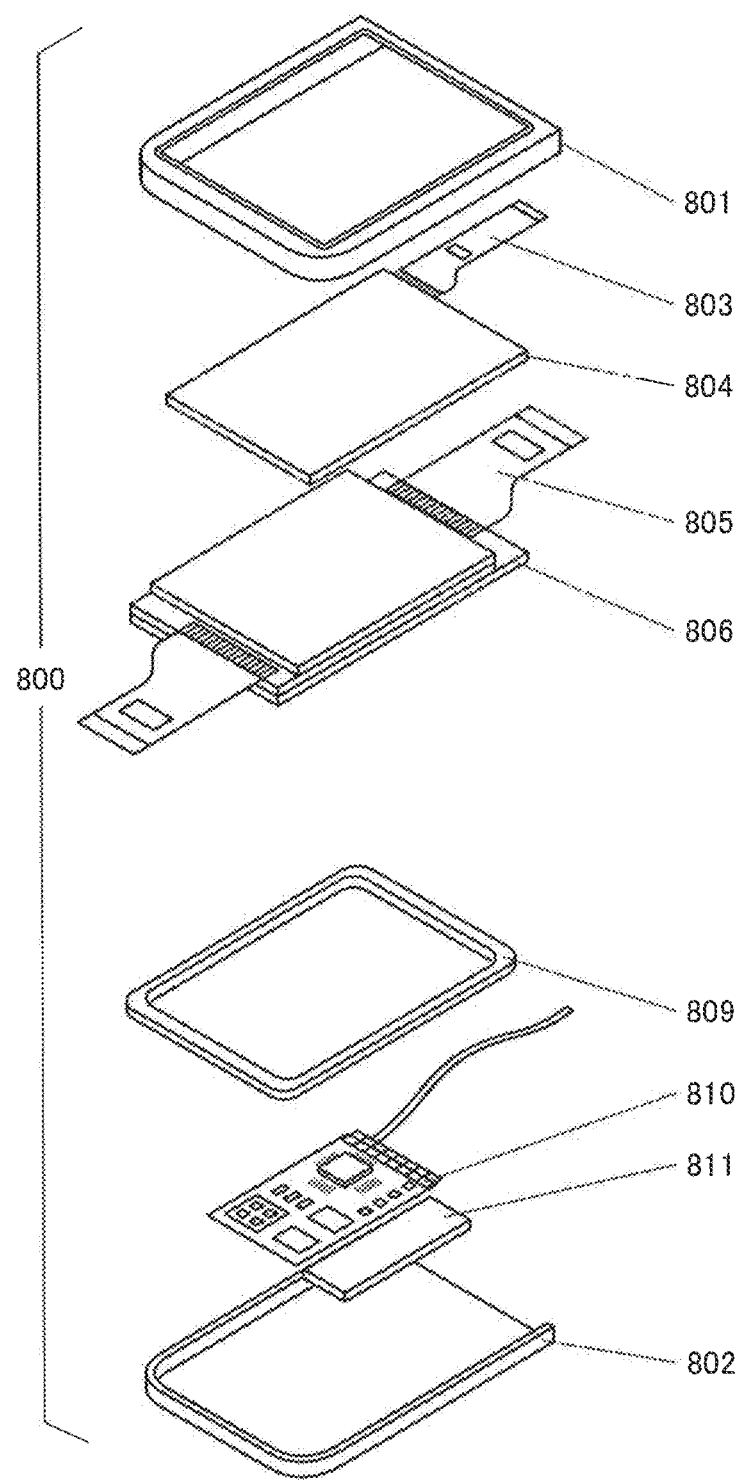
FIG. 11 illustrates a structure of an input/output device of one embodiment.

FIG. 11 is an exploded view illustrating a structure of an input/output device 800.

The input/output device 800 is provided with a display panel 806 and a touch sensor 804 including a region overlapping with the display panel 806. Note that the input/output device 800 can be a touch panel.

The input/output device 800 is provided with a driver circuit 810 for driving the touch sensor 804 and the display panel 806, a battery 811 for supplying power to the driver circuit 810, and a housing where the touch sensor 804, the display panel 806, the driver circuit 810, and the battery 811 are stored.

<<Touch Sensor 804>>

The touch sensor 804 includes the region overlapping with the display panel 806. Note that an FPC 803 is electrically connected to the touch sensor 804.

For the touch sensor 804, a resistive touch sensor, a capacitive touch sensor, or a touch sensor using a photoelectric conversion element can be used, for example.

Note that the touch sensor 804 may be used as part of the display panel 806.

<<Display Panel 806>>

The display panel described in Embodiment 1 can be used as the display panel 806, for example. Note that an FPC 805 is electrically connected to the display panel 806.

<<Driver Circuit 810>>

As the driver circuit 810, a power supply circuit or a signal processing circuit can be used, for example. Power supplied from the battery or an external commercial power supply can be utilized.

The signal processing circuit has a function of outputting a video signal and a clock signal.

The power supply circuit has a function of supplying predetermined power.

<<Housing>>

An upper cover 801, a lower cover 802 which fits the upper cover 801, and a frame 809 which is stored in a region surrounded by the upper cover 801 and the lower cover 802 can be used for the housing, for example.

The frame 809 has a function of protecting the display panel 806, a function of blocking electromagnetic waves generated by the operation of the driver circuit 810, or a function of a heat sink.

Metal, a resin, an elastomer, or the like can be used for the upper cover 801, the lower cover 802, or the frame 809.

<<Battery 811>>

The battery 811 has a function of supplying power.

Note that a member such as a polarizing plate, a retardation plate, or a prism sheet can be used for the input/output device 800.

This embodiment can be combined with any of the other embodiments in this specification as appropriate.

Embodiment 5

In this embodiment, a structure of an information processing device of one embodiment of the present invention will be described with reference to FIGS. 12A and 12B, FIGS. 13A to 13D, FIGS. 14A and 14B, and FIG. 15.

Figure 12A:
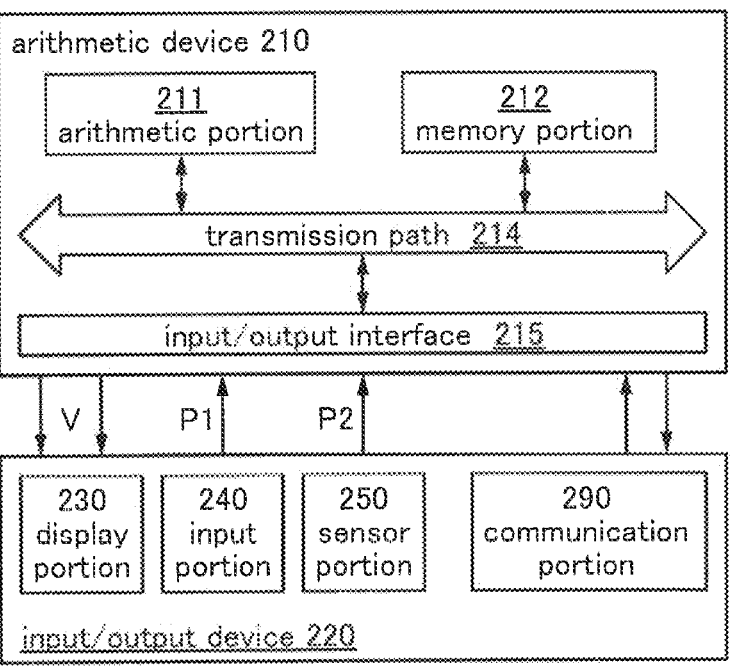
FIG. 12A is a block diagram and FIG. 12B is a projection view each illustrating a structure of an information processing device of one embodiment.
Figure 12B:
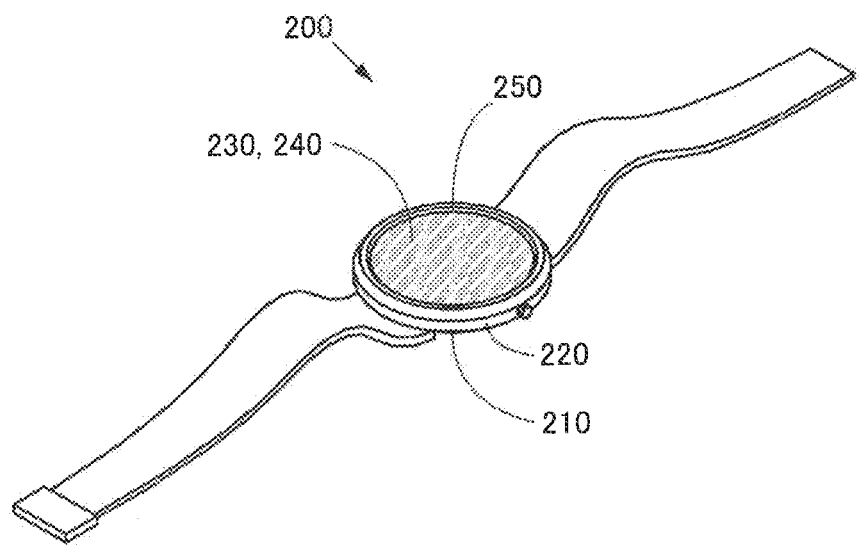

FIG. 12A is a block diagram illustrating a structure of an information processing device 200. FIG. 12B is a projection view illustrating an example of an external view of the information processing device 200.

Figure 13A:
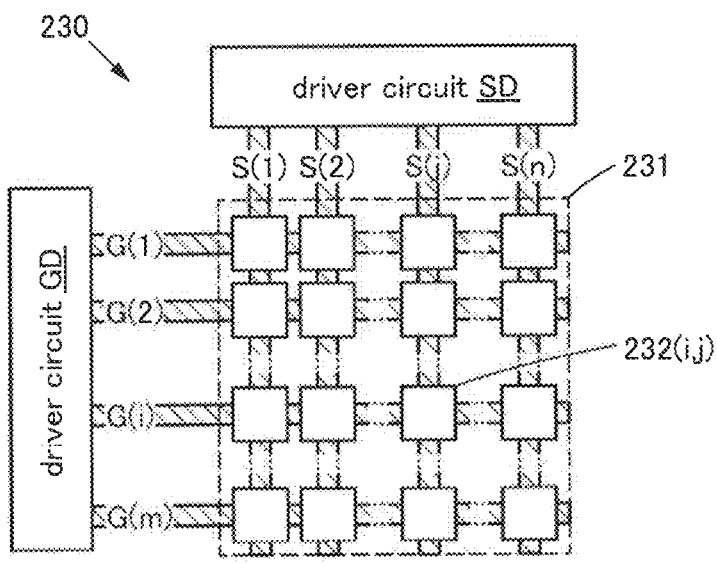
FIGS. 13A and 13B are block diagrams each illustrating a structure of a display portion of one embodiment and FIGS. 13C and 13D are each a circuit diagram illustrating a structure of a display portion of one embodiment.
Figure 13B:
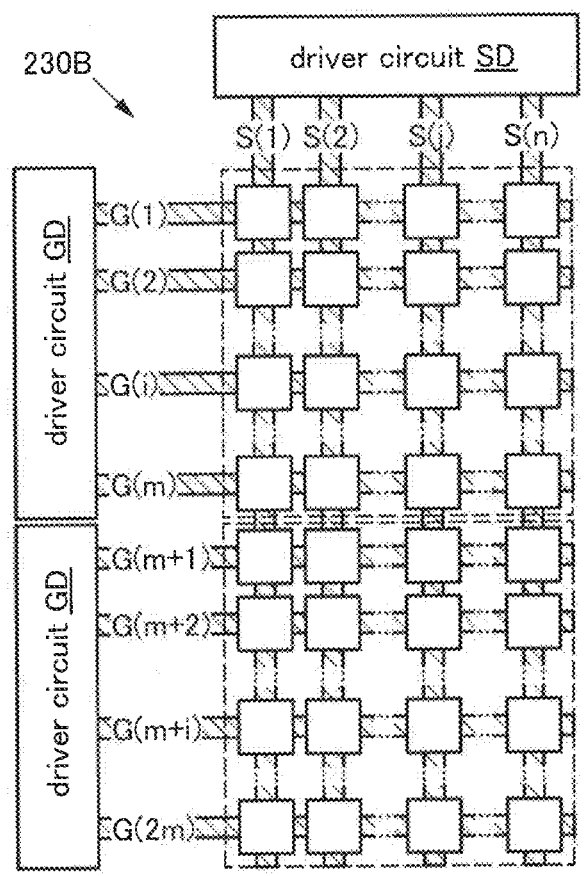
Figure 13C:
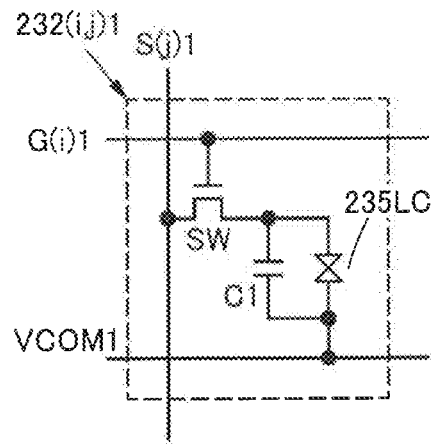
Figure 13D:
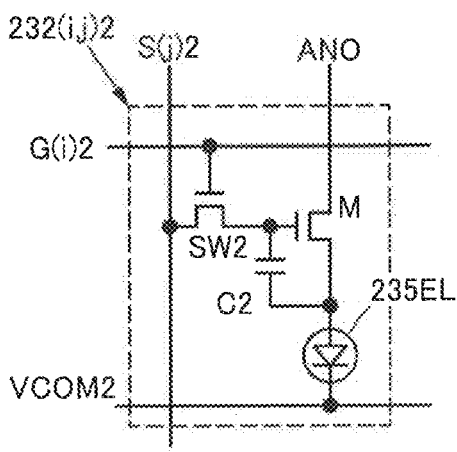

FIG. 13A is a block diagram illustrating a configuration of a display portion 230. FIG. 13B is a block diagram illustrating a configuration of a display portion 230B. FIGS. 13C and 13D are circuit diagrams each illustrating a configuration of a pixel 232(i, j).

<Configuration Example of Information Processing Device>

The information processing device 200 described in this embodiment includes an arithmetic device 210 and an input/output device 220 (see FIG. 12A).

The arithmetic device 210 is configured to receive positional information P1 and supply image information V and control information.

The input/output device 220 is configured to supply the positional information P1 and receive the image information V and the control information.

The input/output device 220 includes the display portion 230 that displays the image information V and an input portion 240 that supplies the positional information P1.

The display portion 230 includes a first display element and a second display element overlapping with the first display element. The display portion 230 further includes a first pixel circuit for driving the first display element and a second pixel circuit for driving the second display element.

The input portion 240 is configured to detect the position of a pointer and supply the positional information P1 determined in accordance with the position.

The arithmetic device 210 is configured to determine the moving speed of the pointer in accordance with the positional information P1.

The arithmetic device 210 is configured to determine the contrast or brightness of the image information V in accordance with the moving speed.

The information processing device 200 described in this embodiment includes the input/output device 220 that supplies the positional information P1 and receives the image information V and the arithmetic device 210 that receives the positional information P1 and supplies the image information V. The arithmetic device 210 is configured to determine the contrast or brightness of the image information V in accordance with the moving speed of the positional information P1.

With this structure, eyestrain on a user caused when the display position of image information is moved can be reduced, that is, eye-friendly display can be achieved. Moreover, the power consumption can be reduced and excellent visibility can be provided even in a bright place exposed to direct sunlight, for example. Thus, the novel information processing device that is highly convenient or reliable can be provided.

<Configuration>

The information processing device of one embodiment of the present invention includes the arithmetic device 210 or the input/output device 220.

<<Arithmetic Device 210>>

The arithmetic device 210 includes an arithmetic portion 211 and a memory portion 212. The arithmetic device 210 further includes a transmission path 214 and an input/output interface 215 (see FIG. 12A).

<<Arithmetic Portion 211>>

The arithmetic portion 211 is configured to, for example, execute a program. For example, a CPU described in Embodiment 6 can be used. In that case, power consumption can be sufficiently reduced.

<<Memory Portion 212>>

The memory portion 212 is configured to, for example, store the program executed by the arithmetic portion 211, initial information, setting information, an image, or the like.

Specifically, a hard disk, a flash memory, a memory including a transistor including an oxide semiconductor, or the like can be used for the memory portion 212.

<<Input/Output Interface 215, Transmission Path 214>>

The input/output interface 215 includes a terminal or a wiring and is configured to supply and receive information. For example, the input/output interface 215 can be electrically connected to the transmission path 214 and the input/output device 220.

The transmission path 214 includes a wiring and is configured to supply and receive information. For example, the transmission path 214 can be electrically connected to the input/output interface 215. In addition, the transmission path 214 can be electrically connected to the arithmetic portion 211 or the memory portion 212.

<<Input/Output Device 220>>

The input/output device 220 includes the display portion 230, the input portion 240, a sensor portion 250, or a communication portion 290.

<<Display Portion 230>>

The display portion 230 includes a display region 231, a driver circuit GD, and a driver circuit SD (see FIG. 13A). For example, the display panel described in Embodiment 1 can be used. In that case, power consumption can be reduced.

The display region 231 includes a plurality of pixels 232(i, 1) to 232 (i, n) arranged in the row direction, a plurality of pixels 232(1, j) to 232 (m, j) arranged in the column direction, a scan line G(i) electrically connected to the pixels 232(i, 1) to 232 (i, n), a signal line S(j) electrically connected to the pixels 232(1, j) to 232 (m, j), and a wiring VCOM. Note that i is an integer greater than or equal to 1 and less than or equal to m, j is an integer greater than or equal to 1 and less than or equal to n, and each of m and n is an integer greater than or equal to 1.

Note that the pixel 232(i, j) includes a portion 232(i, j)1 provided in the first display portion and a portion 232(i, j)2 provided in the second display portion (see FIGS. 13C and 13D). The portion 232(i, j)1 provided in the first display portion is electrically connected to a scan line G(i)1, a signal line S(j)1, and a wiring VCOM1. The portion 232(i, j)2 provided in the second display portion is electrically connected to a scan line G(i)2, a signal line S(j)2, a wiring VCOM2, and a wiring ANO. The scan line G(i) includes the scan line G(i)1 and the scan line G(i)2, and the signal line S(j) includes the signal line S(j)1 and the signal line S(j)2.

The display portion can include a plurality of driver circuits. For example, the display portion 230B can include a driver circuit GDA and a driver circuit GDB (see FIG. 13B).

<<Driver Circuit GD>>

The driver circuit GD is configured to supply a selection signal in accordance with the control information.

For example, the driver circuit GD is configured to supply a selection signal to one scan line at a frequency of 30 Hz or higher, preferably 60 Hz or higher, in accordance with the control information. Accordingly, moving images can be smoothly displayed.

For example, the driver circuit GD is configured to supply a selection signal to one scan line at a frequency of lower than 30 Hz, preferably lower than 1 Hz, more preferably less than once per minute, in accordance with the control information. Accordingly, a still image can be displayed while flickering is suppressed.

For example, in the case where a plurality of driver circuits is provided, the driver circuits GDA and GDB may supply the selection signals at different frequencies. Specifically, the selection signal can be supplied at a higher frequency to a region on which moving images are smoothly displayed than to a region on which a still image is displayed in a state where flickering is suppressed.

<<Driver Circuit SD>>

The driver circuit SD is configured to supply an image signal in accordance with the image information V.

<<Pixel 232(i,j)>>

The pixel 232(i, j) includes a first display element 235LC and a second display element 235EL overlapping with the first display element 235LC. The pixel 232(i, j) further includes the first pixel circuit for driving the first display element 235LC and the second pixel circuit for driving the second display element 235EL (see FIGS. 13C and 13D).

<<First Display Element 235LC>>

For example, a display element having a function of controlling light transmission can be used as the first display element 235LC. Specifically, a polarizing plate and a liquid crystal element, a MEMS shutter display element, or the like can be used.

Specifically, a liquid crystal element driven in any of the following driving modes can be used: an in-plane switching (IPS) mode, a twisted nematic (TN) mode, a fringe field switching (FFS) mode, an axially symmetric aligned microcell (ASM) mode, an optically compensated birefringence (OCB) mode, a ferroelectric liquid crystal (FLC) mode, an antiferroelectric liquid crystal (AFLC) mode, and the like.

In addition, a liquid crystal element that can be driven by, for example, a vertical alignment (VA) mode such as a multi-domain vertical alignment (MVA) mode, a patterned vertical alignment (PVA) mode, an electrically controlled birefringence (ECB) mode, a continuous pinwheel alignment (CPA) mode, or an advanced super view (ASV) mode can be used.

The first display element 235LC includes a first electrode, a second electrode, and a liquid crystal layer. The liquid crystal layer contains a liquid crystal material whose orientation is controlled by voltage applied between the first electrode and the second electrode. For example, the orientation of the liquid crystal material can be controlled by an electric field in the thickness direction (also referred to as the vertical direction), the horizontal direction, or the diagonal direction of the liquid crystal layer.

For example, thermotropic liquid crystal, low-molecular liquid crystal, high-molecular liquid crystal, polymer dispersed liquid crystal, ferroelectric liquid crystal, or antiferroelectric liquid crystal can be used. These liquid crystal materials exhibit a cholesteric phase, a smectic phase, a cubic phase, a chiral nematic phase, an isotropic phase, or the like depending on conditions. Alternatively, a liquid crystal material which exhibits a blue phase can be used.

<<Second Display Element 235EL>>

A display element having a function of emitting light can be used as the second display element 235EL, for example. Specifically, an organic EL element can be used as the second display element 235EL.

More specifically, an organic EL element which emits white light can be used as the second display element 235EL. Alternatively, an organic EL element which emits blue light, green light, or red light can be used as the second display element 235EL.

<<Pixel Circuit>>

The configuration of the pixel circuit can be designed according to the display element.

For example, a driver circuit which is electrically connected to the scan line G(i)1, the signal line S(j)1, and the wiring VCOM1 and drives a liquid crystal element is described (see FIG. 13C).

A switch, the capacitor C1, and the like can be used in the pixel circuit. Alternatively, for example, a transistor, a diode, a resistor, or an inductor can be used in the pixel circuit.

For example, a plurality of transistors can be used as a switch. Alternatively, a plurality of transistors connected in parallel, in series, or in combination of parallel connection and series connection can be used as a switch.

For example, a capacitor may be formed by the first electrode of the first display element 235LC and a conductive film having a region overlapping with the first electrode.

For example, the pixel circuit includes a transistor SW functioning as a switch, the first display element 235LC, and the capacitor C1. A gate electrode of the transistor SW is electrically connected to the scan line G(i)1, and a first electrode of the transistor SW is electrically connected to the signal line S(j)1. The first electrode of the first display element 235LC is electrically connected to a second electrode of the transistor SW, and a second electrode of the first display element 235LC is electrically connected to the wiring VCOM1. A first electrode of the capacitor C1 is electrically connected to the second electrode of the transistor SW, and a second electrode of the capacitor C1 is electrically connected to the wiring VCOM1.

Here, for example, a driver circuit which is electrically connected to the scan line G(i)2, the signal line S(j)2, the wiring VCOM2, and the wiring ANO and drives an organic EL element is described (see FIG. 13D).

For example, the pixel circuit includes a transistor SW2 functioning as a switch, a capacitor C2, a transistor M, and the second display element 235EL. A gate electrode of the transistor SW2 is electrically connected to the scan line G(i)2, and a first electrode of the transistor SW2 is electrically connected to the signal line S(j)2. A first electrode of the capacitor C2 is electrically connected to a second electrode of the transistor SW2, and a second electrode of the capacitor C2 is electrically connected to the wiring ANO. A gate electrode of the transistor M is electrically connected to the transistor SW2, and a first electrode of the transistor M is electrically connected to the wiring ANO. A first electrode of the second display element 235EL is electrically connected to a second electrode of the transistor M, and a second electrode of the second display element 235EL is electrically connected to the wiring VCOM2 (see FIG. 13D).

<<Transistor>>

For example, semiconductor films formed at the same step can be used for transistors in the driver circuit and the pixel circuit.

As the transistors in the driver circuit and the pixel circuit, bottom-gate transistors, top-gate transistors, or the like can be used.

A manufacturing line for a bottom-gate transistor including amorphous silicon as a semiconductor can be easily remodeled into a manufacturing line for a bottom-gate transistor including an oxide semiconductor as a semiconductor, for example. Furthermore, for example, a manufacturing line for a top-gate transistor including polysilicon as a semiconductor can be easily remodeled into a manufacturing line for a top-gate transistor including an oxide semiconductor as a semiconductor.

For example, a transistor including a semiconductor containing an element of Group 4 can be used. Specifically, a semiconductor containing silicon can be used for a semiconductor film. For example, single crystal silicon, polysilicon, microcrystalline silicon, or amorphous silicon can be used for the semiconductor film of the transistor.

Note that the temperature for forming a transistor using polysilicon in a semiconductor film is lower than the temperature for forming a transistor using single crystal silicon in a semiconductor film.

In addition, the transistor using polysilicon in a semiconductor film has higher field-effect mobility than the transistor using amorphous silicon in a semiconductor film, and therefore a pixel including the transistor using polysilicon can have a high aperture ratio. Moreover, pixels arranged at high resolution, a gate driver circuit, and a source driver circuit can be formed over the same substrate. As a result, the number of components included in an electronic device can be reduced.

In addition, the transistor using polysilicon in a semiconductor film has higher reliability than the transistor using amorphous silicon in a semiconductor film For example, a transistor including an oxide semiconductor can be used. Specifically, an oxide semiconductor containing indium or an oxide semiconductor containing indium, gallium, and zinc can be used for a semiconductor film.

For example, a transistor having a lower leakage current in an off state than a transistor that uses amorphous silicon for a semiconductor film can be used. Specifically, a transistor that uses an oxide semiconductor for a semiconductor film can be used.

A pixel circuit in the transistor that uses an oxide semiconductor for the semiconductor film can hold an image signal for a longer time than a pixel circuit in a transistor that uses amorphous silicon for a semiconductor film. Specifically, the selection signal can be supplied at a frequency of lower than 30 Hz, preferably lower than 1 Hz, more preferably less than once per minute while flickering is suppressed. Consequently, eyestrain on a user of the information processing device can be reduced, and power consumption for driving can be reduced.

Alternatively, for example, a transistor including a compound semiconductor can be used. Specifically, a semiconductor containing gallium arsenide can be used for a semiconductor film.

For example, a transistor including an organic semiconductor can be used.

Specifically, an organic semiconductor containing any of polyacenes and graphene can be used for the semiconductor film.

<<Input Portion 240>>

A variety of human interfaces or the like can be used as the input portion 240 (see FIG. 12A).

For example, a keyboard, a mouse, a touch sensor, a microphone, a camera, or the like can be used as the input portion 240. Note that a touch sensor having a region overlapping with the display portion 230 can also be used. An input/output device that includes the display portion 230 and the touch sensor having a region overlapping with the display portion 230 can be referred to as a touch panel.

For example, a user can make various gestures (e.g., tap, drag, swipe, and pinch in) using his/her finger as a pointer on the touch panel.

The arithmetic device 210, for example, analyzes information on the position, track, or the like of the finger on the touch panel and determines that a specific gesture is supplied when the analysis results meet predetermined conditions. Therefore, the user can supply a certain operation instruction associated with a certain gesture by using the gesture.

For instance, the user can supply a "scrolling instruction" for changing a portion where image information is displayed by using a gesture of touching and moving his/her finger on the touch panel.

<<Sensor Portion 250>>

The sensor portion 250 is configured to acquire information P2 by detecting the surrounding state.

For example, a camera, an acceleration sensor, a direction sensor, a pressure sensor, a temperature sensor, a humidity sensor, an illuminance sensor, or a global positioning system (GPS) signal receiving circuit can be used as the sensor portion 250.

For example, in the case where the arithmetic device 210 determines that the surrounding brightness sensed by an illuminance sensor of the sensor portion 250 is sufficiently higher than predetermined brightness, image information is displayed on the first display portion. In the case where the arithmetic device 210 determines that the surrounding brightness is low, image information is displayed on the second display portion. Alternatively, image information is displayed on the first display portion and the second display portion.

Specifically, in the case where the arithmetic device 210 determines that the surrounding brightness is sufficiently high, an image is displayed with a reflective liquid crystal element, and in the case where the arithmetic device 210 determines that the surrounding brightness is low, an image is displayed with an organic EL element.

Thus, image information can be displayed in such a manner that, for example, a reflective display element is used in an environment with strong external light and a self-luminous display element is used in a dim environment. As a result, a novel information processing device that has low power consumption and is highly convenient or reliable can be provided.

<<Communication Portion 290>>

The communication portion 290 is configured to supply and acquire information to/from a network.

<<Program>>

A program of one embodiment of the present invention will be described with reference to FIGS. 14A and 14B and FIG. 15.

Figure 14A:
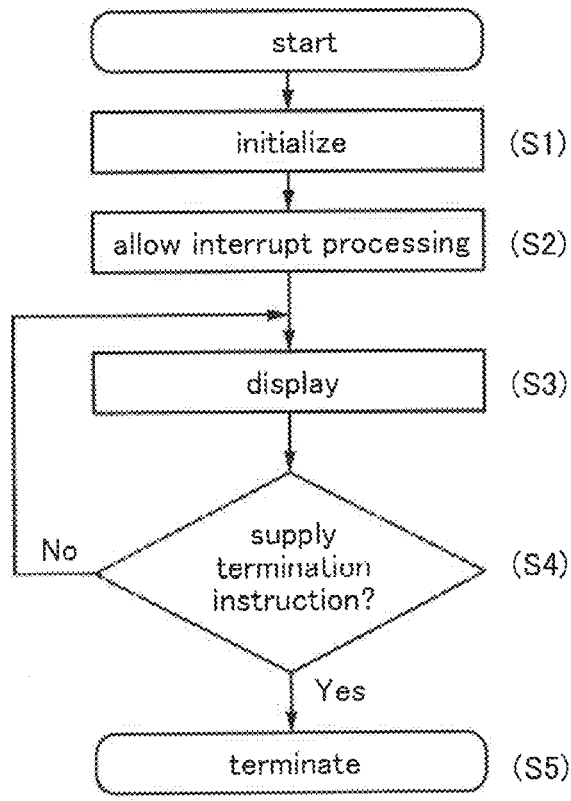
FIGS. 14A and 14B are flow charts each illustrating a program of one embodiment.
Figure 14B:
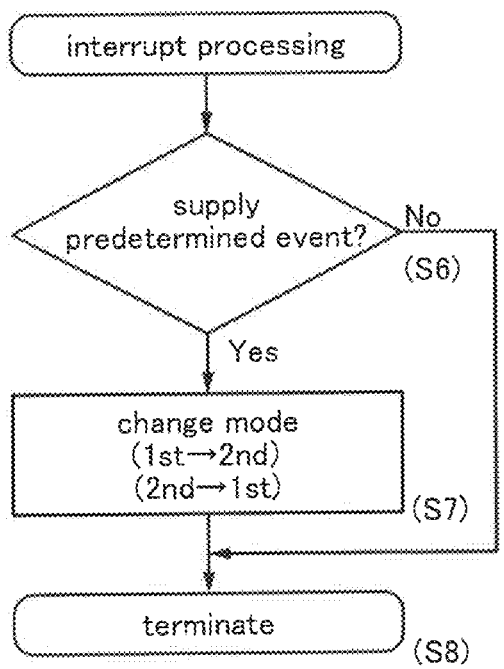

FIG. 14A is a flow chart showing main processing of the program of one embodiment of the present invention, and FIG. 14B is a flow chart showing interrupt processing.

Figure 15:
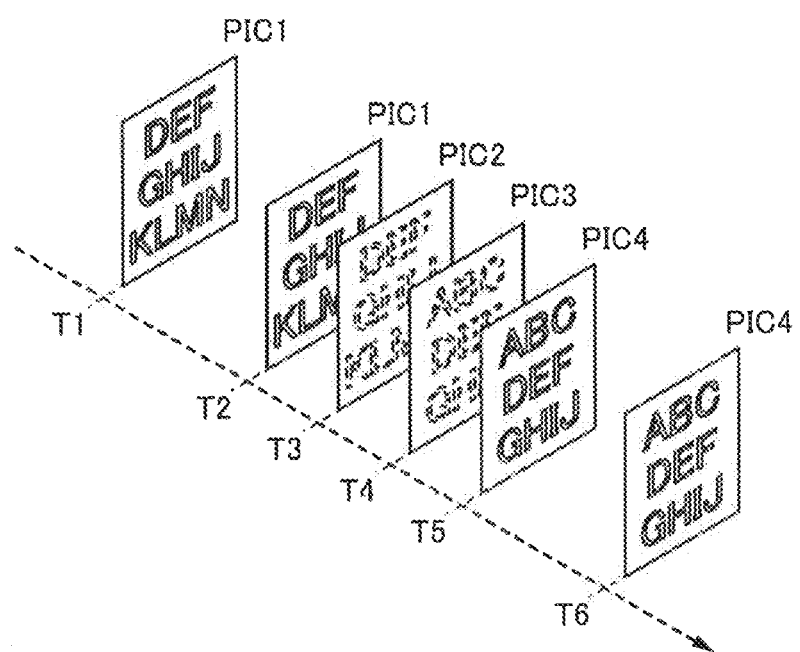
FIG. 15 is a schematic diagram illustrating image information of one embodiment.

FIG. 15 schematically illustrates a method for displaying image information on the display portion 230.

The program of one embodiment of the present invention has the following steps (see FIG. 14A).

In a first step, setting is initialized (see (S1) in FIG. 14A).

For instance, predetermined image information and the second mode can be used for the initialization.

For example, a still image can be used as the predetermined image information.

Alternatively, a mode in which the selection signal is supplied at a frequency of lower than 30 Hz, preferably lower than 1 Hz, more preferably less than once per minute can be used as the second mode. For example, in the case where the time is displayed on the information processing device on the second time scale, a mode in which the selection signal is supplied at a frequency of 1 Hz can be used as the second mode. In the case where the time is displayed on the information processing device on the minute time scale, a mode in which the selection signal is supplied once per minute can be used as the second mode.

In a second step, interrupt processing is allowed (see S2 in FIG. 14A). Note that an arithmetic device allowed to execute the interrupt processing can perform the interrupt processing in parallel with the main processing. The arithmetic device which has returned from the interrupt processing to the main processing can reflect the results of the interrupt processing in the main processing.

The arithmetic device may execute the interrupt processing when a counter has an initial value, and the counter may be set at a value other than the initial value when the arithmetic device returns from the interrupt processing. Thus, the interrupt processing is ready to be executed after the program is started up.

In a third step, image information is displayed in a mode selected in the first step or the interrupt processing (see S3 in FIG. 14A).

For instance, predetermined image information is displayed in the second mode, in accordance with the initialization.

Specifically, the predetermined image information is displayed in a mode in which the selection signal is supplied to one scan line at a frequency of lower than 30 Hz, preferably lower than 1 Hz, more preferably less than once per minute.

For example, the selection signal is supplied at Time T1 so that first image information PIC1 is displayed on the display portion 230 (see FIG. 15). At Time T2, which is, for example, one second after Time T1, the selection signal is supplied so that the predetermined image information is displayed.

Alternatively, in the case where a predetermined event is not supplied in the interrupt processing, image information is displayed in the second mode.

For example, the selection signal is supplied at Time T5 so that fourth image information PIC4 is displayed on the display portion 230. At Time T6, which is, for example, one second after Time T5, the selection signal is supplied so that the same image information is displayed. Note that the length of a period from Time T5 to Time T6 can be equal to that of a period from Time T1 to Time T2.

For instance, in the case where the predetermined event is supplied in the interrupt processing, predetermined image information is displayed in the first mode.

Specifically, in the case where an event associated with a "page turning instruction" is supplied in the interrupt processing, image information is switched from one to another in a mode in which the selection signal is supplied to one scan line at a frequency of 30 Hz or higher, preferably 60 Hz or higher.

Alternatively, in the case where an event associated with the "scrolling instruction" is supplied in the interrupt processing, second image information PIC2, which includes part of the displayed first image information PIC1 and the following part, is displayed in a mode in which the selection signal is supplied to one scan line at a frequency of 30 Hz or higher, preferably 60 Hz or higher.

Thus, a moving image can be displayed smoothly by switching images in accordance with the "page tuning instruction," for example. Alternatively, a moving image in which an image is gradually moved in accordance with the "scrolling instruction" can be displayed smoothly.

Specifically, the selection signal is supplied at Time T3 after the event associated with the "scrolling instruction" is supplied so that the second image information PIC2 whose display position and the like are changed from those of the first image information PIC1 is displayed (see FIG. 15). The selection signal is supplied at Time T4 so that third image information PIC3 whose display position and the like are changed from those of the second image information PIC2 is displayed. Note that each of a period from Time T2 to Time T3, a period from Time T3 to Time T4, and a period from Time T4 to Time T5 is shorter than the period from Time T1 to Time T2.

In the fourth step, the program moves to the fifth step when a termination instruction is supplied, and the program moves to the third step when the termination instruction is not supplied (see S4 in FIG. 14A).

Note that in the interrupt processing, for example, the termination instruction can be supplied.

In the fifth step, the program terminates (see S5 in FIG. 14A).

The interrupt processing includes sixth to eighth steps described below (see FIG. 14B).

In the sixth step, the processing proceeds to the seventh step when a predetermined event has been supplied, whereas the processing proceeds to the eighth step when the predetermined event has not been supplied (see S6 in FIG. 14B).

For example, whether the predetermined event is supplied in a predetermined period or not can be a branch condition. Specifically, the predetermined period can be longer than 0 seconds and shorter than or equal to 5 seconds, preferably shorter than or equal to 1 second, further preferably shorter than or equal to 0.5 seconds, still further preferably shorter than or equal to 0.1 seconds.

For example, the predetermined event can include an event associated with the termination instruction.

In the seventh step, the mode is changed (see S7 in FIG. 14B). Specifically, the mode is changed to the second mode when the first mode has been selected, or the mode is changed to the first mode when the second mode has been selected.

In the eighth step, the interrupt processing terminates (see S8 in FIG. 14B).

<<Predetermined Event>>

A variety of instructions can be associated with a variety of events.

The following instructions can be given as examples: "page-turning instruction" for switching displayed image information from one to another and "scroll instruction" for moving the display position of part of image information and displaying another part continuing from that part.

For example, the following events can be used: events supplied using a pointing device such as a mouse (e.g., "click" and "drag") and events supplied to a touch panel with a finger or the like used as a pointer (e.g., "tap", "drag", and "swipe").

For example, the position of a slide bar pointed by a pointer, the swipe speed, and the drag speed can be used as arguments assigned to an instruction associated with the predetermined event.

Specifically, a parameter that determines the page-turning speed or the like can be used to execute the "page-turning instruction," and a parameter that determines the moving speed of the display position or the like can be used to execute the "scroll instruction."

For example, the display brightness, contrast, or saturation may be changed in accordance with the page-turning speed and/or the scroll speed.

Specifically, in the case where the page-turning speed and/or the scroll speed are/is higher than the predetermined speed, the display brightness may be decreased in synchronization with the speed.

Alternatively, in the case where the page-turning speed and/or the scroll speed are/is higher than the predetermined speed, the contrast may be decreased in synchronization with the speed.

For example, the speed at which user's eyes cannot follow displayed images can be used as the predetermined speed.

The contrast can be reduced in such a manner that the gray level of a bright region (with a high gray level) included in image information is brought close to the gray level of a dark region (with a low gray level) included in the image information.

Alternatively, the contrast can be reduced in such a manner that the gray level of the dark region included in image information is brought close to the gray level of the bright region included in the image information.

Specifically, in the case where the page-turning speed and/or the scroll speed are/is higher than the predetermined speed, display may be performed such that the yellow tone is increased or the blue tone is decreased in synchronization with the speed.

Image information may be generated on the basis of information of the usage environment of the information processing device acquired by the sensor portion 250. For example, from colors selected by a user, one can be selected in accordance with the acquired ambient brightness or the like to be used as the background color of the image information (see FIG. 12B).

Thus, favorable environment can be provided for a user of the information processing device 200.

This embodiment can be combined with any of the other embodiments in this specification as appropriate.

Embodiment 6

In this embodiment, a semiconductor device (memory device) that can retain stored data even when not powered and that has an unlimited number of write cycles, and a CPU including the semiconductor device will be described. The CPU described in this embodiment can be used for the information processing device described in Embodiment 5, for example.

<Memory Device>

Figure 16A:
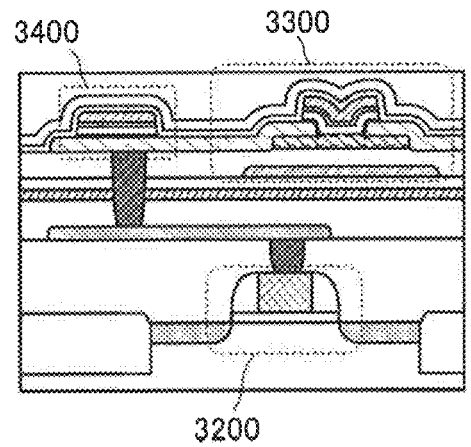
FIG. 16A is a cross-sectional view and FIGS. 16B and 16C are circuit diagrams each illustrating a structure of a semiconductor device of one embodiment.
Figure 16B:
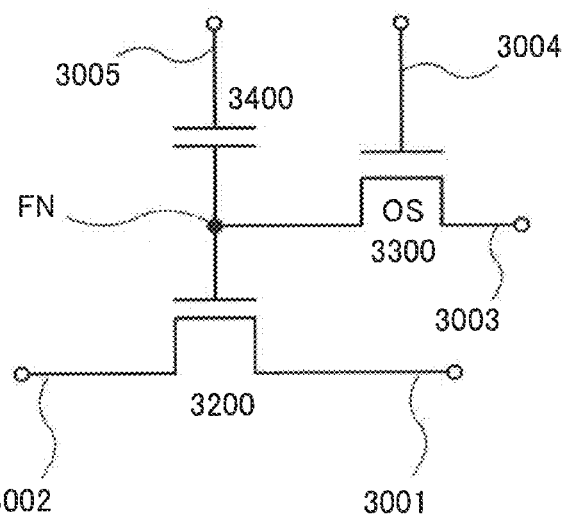
Figure 16C:
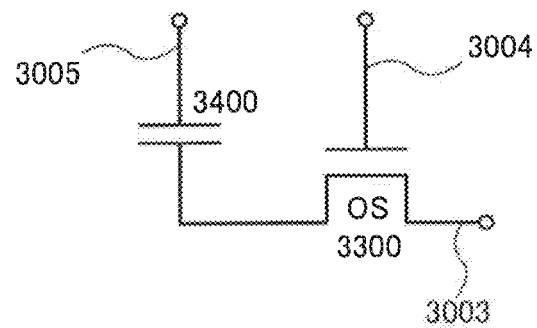

An example of a semiconductor device (memory device) which can retain stored data even when not powered and which has an unlimited number of write cycles is shown in FIGS. 16A to 16C. Note that FIG. 16B is a circuit diagram of the structure in FIG. 16A.

The semiconductor device illustrated in FIGS. 16A and 16B includes a transistor 3200 using a first semiconductor material, a transistor 3300 using a second semiconductor material, and a capacitor 3400.

The first and second semiconductor materials preferably have different energy gaps. For example, the first semiconductor material can be a semiconductor material other than an oxide semiconductor (examples of such a semiconductor material include silicon (including strained silicon), germanium, silicon germanium, silicon carbide, gallium arsenide, aluminum gallium arsenide, indium phosphide, gallium nitride, and an organic semiconductor), and the second semiconductor material can be an oxide semiconductor. A transistor using a material other than an oxide semiconductor, such as single crystal silicon, can operate at high speed easily. On the other hand, a transistor including an oxide semiconductor has a low off-state current.

The transistor 3300 is a transistor in which a channel is formed in a semiconductor layer including an oxide semiconductor. Since the off-state current of the transistor 3300 is small, stored data can be retained for a long period. In other words, power consumption can be sufficiently reduced because a semiconductor memory device in which refresh operation is unnecessary or the frequency of refresh operation is extremely low can be provided.

In FIG. 16B, a first wiring 3001 is electrically connected to a source electrode of the transistor 3200. A second wiring 3002 is electrically connected to a drain electrode of the transistor 3200. A third wiring 3003 is electrically connected to one of a source electrode and a drain electrode of the transistor 3300. A fourth wiring 3004 is electrically connected to a gate electrode of the transistor 3300. A gate electrode of the transistor 3200 and the other of the source electrode and the drain electrode of the transistor 3300 are electrically connected to one electrode of the capacitor 3400. A fifth wiring 3005 is electrically connected to the other electrode of the capacitor 3400.

The semiconductor device in FIG. 16A has a feature that the potential of the gate electrode of the transistor 3200 can be retained, and thus enables writing, retaining, and reading of data as follows.

Writing and retaining of data are described. First, the potential of the fourth wiring 3004 is set to a potential at which the transistor 3300 is turned on, so that the transistor 3300 is turned on. Accordingly, the potential of the third wiring 3003 is supplied to the gate electrode of the transistor 3200 and the capacitor 3400. That is, a predetermined charge is supplied to the gate electrode of the transistor 3200 (writing). Here, one of two kinds of charges providing different potential levels (hereinafter referred to as a low-level charge and a high-level charge) is supplied. After that, the potential of the fourth wiring 3004 is set to a potential at which the transistor 3300 is turned off, so that the transistor 3300 is turned off. Thus, the charge supplied to the gate electrode of the transistor 3200 is held (retaining).

Since the off-state current of the transistor 3300 is extremely small, the charge of the gate electrode of the transistor 3200 is retained for a long time.

Next, reading of data is described. An appropriate potential (a reading potential) is supplied to the fifth wiring 3005 while a predetermined potential (a constant potential) is supplied to the first wiring 3001, whereby the potential of the second wiring 3002 varies depending on the amount of charge retained in the gate electrode of the transistor 3200. This is because in the case of using an n-channel transistor as the transistor 3200, an apparent threshold voltage $V_{th\_H}$ at the time when the high-level charge is given to the gate electrode of the transistor 3200 is lower than an apparent threshold voltage $V_{th\_L}$ at the time when the low-level charge is given to the gate electrode of the transistor 3200. Here, an apparent threshold voltage refers to the potential of the fifth wiring 3005 which is needed to turn on the transistor 3200. Thus, the potential of the fifth wiring 3005 is set to a potential $V_0$ which is between $V_{th\_H}$ and $V_{th\_L}$, whereby charge supplied to the gate electrode of the transistor 3200 can be determined. For example, in the case where the high-level charge is supplied to the gate electrode of the transistor 3200 in writing and the potential of the fifth wiring 3005 is $V_0$ ($>V_{th\_H}$), the transistor 3200 is turned on. On the other hand, in the case where the low-level charge is supplied to the gate electrode of the transistor 3200 in writing, even when the potential of the fifth wiring 3005 is $V_0$ ($<V_{th\_L}$), the transistor 3200 remains off. Thus, the data retained in the gate electrode of the transistor 3200 can be read by determining the potential of the second wiring 3002.

Note that in the case where memory cells are arrayed, it is necessary that data of a desired memory cell is read. For example, the fifth wiring 3005 of memory cells from which data is not read may be supplied with a potential at which the transistor 3200 is turned off regardless of the potential supplied to the gate electrode, that is, a potential lower than $V_{th\_H}$, whereby only data of a desired memory cell can be read. Alternatively, the fifth wiring 3005 of the memory cells from which data is not read may be supplied with a potential at which the transistor 3200 is turned on regardless of the potential supplied to the gate electrode, that is, a potential higher than $V_{th\_L}$, whereby only data of a desired memory cell can be read.

The semiconductor device illustrated in FIG. 16C is different from the semiconductor device illustrated in FIG. 16A in that the transistor 3200 is not provided. Also in this case, writing and retaining operation of data can be performed in a manner similar to the semiconductor device illustrated in FIG. 16A.

Next, reading of data of the semiconductor device illustrated in FIG. 16C is described. When the transistor 3300 is turned on, the third wiring 3003 which is in a floating state and the capacitor 3400 are electrically connected to each other, and the charge is redistributed between the third wiring 3003 and the capacitor 3400. As a result, the potential of the third wiring 3003 is changed. The amount of change in the potential of the third wiring 3003 varies depending on the potential of the one electrode of the capacitor 3400 (or the charge accumulated in the capacitor 3400).

For example, the potential of the third wiring 3003 after the charge redistribution is $(C_B \times V_{B0} + C \times V)/(C_B + C)$, where V is the potential of the one electrode of the capacitor 3400, C is the capacitance of the capacitor 3400, $C_B$ is the capacitance component of the third wiring 3003, and $V_{B0}$ is the potential of the third wiring 3003 before the charge redistribution. Thus, it can be found that, assuming that the memory cell is in either of two states in which the potential of the one electrode of the capacitor 3400 is $V_1$ and $V_0$ ($V_1 > V_0$), the potential of the third wiring 3003 in the case of retaining the potential $V_1$ ($=(C_B \times V_{B0} + C \times V_1)/(C_B + C)$) is higher than the potential of the third wiring 3003 in the case of retaining the potential $V_0$ ($=(C_B \times V_{B0} + C \times V_0)/(C_B + C)$).

Then, by comparing the potential of the third wiring 3003 with a predetermined potential, data can be read.

In this case, a transistor including the first semiconductor material may be used for a driver circuit for driving a memory cell, and a transistor including the second semiconductor material may be stacked over the driver circuit as the transistor 3300.

When including a transistor in which a channel formation region is formed using an oxide semiconductor and which has an extremely small off-state current, the semiconductor device described in this embodiment can retain stored data for an extremely long time. In other words, refresh operation becomes unnecessary or the frequency of the refresh operation can be extremely low, which leads to a sufficient reduction in power consumption. Moreover, stored data can be retained for a long time even when power is not supplied (note that a potential is preferably fixed).

Furthermore, in the semiconductor device described in this embodiment, high voltage is not needed for writing data and there is no problem of deterioration of elements. Unlike in a conventional nonvolatile memory, for example, it is not necessary to inject and extract electrons into and from a floating gate; thus, a problem such as deterioration of a gate insulating film is not caused. That is, the semiconductor device described in this embodiment does not have a limit on the number of times data can be rewritten, which is a problem of a conventional nonvolatile memory, and the reliability thereof is drastically improved. Furthermore, data is written depending on the state of the transistor (on or off), whereby high-speed operation can be easily achieved.

The above memory device can also be used in an LSI such as a digital signal processor (DSP), a custom LSI, or a programmable logic device (PLD), and a radio frequency identification (RF-ID), in addition to a central processing unit (CPU), for example.

<CPU>

A CPU including the above memory device is described below.

Figure 17:
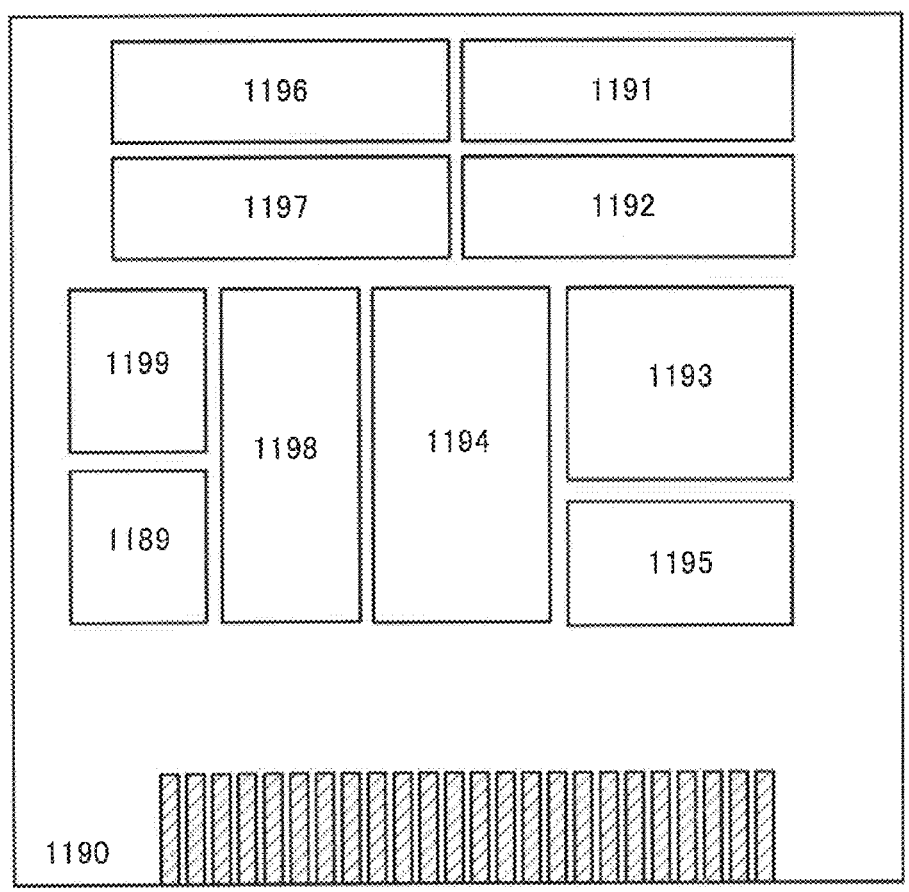
FIG. 17 is a block diagram illustrating a structure of a CPU of one embodiment.

FIG. 17 is a block diagram illustrating a configuration example of the CPU including the above memory device.

The CPU illustrated in FIG. 17 includes, over a substrate 1190, an arithmetic logic unit (ALU) 1191, an ALU controller 1192, an instruction decoder 1193, an interrupt controller 1194, a timing controller 1195, a register 1196, a register controller 1197, a bus interface (BUS I/F) 1198, a rewritable ROM 1199, and a ROM interface (ROM I/F) 1189. A semiconductor substrate, an SOI substrate, a glass substrate, or the like is used as the substrate 1190. The ROM 1199 and the ROM interface 1189 may be provided over a separate chip. Needless to say, the CPU in FIG. 17 is just an example in which the configuration is simplified, and an actual CPU may have a variety of configurations depending on the application. For example, the CPU may have the following configuration: a structure including the CPU illustrated in FIG. 17 or an arithmetic circuit is considered as one core; a plurality of the cores are included; and the cores operate in parallel. The number of bits that the CPU can process in an internal arithmetic circuit or in a data bus can be, for example, 8, 16, 32, or 64.

An instruction that is input to the CPU through the bus interface 1198 is input to the instruction decoder 1193 and decoded therein, and then, input to the ALU controller 1192, the interrupt controller 1194, the register controller 1197, and the timing controller 1195.

The ALU controller 1192, the interrupt controller 1194, the register controller 1197, and the timing controller 1195 conduct various controls in accordance with the decoded instruction. Specifically, the ALU controller 1192 generates signals for controlling the operation of the ALU 1191. While the CPU is executing a program, the interrupt controller 1194 processes an interrupt request from an external input/ output device or a peripheral circuit depending on its priority or a mask state. The register controller 1197 generates an address of the register 1196, and reads/writes data from/to the register 1196 depending on the state of the CPU.

The timing controller 1195 generates signals for controlling operation timings of the ALU 1191, the ALU controller 1192, the instruction decoder 1193, the interrupt controller 1194, and the register controller 1197. For example, the timing controller 1195 includes an internal clock generator for generating an internal clock signal CLK2 on the basis of a reference clock signal CLK1, and supplies the internal clock signal CLK2 to the above circuits.

In the CPU illustrated in FIG. 17, a memory cell is provided in the register 1196.

In the CPU illustrated in FIG. 17, the register controller 1197 selects operation of retaining data in the register 1196 in accordance with an instruction from the ALU 1191. That is, the register controller 1197 selects whether data is retained by a flip-flop or by a capacitor in the memory cell included in the register 1196. When data retaining by the flip-flop is selected, a power supply voltage is supplied to the memory cell in the register 1196. When data retaining by the capacitor is selected, the data is rewritten in the capacitor, and supply of the power supply voltage to the memory cell in the register 1196 can be stopped.

Figure 18:
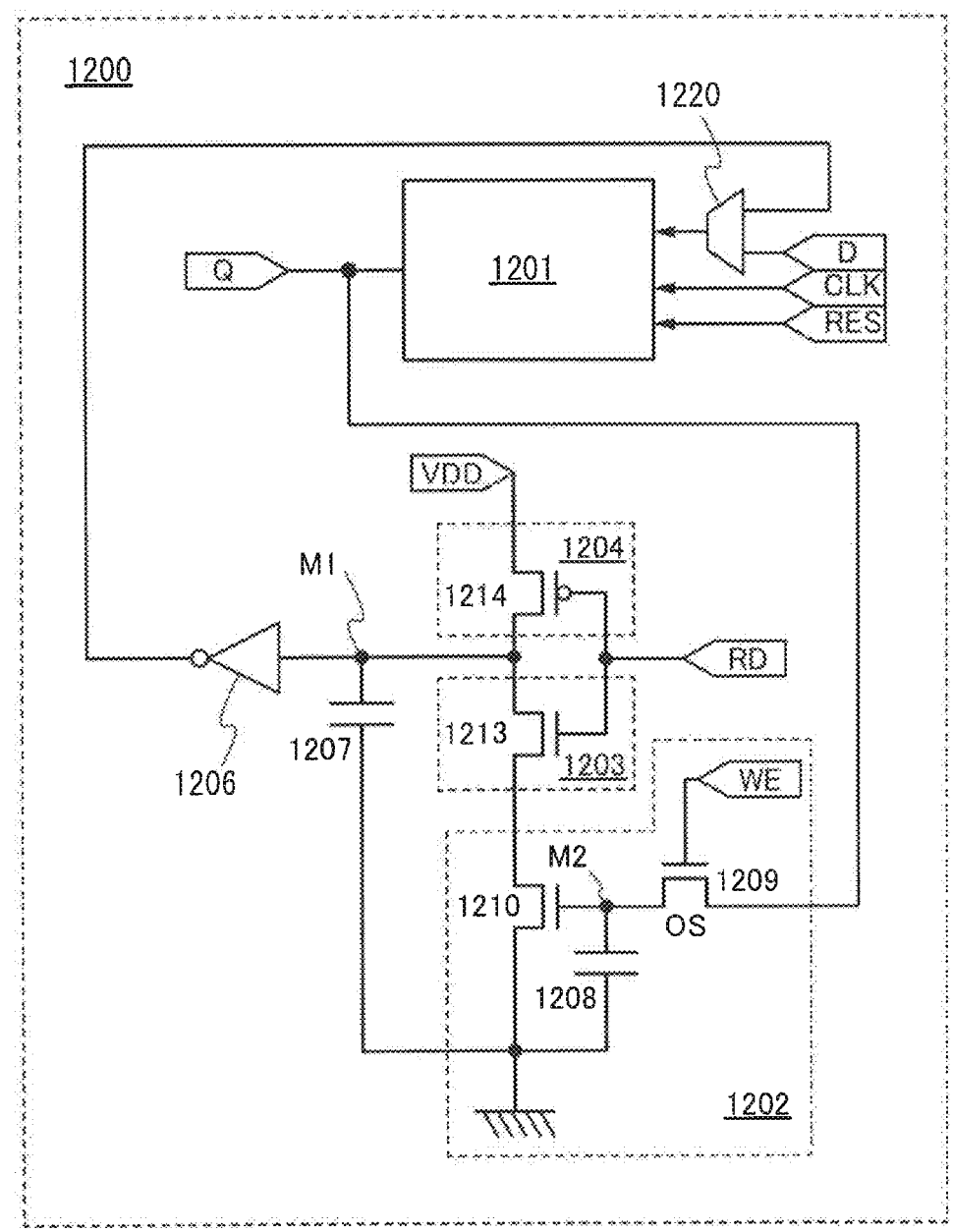
FIG. 18 is a circuit diagram illustrating a structure of a memory element of one embodiment.

FIG. 18 is an example of a circuit diagram of a memory element that can be used for the register 1196. A memory element 1200 includes a circuit 1201 in which stored data is volatile when power supply is stopped, a circuit 1202 in which stored data is nonvolatile even when power supply is stopped, a switch 1203, a switch 1204, a logic element 1206, a capacitor 1207, and a circuit 1220 having a selecting function. The circuit 1202 includes a capacitor 1208, a transistor 1209, and a transistor 1210. Note that the memory element 1200 may further include another element such as a diode, a resistor, or an inductor, as needed.

Here, the above-described memory device can be used as the circuit 1202. When supply of a power supply voltage to the memory element 1200 is stopped, a ground potential (0 V) or a potential at which the transistor 1209 in the circuit 1202 is turned off continues to be input to a gate of the transistor 1209. For example, the gate of the transistor 1209 is grounded through a load such as a resistor.

Shown here is an example in which the switch 1203 is a transistor 1213 having one conductivity type (e.g., an n-channel transistor) and the switch 1204 is a transistor 1214 having a conductivity type opposite to the one conductivity type (e.g., a p-channel transistor). A first terminal of the switch 1203 corresponds to one of a source and a drain of the transistor 1213, a second terminal of the switch 1203 corresponds to the other of the source and the drain of the transistor 1213, and conduction or non-conduction between the first terminal and the second terminal of the switch 1203 (i.e., the on/off state of the transistor 1213) is selected by a control signal RD input to a gate of the transistor 1213. A first terminal of the switch 1204 corresponds to one of a source and a drain of the transistor 1214, a second terminal of the switch 1204 corresponds to the other of the source and the drain of the transistor 1214, and conduction or non-conduction between the first terminal and the second terminal of the switch 1204 (i.e., the on/off state of the transistor 1214) is selected by the control signal RD input to a gate of the transistor 1214.

One of a source and a drain of the transistor 1209 is electrically connected to one of a pair of electrodes of the capacitor 1208 and a gate of the transistor 1210. Here, the connection portion is referred to as a node M2. One of a source and a drain of the transistor 1210 is electrically connected to a wiring that can supply a low power supply potential (e.g., a GND line), and the other thereof is electrically connected to the first terminal of the switch 1203 (the one of the source and the drain of the transistor 1213). The second terminal of the switch 1203 (the other of the source and the drain of the transistor 1213) is electrically connected to the first terminal of the switch 1204 (the one of the source and the drain of the transistor 1214). The second terminal of the switch 1204 (the other of the source and the drain of the transistor 1214) is electrically connected to a wiring that can supply a power supply potential VDD. The second terminal of the switch 1203 (the other of the source and the drain of the transistor 1213), the first terminal of the switch 1204 (the one of the source and the drain of the transistor 1214), an input terminal of the logic element 1206, and one of a pair of electrodes of the capacitor 1207 are electrically connected to each other. Here, the connection portion is referred to as a node M1. The other of the pair of electrodes of the capacitor 1207 can be supplied with a constant potential. For example, the other of the pair of electrodes of the capacitor 1207 can be supplied with a low power supply potential (e.g., GND) or a high power supply potential (e.g., VDD). The other of the pair of electrodes of the capacitor 1207 is electrically connected to the wiring that can supply a low power supply potential (e.g., a GND line). The other of the pair of electrodes of the capacitor 1208 can be supplied with a constant potential. For example, the other of the pair of electrodes of the capacitor 1208 can be supplied with a low power supply potential (e.g., GND) or a high power supply potential (e.g., VDD). The other of the pair of electrodes of the capacitor 1208 is electrically connected to the wiring that can supply a low power supply potential (e.g., a GND line).

The capacitor 1207 and the capacitor 1208 are not necessarily provided as long as the parasitic capacitance of the transistor, the wiring, or the like is actively utilized.

A control signal WE is input to the first gate (first gate electrode) of the transistor 1209. As for each of the switch 1203 and the switch 1204, a conduction state or a non-conduction state between the first terminal and the second terminal is selected by the control signal RD that is different from the control signal WE. When the first terminal and the second terminal of one of the switches are in the conduction state, the first terminal and the second terminal of the other of the switches are in the non-conduction state.

A signal corresponding to data retained in the circuit 1201 is input to the other of the source and the drain of the transistor 1209. FIG. 18 illustrates an example in which a signal output from the circuit 1201 is input to the other of the source and the drain of the transistor 1209. The logic value of a signal output from the second terminal of the switch 1203 (the other of the source and the drain of the transistor 1213) is inverted by the logic element 1206, and the inverted signal is input to the circuit 1201 through the circuit 1220.

In the example of FIG. 18, a signal output from the second terminal of the switch 1203 (the other of the source and the drain of the transistor 1213) is input to the circuit 1201 through the logic element 1206 and the circuit 1220; however, one embodiment of the present invention is not limited thereto. The signal output from the second terminal of the switch 1203 (the other of the source and the drain of the transistor 1213) may be input to the circuit 1201 without its logic value being inverted. For example, in the case where the circuit 1201 includes a node in which a signal obtained by inversion of the logic value of a signal input from the input terminal is retained, the signal output from the second terminal of the switch 1203 (the other of the source and the drain of the transistor 1213) can be input to the node.

In FIG. 18, the transistors included in the memory element 1200 except for the transistor 1209 can each be a transistor in which a channel is formed in a layer formed using a semiconductor other than an oxide semiconductor or in the substrate 1190. For example, the transistor can be a transistor whose channel is formed in a silicon layer or a silicon substrate. Alternatively, a transistor in which a channel is formed in an oxide semiconductor film can be used for all the transistors in the memory element 1200. Further alternatively, in the memory element 1200, a transistor in which a channel is formed in an oxide semiconductor film can be included besides the transistor 1209, and a transistor in which a channel is formed in a layer formed using a semiconductor other than an oxide semiconductor or in the substrate 1190 can be used for the rest of the transistors.

As the circuit 1201 in FIG. 18, for example, a flip-flop circuit can be used. As the logic element 1206, for example, an inverter or a clocked inverter can be used.

In a period during which the memory element 1200 is not supplied with the power supply voltage, the semiconductor device described in this embodiment can retain data stored in the circuit 1201 by the capacitor 1208 that is provided in the circuit 1202.

The off-state current of a transistor in which a channel is formed in an oxide semiconductor film is extremely small. For example, the off-state current of a transistor in which a channel is formed in an oxide semiconductor film is significantly smaller than that of a transistor in which a channel is formed in silicon having crystallinity. Thus, when the transistor in which a channel is formed in an oxide semiconductor film is used as the transistor 1209, a signal is retained in the capacitor 1208 for a long time also in a period during which the power supply voltage is not supplied to the memory element 1200. The memory element 1200 can accordingly retain the stored content (data) also in a period during which the supply of the power supply voltage is stopped.

Since the memory element performs pre-charge operation with the switch 1203 and the switch 1204, the time required for the circuit 1201 to retain original data again after the supply of the power supply voltage is restarted can be shortened.

In the circuit 1202, a signal retained by the capacitor 1208 is input to the gate of the transistor 1210. Thus, after supply of the power supply voltage to the memory element 1200 is restarted, the signal retained by the capacitor 1208 can be converted into the one corresponding to the state (the on state or the off state) of the transistor 1210 to be read from the circuit 1202. Consequently, an original signal can be accurately read even when a potential corresponding to the signal retained by the capacitor 1208 changes to some degree.

By using the above-described memory element 1200 in a memory device such as a register or a cache memory included in a processor, data in the memory device can be prevented from being lost owing to the stop of the supply of the power supply voltage. Furthermore, shortly after the supply of the power supply voltage is restarted, the memory device can be returned to the same state as that before the power supply is stopped. Thus, the power supply can be stopped even for a short time in the processor or one or a plurality of logic circuits included in the processor, resulting in lower power consumption.

Although the memory element 1200 is used in a CPU in this embodiment, the memory element 1200 can also be used in an LSI such as a digital signal processor (DSP), a custom LSI, or a programmable logic device (PLD), and a radio frequency identification (RF-ID).

At least part of this embodiment can be implemented in combination with any of the other embodiments described in this specification as appropriate.

Embodiment 7

In this embodiment, a display module and electronic devices which include a reflective display device of one embodiment of the present invention will be described with reference to FIGS. 19A to 19H.

FIGS. 19A to 19G illustrate electronic devices. These electronic devices can include a housing 5000, a display portion 5001, a speaker 5003, an LED lamp 5004, operation keys 5005 (including a power switch and an operation switch), a connection terminal 5006, a sensor 5007 (a sensor having a function of measuring force, displacement, position, speed, acceleration, angular velocity, rotational frequency, distance, light, liquid, magnetism, temperature, chemical substance, sound, time, hardness, electric field, current, voltage, electric power, radiation, flow rate, humidity, gradient, oscillation, odor, or infrared ray), a microphone 5008, and the like.

Figure 19A:
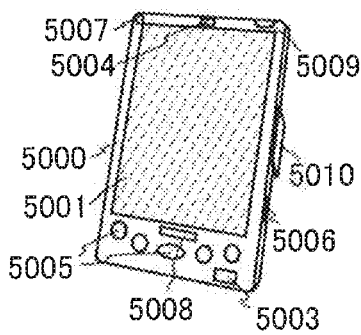
FIGS. 19A to 19H each illustrate a structure of an electronic device of one embodiment.
Figure 19B:
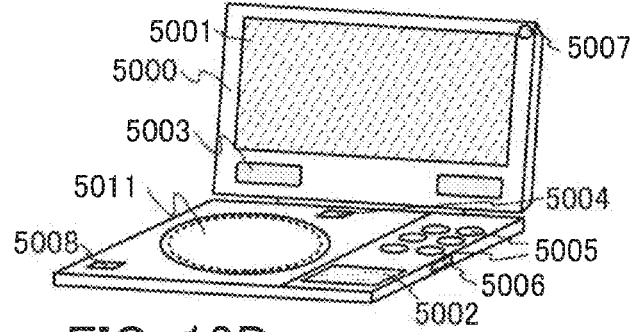
Figure 19C:
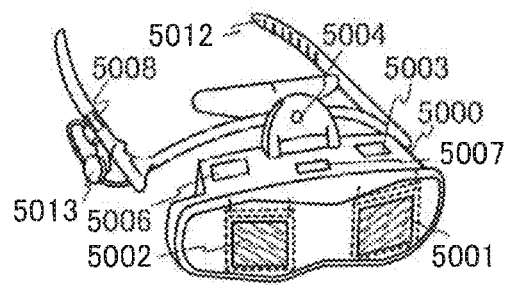
Figure 19D:
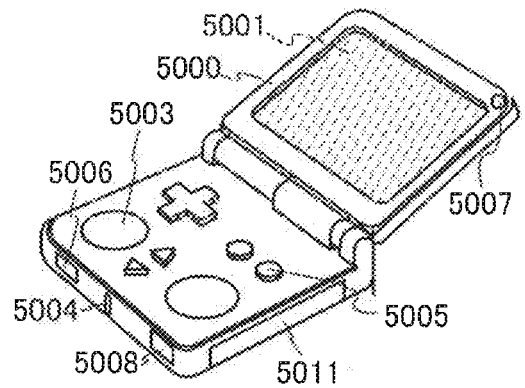
Figure 19E:
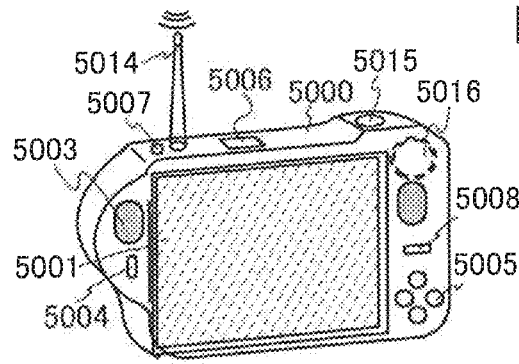
Figure 19F:
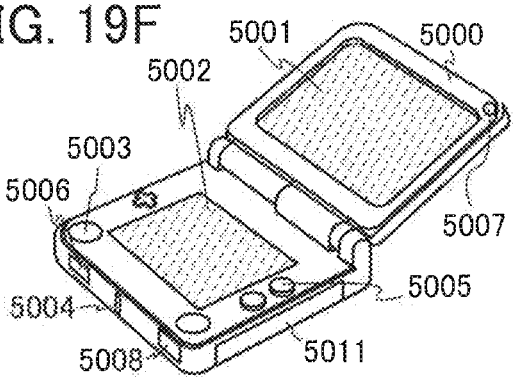
Figure 19G:
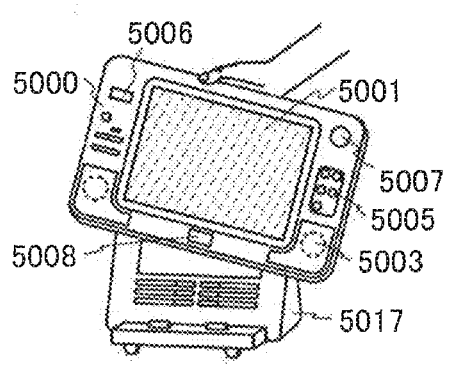

FIG. 19A illustrates a mobile computer which can include a switch 5009, an infrared port 5010, and the like in addition to the above components. FIG. 19B illustrates a portable image reproducing device (e.g., a DVD reproducing device) provided with a recording medium, and the portable image reproducing device can include a second display portion 5002, a recording medium reading portion 5011, and the like in addition to the above components. FIG. 19C illustrates a goggle-type display which can include the second display portion 5002, a support portion 5012, an earphone 5013, and the like in addition to the above components. FIG. 19D illustrates a portable game console which can include the recording medium reading portion 5011 and the like in addition to the above components. FIG. 19E illustrates a digital camera with a television reception function, and the digital camera can include an antenna 5014, a shutter button 5015, an image receiving portion 5016, and the like in addition to the above components. FIG. 19F illustrates a portable game console which can include the second display portion 5002, the recording medium reading portion 5011, and the like in addition to the above components. FIG. 19G illustrates a portable television receiver which can include a charger 5017 capable of transmitting and receiving signals, and the like in addition to the above components.

The electronic devices in FIGS. 19A to 19G can have a variety of functions such as a function of displaying a variety of information (e.g., a still image, a moving image, and a text image) on the display portion, a touch panel function, a function of displaying a calendar, date, time, and the like, a function of controlling processing with a variety of software (programs), a wireless communication function, a function of being connected to a variety of computer networks with a wireless communication function, a function of transmitting and receiving a variety of data with a wireless communication function, and a function of reading out a program or data stored in a recording medium and displaying it on the display portion. Furthermore, the electronic device including a plurality of display portions can have a function of displaying image information mainly on one display portion while displaying text information mainly on another display portion, a function of displaying a three-dimensional image by displaying images on a plurality of display portions with a parallax taken into account, or the like. Furthermore, the electronic device including an image receiving portion can have a function of shooting a still image, a function of taking moving images, a function of automatically or manually correcting a shot image, a function of storing a shot image in a recording medium (an external recording medium or a recording medium incorporated in the camera), a function of displaying a shot image on the display portion, or the like. Note that functions of the electronic devices in FIGS. 19A to 19G are not limited thereto, and the electronic devices can have a variety of functions.

Figure 19H:
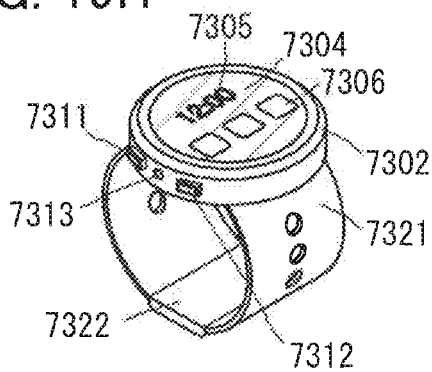

FIG. 19H illustrates a smart watch, which includes a housing 7302, a display panel 7304, operation buttons 7311 and 7312, a connection terminal 7313, a band 7321, a clasp 7322, and the like.

The display panel 7304 mounted in the housing 7302 serving as a bezel includes a non-rectangular display region. The display panel 7304 may have a rectangular display region. The display panel 7304 can display an icon 7305 indicating time, another icon 7306, and the like.

The smart watch in FIG. 19H can have a variety of functions such as a function of displaying a variety of information (e.g., a still image, a moving image, and a text image) on the display portion, a touch panel function, a function of displaying a calendar, date, time, and the like, a function of controlling processing with a variety of software (programs), a wireless communication function, a function of being connected to a variety of computer networks with a wireless communication function, a function of transmitting and receiving a variety of data with a wireless communication function, and a function of reading out a program or data stored in a recording medium and displaying it on the display portion.

The 7304 7302 can include a speaker, a sensor (a sensor having a function of measuring force, displacement, position, speed, acceleration, angular velocity, rotational frequency, distance, light, liquid, magnetism, temperature, chemical substance, sound, time, hardness, electric field, current, voltage, electric power, radiation, flow rate, humidity, gradient, oscillation, odor, or infrared rays), a microphone, and the like. Note that the smart watch can be manufactured using the light-emitting element for the display panel 7304.

This embodiment can be combined with any of the other embodiments in this specification as appropriate.

In this specification and the like, for example, when it is explicitly described that X and Y are connected, the case where X and Y are electrically connected, the case where X and Y are functionally connected, and the case where X and Y are directly connected are included therein. Accordingly, another element may be interposed between elements having a connection relation shown in drawings and texts, without limiting to a predetermined connection relation, for example, the connection relation shown in the drawings and the texts.

Here, X and Y each denote an object (e.g., a device, an element, a circuit, a wiring, an electrode, a terminal, a conductive film, or a layer).

For example, in the case where X and Y are directly connected, an element that enables electrical connection between X and Y (e.g., a switch, a transistor, a capacitor, an inductor, a resistor, a diode, a display element, a light-emitting element, or a load) is not connected between X and Y, and X and Y are connected without the element that enables electrical connection between X and Y (e.g., a switch, a transistor, a capacitor, an inductor, a resistor, a diode, a display element, a light-emitting element, or a load) provided therebetween.

For example, in the case where X and Y are electrically connected, one or more elements that enable electrical connection between X and Y (e.g., a switch, a transistor, a capacitor, an inductor, a resistor, a diode, a display element, a light-emitting element, or a load) can be connected between X and Y. A switch is controlled to be on or off. That is, a switch is conducting or not conducting (is turned on or off) to determine whether current flows therethrough or not. Alternatively, the switch has a function of selecting and changing a current path. Note that the case where X and Y are electrically connected includes the case where X and Y are directly connected.

For example, in the case where X and Y are functionally connected, one or more circuits that enable functional connection between X and Y (e.g., a logic circuit such as an inverter, a NAND circuit, or a NOR circuit; a signal converter circuit such as a DA converter circuit, an AD converter circuit, or a gamma correction circuit; a potential level converter circuit such as a power source circuit (e.g., a step-up circuit or a step-down circuit) or a level shifter circuit for changing the potential level of a signal; a voltage source; a current source; a switching circuit; an amplifier circuit such as a circuit that can increase signal amplitude, the amount of current, or the like, an operational amplifier, a differential amplifier circuit, a source follower circuit, or a buffer circuit; a signal generation circuit; a memory circuit; and/or a control circuit) can be connected between X and Y. Note that for example, in the case where a signal output from X is transmitted to Y even when another circuit is interposed between X and Y, X and Y are functionally connected. Note that the case where X and Y are functionally connected includes the case where X and Y are directly connected and the case where X and Y are electrically connected.

Note that when it is explicitly described that X and Y are electrically connected, the case where X and Y are electrically connected (i.e., the case where X and Y are connected with another element or another circuit provided therebetween), the case where X and Y are functionally connected (i.e., the case where X and Y are functionally connected with another circuit provided therebetween), and the case where X and Y are directly connected (i.e., the case where X and Y are connected without another element or another circuit provided therebetween) are included therein. That is, in this specification and the like, the explicit description "X and Y are electrically connected" is the same as the description "X and Y are connected".

For example, any of the following expressions can be used for the case where a source (or a first terminal or the like) of a transistor is electrically connected to X through (or not through) Z1 and a drain (or a second terminal or the like) of the transistor is electrically connected to Y through (or not through) Z2, or the case where a source (or a first terminal or the like) of a transistor is directly connected to one part of Z1 and another part of Z1 is directly connected to X while a drain (or a second terminal or the like) of the transistor is directly connected to one part of Z2 and another part of Z2 is directly connected to Y.

Examples of the expressions include, "X, Y, a source (or a first terminal or the like) of a transistor, and a drain (or a second terminal or the like) of the transistor are electrically connected to each other, and X, the source (or the first terminal or the like) of the transistor, the drain (or the second terminal or the like) of the transistor, and Y are electrically connected to each other in this order", "a source (or a first terminal or the like) of a transistor is electrically connected to X, a drain (or a second terminal or the like) of the transistor is electrically connected to Y, and X, the source (or the first terminal or the like) of the transistor, the drain (or the second terminal or the like) of the transistor, and Y are electrically connected to each other in this order", and "X is electrically connected to Y through a source (or a first terminal or the like) and a drain (or a second terminal or the like) of a transistor, and X, the source (or the first terminal or the like) of the transistor, the drain (or the second terminal or the like) of the transistor, and Y are provided to be connected in this order". When the connection order in a circuit structure is defined by an expression similar to the above examples, a source (or a first terminal or the like) and a drain (or a second terminal or the like) of a transistor can be distinguished from each other to specify the technical scope.

Other examples of the expressions include, "a source (or a first terminal or the like) of a transistor is electrically connected to X through at least a first connection path, the first connection path does not include a second connection path, the second connection path is a path between the source (or the first terminal or the like) of the transistor and a drain (or a second terminal or the like) of the transistor, Z1 is on the first connection path, the drain (or the second terminal or the like) of the transistor is electrically connected to Y through at least a third connection path, the third connection path does not include the second connection path, and Z2 is on the third connection path". Another example of the expression is "a source (or a first terminal or the like) of a transistor is electrically connected to X at least with a first connection path through Z1, the first connection path does not include a second connection path, the second connection path includes a connection path through which the transistor is provided, a drain (or a second terminal or the like) of the transistor is electrically connected to Y at least with a third connection path through Z2, and the third connection path does not include the second connection path". Still another example of the expression is "a source (or a first terminal or the like) of a transistor is electrically connected to X through at least Z1 on a first electrical path, the first electrical path does not include a second electrical path, the second electrical path is an electrical path from the source (or the first terminal or the like) of the transistor to a drain (or a second terminal or the like) of the transistor, the drain (or the second terminal or the like) of the transistor is electrically connected to Y through at least Z2 on a third electrical path, the third electrical path does not include a fourth electrical path, and the fourth electrical path is an electrical path from the drain (or the second terminal or the like) of the transistor to the source (or the first terminal or the like) of the transistor". When the connection path in a circuit structure is defined by an expression similar to the above examples, a source (or a first terminal or the like) and a drain (or a second terminal or the like) of a transistor can be distinguished from each other to specify the technical scope.

Note that these expressions are examples and there is no limitation on the expressions. Here, X, Y, Z1, and Z2 each denote an object (e.g., a device, an element, a circuit, a wiring, an electrode, a terminal, a conductive film, and a layer).

Even when independent components are electrically connected to each other in a circuit diagram, one component has functions of a plurality of components in some cases. For example, when part of a wiring also functions as an electrode, one conductive film functions as the wiring and the electrode. Thus, "electrical connection" in this specification includes in its category such a case where one conductive film has functions of a plurality of components.

Example

In this example, a structure and evaluation results of a fabricated display panel of one embodiment of the present invention are described with reference to FIGS. 21A and 21B, FIG. 22, FIGS. 23A and 23B, FIGS. 24A to 24D, and FIGS. 25A and 25B.

Figure 21A:
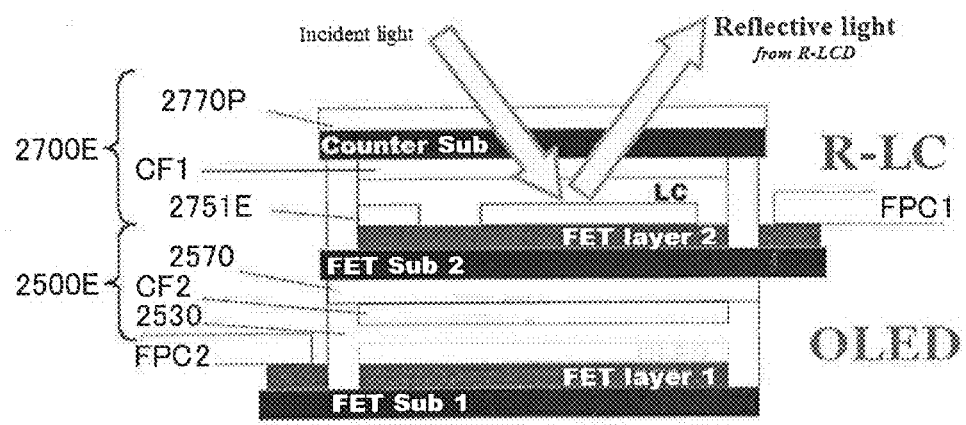
FIGS. 21A and 21B are schematic diagrams each illustrating a displaying method and a structure of a display panel of Example.
Figure 21B:
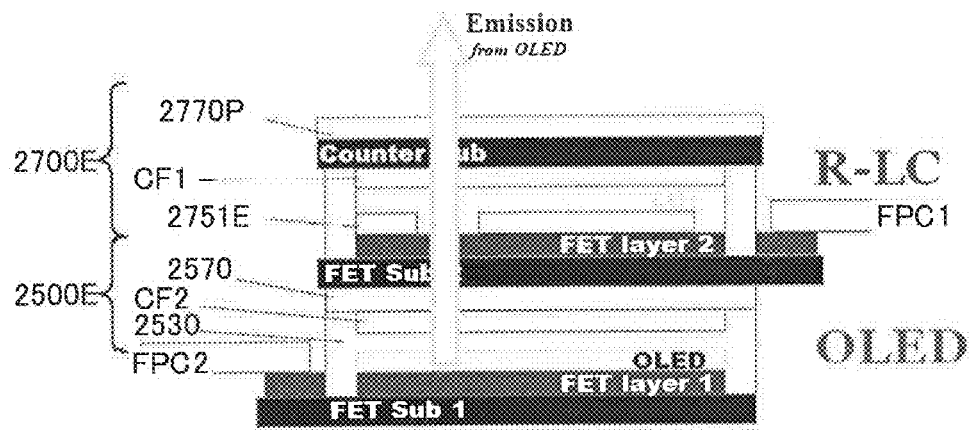

FIGS. 21A and 21B are schematic diagrams each illustrating a displaying method and a structure of the fabricated display panel. FIG. 21A illustrates the displaying method with a first display portion 2700E, and FIG. 21B illustrates the displaying method with a second display portion 2500E.

Figure 22:
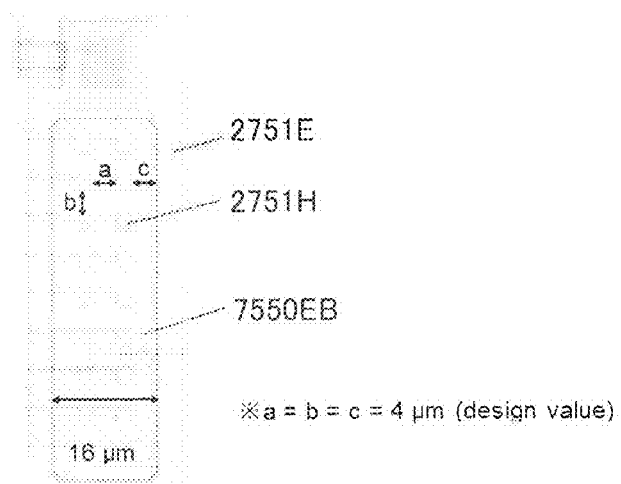
FIG. 22 is a top view illustrating a structure of a pixel of a display panel of Example.

FIG. 22 is a top view illustrating a structure of a pixel of the fabricated display panel.

Figure 23A:
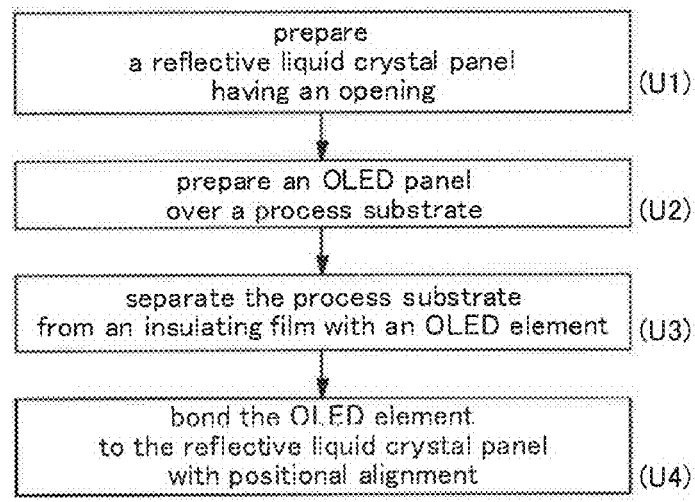
FIGS. 23A and 23B illustrate a method for manufacturing a display panel of Example.
Figure 23B:
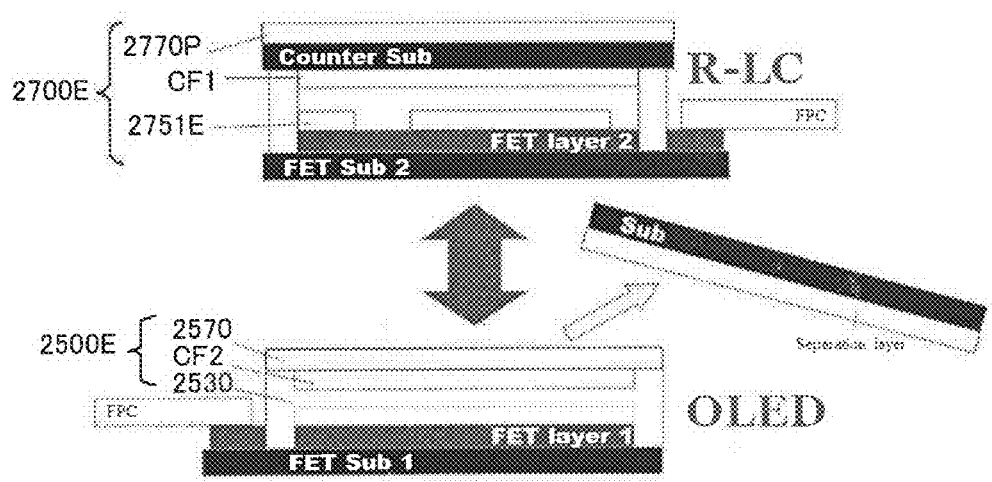

FIGS. 23A and 23B illustrate a fabrication method of the display panel. FIG. 23A is a flow chart illustrating the fabrication method, and FIG. 23B schematically illustrates the fabrication method.

Figure 24A:
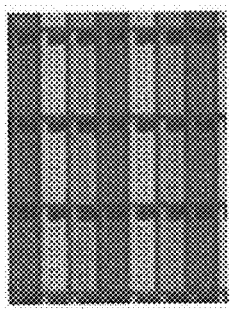
FIGS. 24A to 24D are photographs showing display states of a display panel of Example.
Figure 24B:
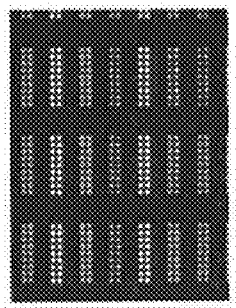
Figure 24C:
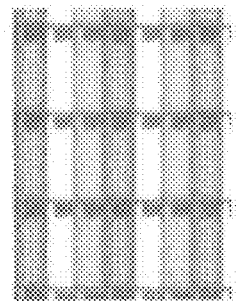
Figure 24D:
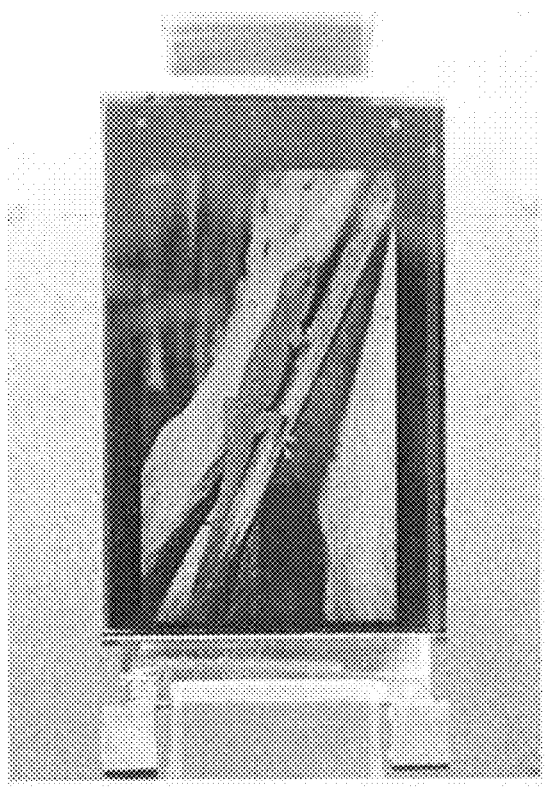

FIGS. 24A to 24D are photographs showing display states of the fabricated display panel. FIG. 24A is an optical micrograph of display with the first display portion 2700E, FIG. 24B is an optical micrograph of display with the second display portion 2500E, and FIG. 24C is an optical micrograph of display with the first display portion 2700E and the second display portion 2500E. FIG. 24D is a photograph showing a display state of the fabricated display panel.

Figure 25A:
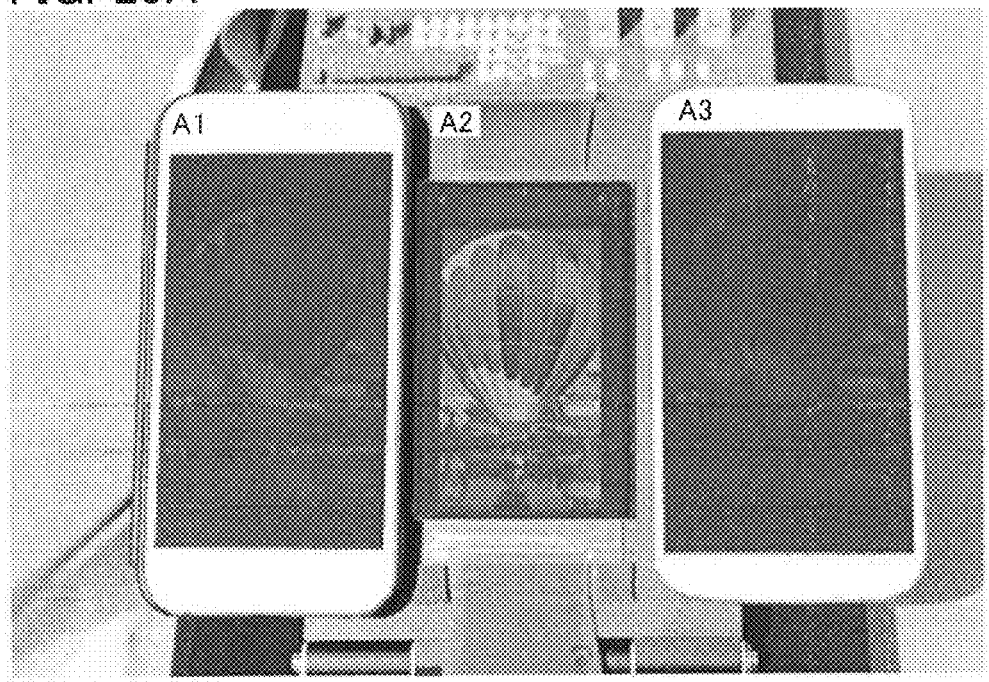
FIGS. 25A and 25B are photographs showing display states of display panels of Example.
Figure 25B:
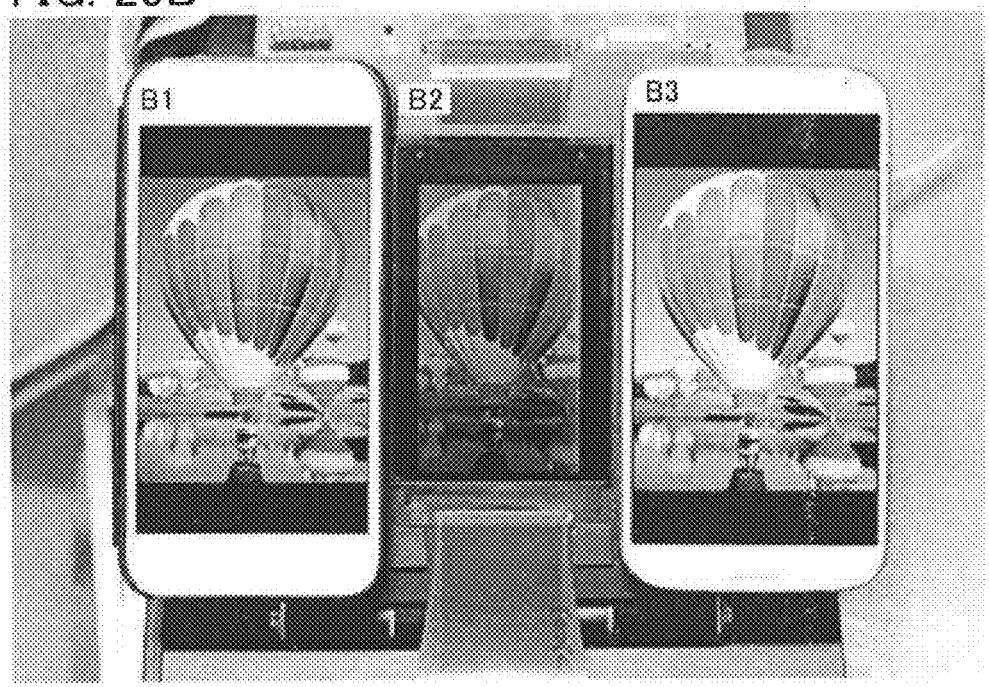

FIGS. 25A and 25B are photographs each showing a display state of the fabricated display panel. FIG. 25A is a photograph showing outdoor display quality, and FIG. 25B is a photograph showing indoor display quality.

<Displaying Method>

With the first display portion 2700E, the display panel described in this example can control reflectance with respect to external light that enters the display panel to display an image (see FIG. 21A). Thus, an image can be favorably displayed in a bright environment such as outdoors in the daytime.

Furthermore, with the second display portion 2500E, the display panel can control the intensity of emitted light to display an image (see FIG. 21B). Thus, an image can be favorably displayed in a dark environment like the night time.

<Structure>

The fabricated display panel includes the first display portion 2700E and the second display portion 2500E (see FIG. 21A).

The first display portion 2700E has a region overlapping with the second display portion 2500E.

<<First Display Portion 2700E>>

The first display portion 2700E includes a first display element and a coloring film CF1. The first display element includes a first conductive film 2751E, a layer LC containing a liquid crystal material, and a second conductive film.

The first display element is electrically connected to a circuit, and the circuit is electrically connected to a flexible printed board FPC1.

<<Second Display Portion 2500E>>

The second display portion 2500E includes an insulating film 2570, a second display element 7550EB, and a coloring film CF2. The second display element includes a third conductive film, a layer containing a luminescent material, and a fourth conductive film. The second display element and the coloring film CF2 are bonded to each other with a bonding layer 2530. In this example, an organic EL element (also referred to as an OLED) that emits white light is used as the second display element.

The second display element is electrically connected to a circuit, and the circuit is electrically connected to a flexible printed board FPC2.

<<Pixel>>

The pixel includes the first display element and the second display element having a region overlapping with the first display element (see FIG. 22).

The first display element includes a reflective film (first conductive film 2751E) that reflects external light. The first conductive film 2751E includes a plurality of openings 2751H. In this example, the opening 2751H was an approximately 3 μm square. Note that the total area of the plurality of openings 2751H included in a pixel was 8% of the area of the pixel.

A light-emitting region of the second display element has a width of 16 μm, and includes regions overlapping with the openings 2751H.

Note that details of the structures of the first display portion 2700E and the second display portion 2500E are shown in Table 1.

TABLE 1

|  | First display portion | Second display portion |
| --- | --- | --- |
| Display region | 42.12 mm (H) × 74.88 mm (V) | 42.12 mm (H) × 74.88 mm (V) |
| Effective pixels | 540 × RGB (H) × 960 (V) | 540 × RGB (H) × 960 (V) |
| Pixel size | 26 μm (H) × 78 μm (V) | 26 μm (H) × 78 μm (V) |
| Resolution | 326 ppi | 326 ppi |
| Frame frequency | 60 Hz | 60 Hz |
| Video signal format | analog dot sequential | analog dot sequential |
| Display element | ECB mode liquid crystal | OLED |
| Source driver | incorporated | DeMUX incorporated |
| Gate driver | incorporated | incorporated |

<Fabrication Method>

The display panel was fabricated by a method including the following four steps (see FIGS. 23A and 23B).

<<First Step>>

In the first step, a reflective liquid crystal panel including, as a display element, a reflective liquid crystal element in which an opening was provided in a reflective film was used for the first display portion 2700E (see U1 in FIG. 23A). A liquid crystal element which operated in an electrically controlled birefringence (ECB) mode was used as the first display element.

<<Second Step>>

In the second step, an organic EL panel including, as the display element, an organic EL element which was bonded with the bonding layer 2530 to the insulating film 2570 formed over a process substrate was used for the second display portion 2500E. Thus, the insulating film 2570 functions as a sealing film (see U2 in FIG. 23A).

<<Third Step>>

In the third step, the process substrate was separated from the insulating film 2570 (see U3 in FIG. 23A).

<<Fourth Step>>

In the fourth step, the first display portion 2700E and the second display portion 2500E were bonded to each other. Specifically, the organic EL element was positioned to overlap with the opening in the reflective liquid crystal element, and was bonded to the reflective liquid crystal element with the bonding layer (see U4 in FIG. 23A).

<Evaluation Results>

FIGS. 24A to 24D show display of image information on the fabricated display panel.

Display obtained with the first display portion 2700E by controlling reflectance with respect to external light incident on the display panel is shown (see FIG. 24A).

Display obtained with the second display portion 2500E by controlling the intensity of emitted light is shown (see FIG. 24B).

Display obtained with the first display portion 2700E and the second display portion 2500E by controlling reflectance with respect to external light incident on the display panel and the intensity of emitted light is shown (see FIG. 24C).

Display of image information on the fabricated display panel is shown (see FIG. 24D).

Display of image information in a bright outdoor environment with the fabricated display panel is shown (see A2 in FIG. 25A). Display of image information in an indoor environment with the fabricated display panel is shown (see B2 in FIG. 25B).

The fabricated display panel was favorably display image information either in a bright outdoor environment or in an indoor environment.

Note that display of image information on a transmissive liquid crystal panel (see A1 in FIG. 25A and B1 in FIG. 25B) and display of image information on an organic EL panel (see A3 in FIG. 25A and B3 in FIG. 25B) are shown for comparison. As shown in the photographs, image information was not favorably displayed in a bright outdoor environment.

EXPLANATION OF REFERENCE

ACF1: conductive member, ACF2: conductive member, ANO: wiring, C1: capacitor, C2: capacitor, CF1: coloring film, CF2: coloring film, CLK1: reference clock signal, CLK2: internal clock signal, G(i): scan line, GD: driver circuit, GDA: driver circuit, GDB: driver circuit, GD1: gate driver circuit portion, GD2: gate driver circuit portion, KB1: structure body, KB2: structure body, M: transistor, M1: node, M2: node, M3: transistor, ME1: transistor, ME2: transistor, ME3: transistor, ME4: transistor, MF1: transistor, MF2: transistor, P1: positional information, P2: information, S(j): signal line, SD: driver circuit, SD1: source driver circuit portion, SD2: source driver circuit portion, SW: transistor, SW2: transistor, T1: time, T2: time, T3: time, T4: time, T5: time, T6: time, V: image information, V0: potential, V1: potential, VCOM1: wiring, VCOM2: wiring, VDD: power supply potential, FPC1: flexible printed substrate, FPC2: flexible printed substrate, PIC1: image information, PIC2: image information, PIC3: image information, PIC4: image information, 100: transistor, 102: substrate, 104: conductive film, 106: insulating film, 107: insulating film, 108: oxide semiconductor film, 108a: oxide semiconductor film, 108b: oxide semiconductor film, 108c: oxide semiconductor film, 112a: conductive film, 112b: conductive film, 114: insulating film, 116: insulating film, 118: insulating film, 120a: conductive film, 120b: conductive film, 150: transistor, 200: information processing device, 210: arithmetic device, 211: arithmetic portion, 212: memory portion, 214: transmission path, 215: input/output interface, 220: input/output device, 230: display portion, 230B: display portion, 231: display region, 232(i, j): pixel, 232(i, j)1: portion, 232(i, j)2: portion, 235EL: display element, 235LC: display element, 240: input portion, 250: sensor portion, 290: communication portion, 500E: second display portion, 500F: second display portion, 500FB: display element, 504: conductive film, 510: substrate, 510A: base, 510B: insulating film, 519: connection electrode, 520: conductive film, 521A: insulating film, 521B: insulating film, 528A: partition wall, 528B: insulating film, 530: bonding layer, 535: bonding layer, 550EB: display element, 550FB: display element, 551EB: conductive film, 552: conductive film, 553E: layer, 553F: layer, 570: insulating film, 571: insulating film, 700E: first display portion, 700F: first display portion, 702E: pixel, 702EB: sub-pixel, 702EG: sub-pixel, 702ER: sub-pixel, 704: conductive film, 706: insulating film, 710: substrate, 710A: base, 710B: insulating film, 711: signal line, 712A: conductive film, 712B: conductive film, 718: semiconductor film, 718A: region, 718B: region, 718C: region, 719: connection electrode, 720: conductive film, 721A: insulating film, 721B: insulating film, 728: insulating film, 730: sealant, 750EB: display element, 751: conductive film, 751E: conductive film, 751F: conductive film, 751H: opening, 752: conductive film, 753: liquid crystal layer, 770: substrate, 770P: optical film, 770PF: optical film, 771: insulating film, 800: input/output device, 801: upper cover, 802: lower cover, 803: FPC, 804: touch sensor, 805: FPC, 806: display panel, 809: frame, 810: driver circuit, 811: battery, 1189: ROM interface, 1190: substrate, 1191: ALU, 1192: ALU controller, 1193: instruction decoder, 1194: interrupt controller, 1195: timing controller, 1196: register, 1197: register controller, 1198: bus interface, 1199: ROM, 1200: memory element, 1201: circuit, 1202: circuit, 1203: switch, 1204: switch, 1206: logic element, 1207: capacitor, 1208: capacitor, 1209: transistor, 1210: transistor, 1213: transistor, 1214: transistor, 1220: circuit, 2500E: second display portion, 2530: bonding layer, 2570: insulating film, 2700E: first display portion, 2751E: conductive film, 2751H: opening, 3001: wiring, 3002: wiring, 3003: wiring, 3004: wiring, 3005: wiring, 3200: transistor, 3300: transistor, 3400: capacitor, 5000: housing, 5001: display portion, 5002: display portion, 5003: speaker, 5004: LED lamp, 5005: operation key, 5006: connection terminal, 5007: sensor, 5008: microphone, 5009: switch, 5010: infrared port, 5011: recording medium reading portion, 5012: support portion, 5013: earphone, 5014: antenna, 5015: shutter button, 5016: image receiving portion, 5017: charger, 7302: housing, 7304: display panel, 7305: icon, 7306: icon, 7311: operation button, 7312: operation button, 7313: connection terminal, 7321: band, and 7322: clasp.

This application is based on Japanese Patent Application serial no. 2015-060000 filed with Japan Patent Office on Mar. 23, 2015 and Japanese Patent Application serial no. 2015-115556 filed with Japan Patent Office on Jun. 8, 2015, the entire contents of which are hereby incorporated by reference.

What is claimed:

1. A display panel including a pixel, the pixel comprising:
    a first transistor;
    a first display element electrically connected to the first transistor, the first display element including a liquid crystal layer and a reflective film comprising an opening portion;
    a second transistor;
    a second display element electrically connected to the second transistor, the second display element including a layer including light-emitting material;
    a bonding layer bonding the first display element and the second display element, the bonding layer including an organic material and being between the first transistor and the second transistor;
    a first insulating film over which the first transistor being provided;
    a second insulating film over which the second transistor being provided; and
    a third insulating film over the second display element and in contact with the bonding layer,
    wherein the pixel is configured to emit light from the second display element through the opening portion.

2. The display panel according to claim 1,
    wherein each of the first transistor and the second transistor includes an oxide semiconductor in a channel region.

3. The display panel according to claim 1, wherein the first transistor is provided below or above the second transistor.

4. A device comprising:
a display panel; and
a touch sensor including a region overlapping with the display panel,
wherein the display panel including:
  a first transistor;
  a first display element electrically connected to the first transistor, the first display element including a liquid crystal layer and a reflective film comprising an opening portion;
  a second transistor;
  a second display element electrically connected to the second transistor, the second display element including a layer including light-emitting material; and
  a bonding layer bonding the first display element and the second display element, the bonding layer including an organic material and being between the first transistor and the second transistor;
  a first insulating film over which the first transistor being provided;
  a second insulating film over which the second transistor being provided; and
  a third insulating film over the second display element and in contact with the bonding layer,
wherein the display panel is configured to emit light from the second display element through the opening portion.

5. The device according to claim 4,
wherein each of the first transistor and the second transistor includes an oxide semiconductor in a channel region.

6. The display panel according to claim 4, wherein the first transistor is provided below or above the second transistor.

7. A method for manufacturing a display panel, the method comprising the steps of:
  preparing a first display panel including a liquid crystal element and a first transistor electrically connected to the liquid crystal element;
  preparing a second display panel including a light-emitting element, a second transistor electrically connected to the light-emitting element, and a substrate over the light-emitting element;
  separating the substrate from the light-emitting element; and
  bonding the first display panel and the second display panel so that the liquid crystal element and the light-emitting element overlap with each other,
wherein the liquid crystal element includes a liquid crystal layer and a reflective film comprising an opening portion,
wherein a first insulating film is provided over which the first transistor being provided,
wherein a second insulating film is provided over which the second transistor being provided, and
wherein a third insulating film is provided over the light-emitting element and in contact with a bonding layer.

8. The method for manufacturing the display panel according to claim 7,
wherein an insulating film is provided between the light-emitting element and the substrate, and
wherein the separation is caused between the substrate and the insulating film.

9. The method for manufacturing the display panel according to claim 7,
wherein each of the first transistor and the second transistor includes an oxide semiconductor in a channel region.

10. A method for manufacturing a display panel including a touch sensor, the method comprising the steps of:
  preparing a first display panel including a liquid crystal element and a first transistor electrically connected to the liquid crystal element;
  preparing a second display panel including a light-emitting element, a second transistor electrically connected to the light-emitting element, and a substrate over the light-emitting element;
  separating the substrate from the light-emitting element; and
  bonding the first display panel and the second display panel so that the liquid crystal element and the light-emitting element overlap with each other,
wherein the touch sensor includes a region overlapping with the first display panel and the second display panel,
wherein the liquid crystal element includes a liquid crystal layer and a reflective film comprising an opening portion,
wherein a first insulating film is provided over which the first transistor being provided,
wherein a second insulating film is provided over which the second transistor being provided, and
wherein a third insulating film is provided over the light-emitting element and in contact with a bonding layer.

11. The method for manufacturing the display panel including the touch sensor according to claim 10,
wherein an insulating film is provided between the light-emitting element and the substrate, and
wherein the separation is caused between the substrate and the insulating film.

12. The method for manufacturing the display panel including the touch sensor according to claim 10,
wherein each of the first transistor and the second transistor includes an oxide semiconductor in a channel region.

* * * * *